(12) United States Patent  
Nagai

(10) Patent No.: US 8,115,247 B2
(45) Date of Patent: Feb. 14, 2012

(54) NON-VOLATILE SEMICONDUCTOR MEMORY DEVICE HAVING AN ERASING GATE

(75) Inventor: Takaaki Nagai, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 0 days.

(21) Appl. No.: 12/222,656

(22) Filed: Aug. 13, 2008

(65) Prior Publication Data
US 2009/0085091 A1 Apr. 2, 2009

(30) Foreign Application Priority Data
Sep. 28, 2007 (JP) ................ 2007/253151

(51) Int. Cl.
H01L 29/788 (2006.01)

(52) U.S. Cl. ... 257/317; 257/314; 257/321; 257/E29.17; 257/E29.187; 257/E29.3; 438/211

(58) Field of Classification Search .......... 257/E47.001, 257/E29.001, E29.3, 314–318, 321
See application file for complete search history.

(56) References Cited

U.S. PATENT DOCUMENTS
6,847,078 B2 * 1/2005 Choi et al. ............ 257/315
2002/0003254 A1 * 1/2002 Molinelli Acocella et al. ............ 257/316
2004/0241942 A1 * 12/2004 Hsieh ............ 438/257
2006/0163645 A1 * 7/2006 Guterman et al. ............ 257/316
2006/0220100 A1 * 10/2006 Tanaka et al. ............ 257/315

FOREIGN PATENT DOCUMENTS
JP 2000-286348 10/2000
JP 2001-85543 3/2001
JP 2001-230330 8/2001
JP 2001210711 A * 8/2001

* cited by examiner

Primary Examiner — Ha Tran T Nguyen
Assistant Examiner — Raj R Gupta
(74) Attorney, Agent, or Firm — McGinn IP Law Group, PLLC

(57) ABSTRACT

A non-volatile semiconductor memory device includes a floating gate formed above a semiconductor substrate; an erasing gate formed above the floating gate; a control gate formed above a channel region of a surface layer of the semiconductor substrate at a position corresponding to one lateral side of the floating gate and the erasing gate; a first diffusion layer formed on the semiconductor substrate at a position corresponding to another lateral side of the floating gate and the erasing gate; a plug formed above the first diffusion layer, the plug coupled to the first diffusion layer; and a second diffusion layer formed on the semiconductor substrate at a position adjacent to the control gate.

19 Claims, 48 Drawing Sheets

NON-VOLATILE SEMICONDUCTOR MEMORY DEVICE HAVING AN ERASING GATE

BACKGROUND OF THE INVENTION

1. Field of the Invention

The present invention relates to a non-volatile semiconductor memory device, and more particularly, to a non-volatile semiconductor memory device having an erasing gate.

2. Description of the Related Art

There is known a non-volatile semiconductor memory device having a floating gate as a non-volatile semiconductor memory device capable of retaining storage data even if a power source is turned off. In such a non-volatile semiconductor memory device described above, programming and erasing of the storage data may be performed through accumulation and release of an electric field with respect to the floating gate.

Further, as one kind of the non-volatile semiconductor memory devices having a floating gate, various split-gate type non-volatile semiconductor memory devices are proposed. FIG. 46 illustrates an example of a prior art split-gate type non-volatile semiconductor memory device.

As illustrated in FIG. 46, a source diffusion region 51 and a drain diffusion region 52 are formed on a surface layer of a substrate 50. Further, a floating gate 54 and a control gate 55 are formed on the substrate 50 via a gate insulating film 53. The control gate 55 is further electrically insulated with the floating gate 54 via a tunnel insulating film 56. A portion which opposes to the control gate 55 of the floating gate 54 has a pointed shape at an end thereof (tip section).

In a split-gate type non-volatile semiconductor memory device as described in FIG. 46, programming operation and reading operation is performed by applying a given voltage to the control gate 55, the source diffusion region 51, and the drain diffusion region 52. Besides, an erasing operation is carried out by applying a high voltage of about 12 V to the control gate 55 to draw out electrons injected to the floating gate 54 by a Fowler-Nordheim (FN) tunnel method toward the control gate 55 through the tunnel insulating film 56. Then, an intense electric field is generated in particular around the tip section due to its shape, and the electrons mainly move from the tip section to the control gate 55.

Thus, in the split-gate type non-volatile semiconductor memory device of FIG. 46, it is found that the control gate 55 also plays a role of an erasing gate. However, at the time of the erasing operation, it is necessary to apply a high voltage (about 12 V) to the control gate 55. However, for that purpose, a film thickness of the gate insulating film 53 could not be set to a given film thickness or thinner to secure a withstand voltage of the gate insulating film 53 below the control gate 55. Specifically, a current at the time of reading operation (memory cell current) could not be set as large, thereby being a factor that prevents a memory from achieving a high-speed operation, fineness, and a low voltage operation.

To solve such a problem described above, there is proposed, in addition to the above-mentioned structure, a split-gate type non-volatile semiconductor memory device further including an erasing gate (see, JP 2001-230330 A, JP 2000-286348 A, and JP 2001-085543 A). Provision of the erasing gate allows a role of the erasing gate, which is born by the control gate to be separated. As a result, there may be realized a structure with which the thickness of a gate insulating film may be further reduced.

FIG. 47 illustrates a cross sectional view illustrating a split-gate type non-volatile semiconductor memory device having the erasing gate described in JP 2001-230330 A. As illustrated in FIG. 47, a source region 61 and a drain region 62 are formed on the surface layer of the semiconductor substrate 60. Further, a floating gate 64 and a control gate 65 are formed on the semiconductor substrate 60 via a gate oxide film 63. A film thickness of the gate oxide film 63 formed below the control gate 65 is thinner than the film thickness of the gate oxide film 63 formed below the floating gate 64.

An erasing gate 68 is formed directly above the floating gate 64 via a selective oxide film 66 and a tunnel oxide film 67. An oxide film 69 is formed directly above the erasing gate 68. A sidewall oxide film 70 is formed so as to cover a sidewall of a lamination structure including the floating gate 64, the selective oxide film 66, the tunnel oxide film 67, the erasing gate 6 and the oxide film 69 above the erasing gate 68. Owing to a sidewall oxide film 70, the floating gate 64 and the erasing gate 68 are electrically isolated from the control gate 65. Further, a sidewall oxide film 71 is formed so as to cover the sidewall oxide film 70 and the control gate 65 on the source region 61 side.

Note that, the floating gate 64 is subjected to selective etching so as to form a recess at a center portion of an upper surface in a cross sectional direction which is perpendicular to a cross sectional direction of FIG. 47. With this processing, respective corner portions of both edges of the upper surface of the floating gate 64 have a pointed shape.

Thus, the non-volatile semiconductor memory device described in JP 2001-230330 A includes the floating gate 64 having a pointed shape at the upper surface thereof, the erasing gate 68 formed directly above the floating gate 64, the control gate 65 formed on a sidewall of the floating gate 64 and the erasing gate 68, and the gate oxide film 63 in which the film thickness is different between an area below the floating gate 64 and an area below the control gate 65.

Next, description is made of respective programming, reading, and erasing operations of the non-volatile semiconductor memory device described in JP 2001-230330 A. In the programming operation, voltages of 1 V, 10 V, 9 V, and 0 V are applied to the control gate 65, the erasing gate 68, the source region 61, and the drain region 62, respectively. A high voltage is applied to the erasing gate 68 and the source region 61, and hence a potential of the floating gate 64 is raised by a coupling capacitance between the source diffusion region 61 and the floating gate 64, and by a coupling capacitance between the erasing gate 68 and the floating gate 64. Hot electrons generated in the vicinity of the channel region below the region in which the floating gate 64 and the control gate 65 are arranged side by side are injected to the floating gate 64 beyond an energy barrier from a surface of the semiconductor substrate 60 to the insulating film, to thereby carry out data programming. At this time, in addition to the potential of the source region 61, the potential of the erasing gate 68 is added thereto, and hence the potential of the floating gate 64 may be efficiently increased.

In the reading out operation, voltages of 2 V, 0 V, 0 V, and 1 V are applied to the control gate 65, the erasing gate 68, the source region 61, and the drain region 62, respectively 62. At this time, in the case where an electric field (electron) has been injected to the floating gate 64, the potential of the floating gate 64 becomes lower, and hence a channel is not formed below the floating gate 64, and the current does not flow. On the other hand, in the case where an electric field (electron) has not been injected to the floating gate 64, the potential of the floating gate 64 becomes higher, and hence the channel is formed below the floating gate 64, and the memory cell current flows. Further, the film thickness of the gate oxide film 63 in an area below the control gate 65 is formed to be thin, and hence even if the voltage to be applied to the control gate 65 is set to be low, the same current may be obtained.

In the erasing operation, voltages of 0 V, 10 V, 0 V, and 0 V are applied to the control gate 65, the erasing gate 68, the source region 61, and the drain region 62, respectively. With this, the electrons injected into the floating gate 64 are released via the pointed shape on the upper surface of the floating gate 64 by means of FN tunnel to the erasing gate 68 while penetrating the tunnel oxide film 67. Further, the gate oxide film 63 and the tunnel oxide film 67 at the region below the control gate 65 may be independently formed, the film thickness of the tunnel oxide film 67 suited to the erasing operation may individually be set. As a result, the further low voltage operation is achieved.

Subsequently, description is made of a method of manufacturing a split-gate type non-volatile semiconductor memory device having the erasing gate as illustrated in FIG. 47, with reference to FIG. 48 to FIG. 51. Formed on the semiconductor substrate 60 is a lamination of the gate oxide film 63, the poly silicon film for the floating gate, the selective oxide film 66, the tunnel oxide film 67, the poly silicon film for the erasing gate, and the oxide film 69. As illustrated in FIG. 48A, a patterned resist film (not shown) is applied onto the oxide film 69, and the oxide film 69, a polysilicon film for the erasing gate, the tunnel oxide film 67, the selective oxide film 66 and the poly silicon film for the floating gate are selectively removed using the resist film. As a result, the floating gate 64 and the erasing gate 68 are formed. At this time, a part of the exposed gate oxide film 63 is etched, and the thickness of the gate oxide film 63 at an area below a control gate 65, which is formed by the subsequent process, becomes thinner.

Besides, FIG. 48B illustrates a cross section in a direction orthogonal to FIG. 48A. The respective memory cells are electrically isolated by the element isolation film (LOCOS) 72. Further, on an upper surface of the floating gate 64, the selective oxide film is formed so that a recess is formed at a center portion thereof, and each of the corner portions at both ends of the floating gate 64 has a pointed shape.

Next, as illustrated in FIG. 49, the sidewall oxide film 70 is formed so as to cover the sides of oxide film 69, the erasing gate 68, the tunnel oxide film 67, the selective oxide film 66, and the floating gate 64 on the erasing gate 68.

Next, a polysilicon film is formed on an entire surface of the semiconductor substrate 60, and anisotropic etching is performed to form sidewall conductive films so as to cover the sidewall oxide film 70. After that, as illustrated in FIG. 50, one of the sidewall conductive films is removed using the resist film 73 as a mask. As a result, the remaining sidewall conductive film becomes the control gate 65.

Next, as illustrated in FIG. 51, ion injection is performed using the resist film 73 as the mask to form the source region 61. After that, the resist film 73 is removed, and the sidewall oxide film 71 is formed on the side surfaces of the sidewall oxide film 70 and the control gate 65 on the source region 61 side. Then, a resist film covering the source region 61 is formed, and the ion injection is performed to form the drain region 62. Thus, the split-gate type non-volatile semiconductor memory device having the erasing gate shown in FIG. 47 is completed.

Besides, JP 2000-286348 A describes a split-gate type non-volatile semiconductor memory device having an erasing gate which is different from that disclosed in JP 2001-230330 A. Description is made of a device structure of the non-volatile semiconductor memory device described in JP 2000-286348 A with reference to FIG. 52 and FIG. 53.

As illustrated in FIG. 52, a source region 81 and a drain region 82 are formed on a surface layer of a silicon substrate 80. Further, a floating gate 84, a control gate 85 and an erasing gate 86 are formed in parallel via a gate oxide film 83 on the silicon substrate 80. The floating gate 84, the control gate 85, and the erasing gate 86 each are electrically isolated by the silicon oxide films 87 and 88. Note that, the surface layers of the drain region 82, the control gate 85, and the erasing gate 86 are subjected to silicidation (89, 90, and 91 each represent titanium silicide film), and hence a lower resistance is achieved.

The erasing gate 86 of JP 2000-286348 A is not positioned directly above the floating gate 84 different from that of JP 2001-230330 A, and is positioned directly above the source region 81. For that reason, as illustrated in FIG. 53, to realize a contact with the source region 81, the erasing gate 86 is divided so that a part of the lower source region 81 is exposed. Further, the erasing gate 86 and the source region 81 are connected to each other via a transistor 92. At the time of data programming, the transistor 92 is turned ON, and the erasing gate 86 and the source region 81 are in a conductive state. On the other hand, at the time of data erasing the transistor 92 is turned OFF, and the erasing gate 86 and the source region 81 are in a non-conductive state.

Besides, in JP 2001-085543 A, there is described a split-gate type non-volatile semiconductor memory device having an erasing gate which is different from that shown in JP 2001-230330 A and JP 2000-286348 A. The device structure of the non-volatile semiconductor memory device described in JP 2001-085543 A is described with reference to FIG. 54.

As illustrated in FIG. 54, a source region 101 and a drain region 102 are formed on the surface layer of the silicon substrate 100. Further, a floating gate 106 and a control gate 105 are formed side by side via a floating gate insulating film 104 and a control gate insulating film 103 formed on the silicon substrate 100. An erasing gate 107 is formed via an erasing gate the insulating film 108 and a silicon oxide film 109 so as to cover the floating gate 106, the control gate 105, and a source wiring 110.

In FIG. 54, three memory cells are illustrated (region sectioned by a dotted line constitutes one memory cell). The adjacent memory cells each share the source region 101 (the source wiring 110) and the drain region 102, and the source region 101 and the drain region 102 are formed symmetrically so that respective electrodes are arranged inversely. Further, the erasing gate 107 and the source wiring 110 are connected to the memory cells, which are adjacent to a perpendicular direction with respect to a cross-sectional direction of FIG. 54.

Thus, in JP 2000-286348 A and JP 2001-085543, the structure having the erasing gate positioned directly above the floating gate as described in JP 2001-230330 A is not employed, and the structure having the erasing gate positioned on an upper layer of the source region (the source wiring) or the control gate is employed. In the structure having the erasing gate directly above the floating gate, the conductive film for the floating gate and the conductive film for the erasing gate are simultaneously etched so that the floating gate and the erasing gate are formed in pair. Specifically, in JP 2001-230330 A, different from the structures of JP 2000-286348 A and JP 2001-085543 A, one erasing gate is formed per one floating gate, thereby being capable of making a unit for erasing to be small. Besides, a mask is necessary to be used when dividing the erasing gate in JP 2000-286348 A, and when forming the erasing gate in JP 2001-085543 A, manufacturing steps thereof may be complicate and intricate.

In recent years, in a microcontroller built in flash memory, achievements of higher operation speed, lower power consumption, and higher function are advancing more and more. For that reason, with respect to a built-in flash memory, too, the achievements of the higher operation speed, operation in a lower voltage, and high definition are coming to be required.

For the achievement of the high definition, it becomes important to form the respective members in a self-alignment method as much as possible, and to eliminate margins for displacement of the mask, thereby reducing the sizes of the memory cells. Further, the formation in a self-alignment method may simplify the manufacturing steps.

The present inventor has recognized that, in JP 2001-230330 A, the plug is not formed on the source. For that reason, after formation of an interlayer insulating film, a contact hole for an establishment of a contact with the source must be formed, thereby being necessary to use the mask thereat. Specifically, in order to secure the sufficient margins for the displacement of the mask, the fining of the memory cells may be prevented from being achieved. Further, in JP 2001-230330 A, the mask is used at the formation of the source and the drain. In addition, at the formation of the contact hole in the source, the mask must be used. Specifically, it results in promoting the complication and intrication of the manufacturing steps.

SUMMARY

The present invention seeks to solve one or more of the above problems, or to improve upon those problems at least in part.

In one embodiment, a non-volatile semiconductor memory device of the present invention is characterized by including: a semiconductor substrate; a floating gate formed above a gate insulating film covering the semiconductor substrate; an erasing gate formed above the floating gate intervening a tunnel insulating film therebetween; a control gate formed above a channel region of a surface layer of the semiconductor substrate at a position corresponding to one lateral side of the floating gate and the erasing gate, the floating gate and the erasing gate insulated from the control gate by a first sidewall insulating film; a first diffusion layer formed on the semiconductor substrate at a position corresponding to another lateral side of the floating gate and the erasing gate; a plug formed above the first diffusion layer, the plug coupled to the first diffusion layer, the floating gate and the erasing gate insulated from the plug by a second sidewall insulating film; and a second diffusion layer formed on the semiconductor substrate at a position adjacent to the control gate.

With such a device structure, the first diffusion layer and the plug connected thereto are formed in a self-alignment method, thereby contributing to a size reduction of the memory cells.

Thus, further miniaturization of the non-volatile semiconductor memory device having an erasing gate may be achieved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of present invention and that the invention is not limited to the embodiments illustrated for explanatory purposes.

First Embodiment

1. Structure

Figure 1:
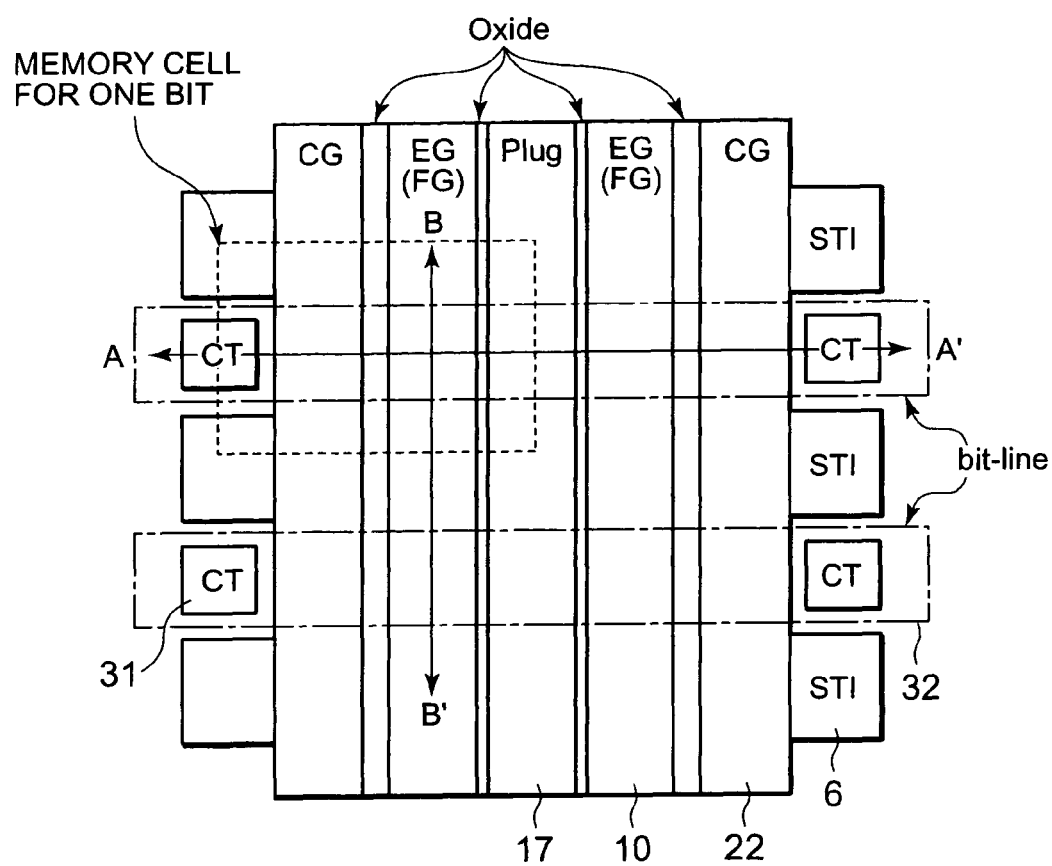
FIG. 1 is a plan view of a non-volatile semiconductor memory device according to a first embodiment of the present invention (plane layout)
Figure 2:
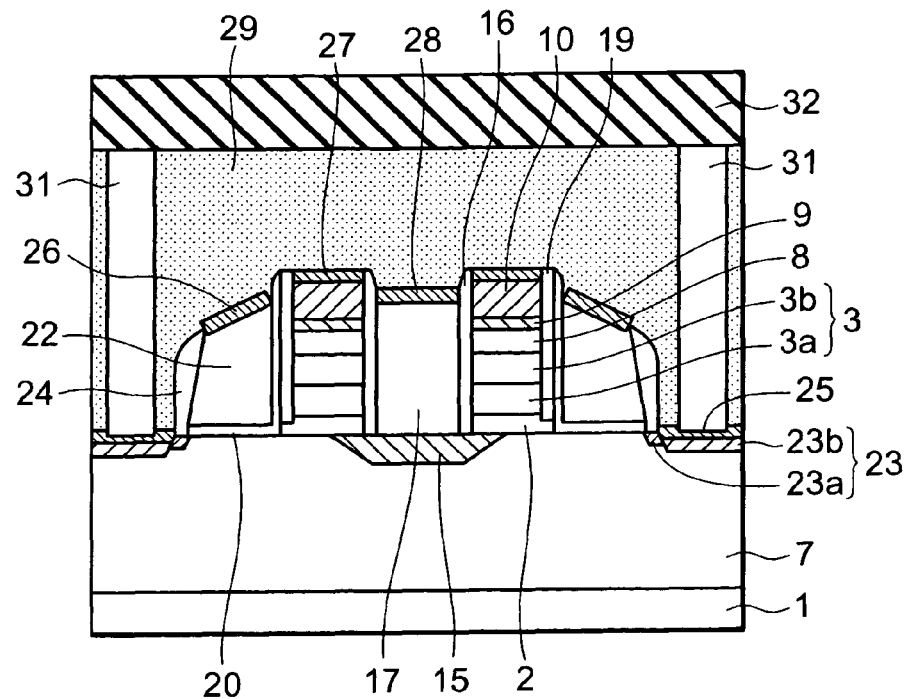
FIG. 2 is a sectional view taken along the line A-A of FIG. 1.
Figure 3:
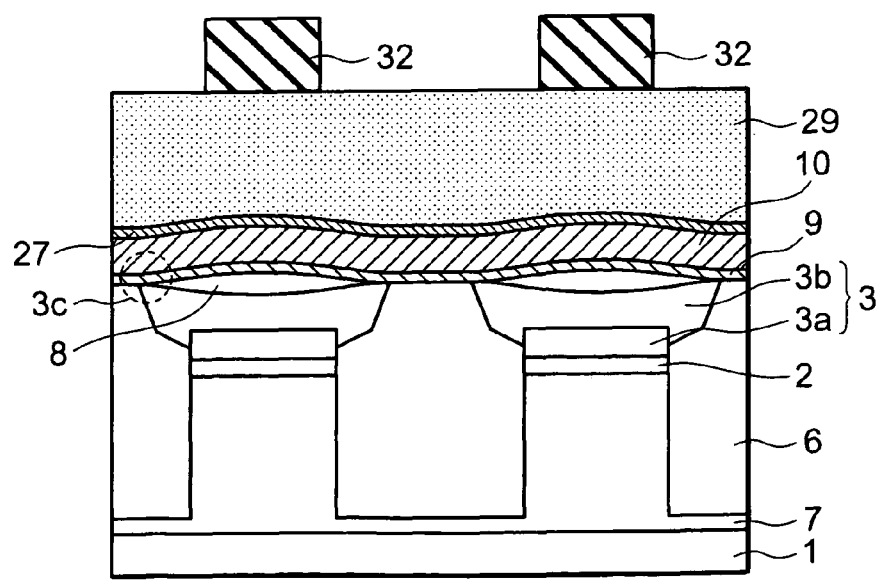
FIG. 3 is a sectional view taken along the line B-B of FIG. 1.

FIG. 1 to FIG. 3 are a plan view and cross sectional views of a non-volatile semiconductor memory device according to a first embodiment of the present invention. FIG. 1 illustrates a plan view (plane layout) viewed from upward. In FIG. 1, four pieces of the memory cells (four pieces of memory cells each being capable of recording data for one bit) are illustrated, and a portion surrounded by a dotted line in the figure corresponds to a memory cell for one bit.

AS illustrated in FIG. 1, a plug (PLUG) 17, an erasing gate (EG) 10, and a control gate (CG) 22, which are connected to a first source/drain diffusion layer 15, are formed in a direction parallel to a B-B' direction. The erasing gate 10 and a control gate 22 are disposed in symmetric with respect to the plug 17. The plug 17, the erasing gate 10, and the control gate 22 are each electrically isolated by an insulating film (for example, oxide film). The plug 17, the erasing gate 10, and the control gate 22 each extend in the B-B' direction, and hence those are used in common in the memory cells arranged side by side vertically. Further, the plug 17, the erasing gate 10, and the control gate 22 are formed of a conductive film (for example, polysilicon film), and the surface layer portion (upper surface portion) thereof is subjected to silicidation. In the plug 17, the erasing gate 10, and the control gate 22, contacts for applying a voltage are formed at given intervals. The plug 17, the erasing gate 10, and the control gate 22 each become a wiring layer formed of a polysilicon film, but reduction of resistance value is successfully attained through the silicidation. As a result, in the non-volatile semiconductor memory device according to the first embodiment of the present invention, respective programming, reading, and erasing operations may be carried out with a low voltage and at high speed.

On the other hand, in a direction parallel to A-A' direction, a shallow trench isolation (STI) 6 being an element isolation region is formed so as to conduct electrical isolation between the elements. At an under layer of the erasing gate 10, the floating gate (FG) 3 electrically isolated through the STI 6 is positioned. Further, the respective memory cells which are adjacent to each other in the A-A' direction share the use of the plug 17 connected to a first source/drain diffusion layer 15 and a contact plug (tungsten film) 31 connected to a second source/drain diffusion layer 23. The surface layer portion of the second source/drain diffusion layer 23 is subjected to silicidation, and hence the reduction in resistance of a contact portion with a contact plug 31 is attained. Note that, formed on an upper layer of the plug 17, the erasing gate 10, and control gate 22 is a metal wiring layer (bit-line) 32 connected to the contact plug 31.

FIG. 2 is a sectional view taken along the line A-A of FIG. 1. Two memory cells formed so as to be symmetrical with respect to the plug 17 (shared use) are illustrated therein. As illustrated in FIG. 2, formed in the silicon substrate 1 being a semiconductor substrate are P-well 7 being a P-type of well and the first source/drain diffusion layer 15 and the second source/drain diffusion layer 23 being an N-type impurity region and each becoming a source or a drain. In the surface layer (upper layer) of the second source/drain diffusion layer 23, a cobalt silicide film 25 is formed, and the contact portion with the contact plug 31 is realized in lower resistance.

On an upper layer of the first source/drain diffusion layer 15, there is formed the plug 17 connected thereto. The cobalt silicide film 28 is formed at the upper surface portion of the plug 17, and hence the plug 17 (wiring layer to be connected to the first source/drain diffusion layer 15) is realized in lower resistance through silicidation. Further, a second oxide film sidewall spacer 16 is formed on the side surface of the plug 17 to electrically isolate between the plug 17 and the floating gate, etc.

On both side of the plug 17, the floating gate 3 is formed while sandwiching a second oxide film sidewall spacer 16. The floating gate 3 is formed of a first polysilicon film 3a and a second polysilicon film 3b, and has a two-layer structure of a polysilicon film. At upper surface corner portions of the second polysilicon film 3b, there are formed sharp corner portions in a perpendicular direction (B-B' direction) with respect to a cross section of A-A' direction (see FIG. 3). Between the floating gate 3 and the silicon substrate 1 (P-well 7), the first gate oxide film 2 is formed. The floating gate 3 overlaps with a part of the first source/drain diffusion layer 15, and the floating gate 3 and the first source/drain diffusion layer 15 are coupled in capacitance through the first gate oxide film 2. Further, a third oxide film sidewall spacer 19 and a second gate insulating film 20 are formed on a side surface of the floating gate 3 on a side opposing the second oxide film sidewall spacer 16, and the oxide film 8 and the tunnel oxide film 9 are formed on the upper surface of the floating gate 3. As described above, the floating gate 3 is surrounded in its periphery by the second oxide film sidewall spacer 16, the first gate insulating film 2, the third oxide film sidewall spacer 19, the second gate insulating film 20, the oxide film 8, and the tunnel oxide film 9, and is electrically isolated from outside. A threshold voltage of the memory cell is changed depending on an electric field held in the floating gate.

Directly above the floating gate 3, there is formed the erasing gate 10 via the oxide film 8 and the tunnel oxide film 9. On both side surface of the erasing gate 10, the second oxide film sidewall spacer 16, the third oxide film sidewall spacer 19, and the second gate insulating film 20 are formed as well as the floating gate 3. The upper surface of the erasing gate 10 is subjected to silicidation, and the cobalt silicide film 27 is formed thereon. Owing to this, the erasing gate 10 is realized in lower resistance. As described above, in the non-volatile semiconductor memory device according to the first embodiment of the present invention, the erasing gate 10 being an electrode exclusively used for erasing is formed independently from a control gate 22 described later. Specifically, the non-volatile semiconductor memory device according to the first embodiment of the present invention includes the erasing gate 10, and hence has such a structure that a role relating to the erasing operation is separated from the control gate 22.

The control gate 22 is formed on the channel region of the surface layer of the silicon substrate 1 (P-well 7) via the insulating film so as to be formed side by side with the floating gate 3. Between the control gate 22 and the silicon substrate 1 (P-well 7), the second gate insulating film 20 is formed. With such a memory cell structure described above, occurrence of errors caused by over erasing may be prevented. One side surface of the control gate 22 has a contact with the erasing gate 10, the tunnel oxide film 9, the oxide film 8, the control gate 3 (first polysilicon film 3a+second polysilicon film 3b), and the first gate oxide film 2 via the third oxide film sidewall spacer 19 and the second gate insulating film 20, and the control gate 22 is formed as the sidewall conductive film (sidewall polysilicon film) thereof. A fourth oxide film sidewall spacer 24 is formed on another side surface of the control gate 22. Further, the upper portion of the control gate 22 is subjected to silicidation, and the cobalt silicide film 26 is formed thereon. Owing to this, the control gate 22 is realized in lower resistance.

As described above, in the non-volatile semiconductor memory device according to the first embodiment of the present invention, an entire upper surface of the second source/drain diffusion layer 23, the control gate 22, the erasing gate 10, and the plug 17 are subjected to silicidation. With this, it becomes possible to sufficiently reduce the wiring resistance.

Further, in the non-volatile semiconductor memory device according to the first embodiment of the present invention, the film thicknesses of the first gate oxide film 2, the second gate insulating film 20, the tunnel oxide film 9, and the third oxide film sidewall spacer 19 may freely be set to different film thicknesses. In particular, the insulating film (second gate insulating film 20) between the control gate 22 and the silicon substrate 1 (P-well 7) may be set to an appropriate film thickness, and hence the memory cell current at the reading out may be set to a large current even in low voltage.

In addition, in the non-volatile semiconductor memory device according to the first embodiment of the present invention, various insulating films such as the control gate 22, the floating gate 3, the erasing gate 10, the plug 17, and the oxide film sidewall spacer are formed in a self-alignment method. Those structural features are exhibited by a specific manufacturing method described later.

Note that, as illustrated in FIG. 2, in the non-volatile semiconductor memory device according to the first embodiment of the present invention, the adjacent memory cells each share the first source/drain diffusion layer 15 (plug 17). Then, the respective memory cells are formed symmetrical with respect to the first source/drain diffusion layer 15 (plug 17). The floating gate 3, the erasing gate 10, the control gate 22, etc. are formed symmetrical with respect to the first source/drain diffusion layer 15 (plug 17). Further, each of the memory cells which are adjacent on an opposing side shares the second source/drain diffusion layer 23 (contact plug 31) (not shown). Then, each of the memory cells is formed symmetrical with respect to the second source/drain diffusion layer 23 (contact plug 31). Specifically, the floating gate 3, the erasing gate 10, the control gate 22, etc. are formed symmetrical with respect to the second source/drain diffusion layer 23 (contact plug 31).

FIG. 3 is a sectional view taken along the line B-B of FIG. 1 (two pieces of memory cells). Featuring point resides in the shape of the floating gate 3. The floating gate 3 is formed of the first polysilicon film 3a in the lower portion thereof and the second polysilicon film 3b in the upper portion thereof (two-layer structure). The upper portion (second polysilicon film 3b) of the floating gate 3 is oxidized, and hence has a shape in which the central portion thereof is recessed. Further, the upper surface corner portion has a shape projecting toward the element isolation oxide film 6 side. With this, the upper surface corner portion has an acute angle of from 30° to 40° (acute angle portion 3c).

A distance between the floating gate 3 and the erasing gate 10 becomes closest at an acute angle portion 3c of the floating gate 3. The distance becomes a film thickness of the tunnel oxide film 9. With this, at the erasing operation, the electric field (electron) may efficiently be released from the acute angle portion 3c of the floating gate 3 to the erasing gate 10.

2. Operation

Figure 4:
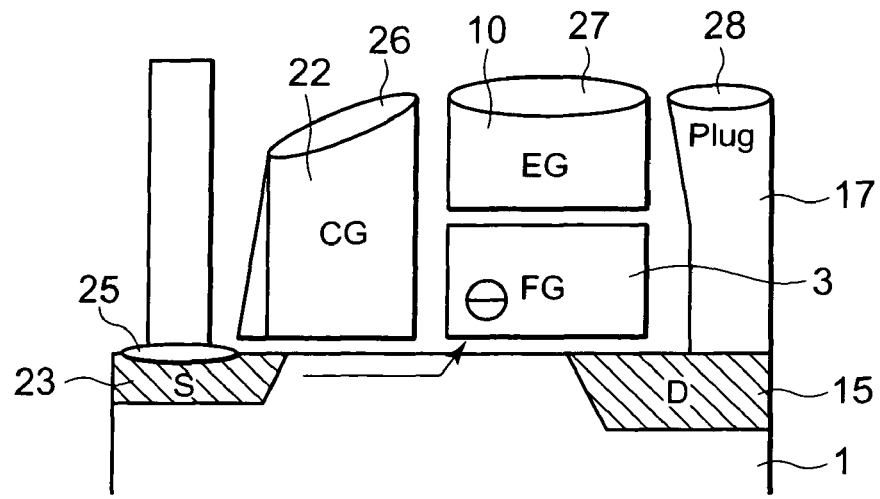
FIG. 4 is a conceptual diagram illustrating a programming operation of the non-volatile semiconductor memory device according to the first embodiment of the present invention.
Figure 5:
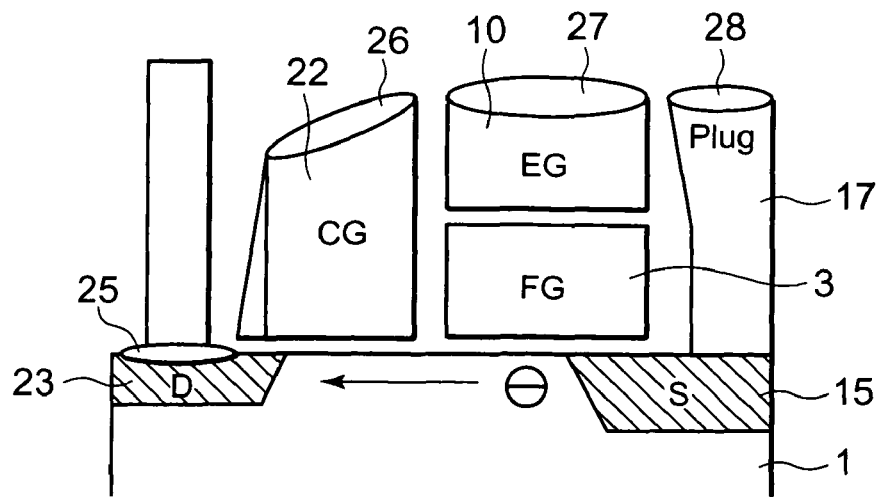
FIG. 5 is a conceptual diagram illustrating a reading operation of the non-volatile semiconductor memory device according to the first embodiment of the present invention.

Next, operation (programming, reading, and erasing) of the non-volatile semiconductor memory device according to the first embodiment of the present invention is described. FIG. 4 is a conceptual diagram illustrating a programming operation using a cross section taken along the A-A' of FIG. 1. The programming is performed by a source side channel hot electron (CHE: channel hot electron) injection. At the programming operation, the first source/drain diffusion layer 15 functions as a drain (D), and the second source/drain diffusion layer 23 functions as a source (S), respectively. For example, a voltage of +1.6 V is applied to the control gate 22, a voltage of +7.6 V is applied to the first source/drain diffusion layer 15, and a voltage of +0.3 V is applied to the second source/drain diffusion layer 23. The electron released from the second source/drain diffusion layer 23 is accelerated by an intense electric field of the channel region to become CHE. In particular, owing to the capacitance coupling between the first source/drain diffusion layer 15 and the floating gate 3, the potential of the floating gate 3 becomes high, and the intense electric field is generated at a narrow gap between the control gate 22 and the floating gate 3. High energy CHE produced by the intense electric field is injected into the floating gate 3 through the gate oxide film 2. This type of injection is called a source side injection (SSI: source side injection), and according to SSI, electron injection efficiency is enhanced, thereby being capable of setting an applied voltage to be low.

Through the injection of the electron to the floating gate 3, the threshold voltage of the memory cells raises.

Further, at the programming operation, the voltage may be applied to the erasing gate 10 (for example, 4 to 5 V). Specifically, the erasing gate 10 may play a role of raising the potential of the floating gate 3. In this case, the voltage applied to the first source/drain diffusion layer 15 may be lowered, and hence punch through resistance between the first source/drain diffusion layer 15 and the second source/drain diffusion layer 23 (between source and drain) may be enhanced.

FIG. 4 is a conceptual diagram illustrating a reading operation using a cross section taken along the A-A' of FIG. 1. At the reading operation, the first source/drain diffusion layer 15 functions as a source (S), and the second source/drain diffusion layer 23 functions as a drain (D), respectively. For example, to the control gate 22, a voltage of +2.7 V is applied, and to the second source/drain diffusion layer 23, a voltage of +0.5 V is applied, and hence the voltages of the first source/drain diffusion layer 15 and the silicon substrate 1 are set to a voltage of 0 V. In the case of the erasing cell (for example, memory cell in a state in which electric field is not injected into the floating gate 3), the threshold voltage is low, and the reading current (memory cell current) is allowed to flow. On the other hand, in the case of programming cell (for example, memory cell in a state in which electric field is injected into the floating gate 3), the threshold voltage is high, and the reading current (memory cell current) is almost not allowed to flow. By detection of this reading current (memory cell current), the program cell or the erasing cell (judging whether data 0 is stored or data 1 is stored) may be determined.

Figure 6A:
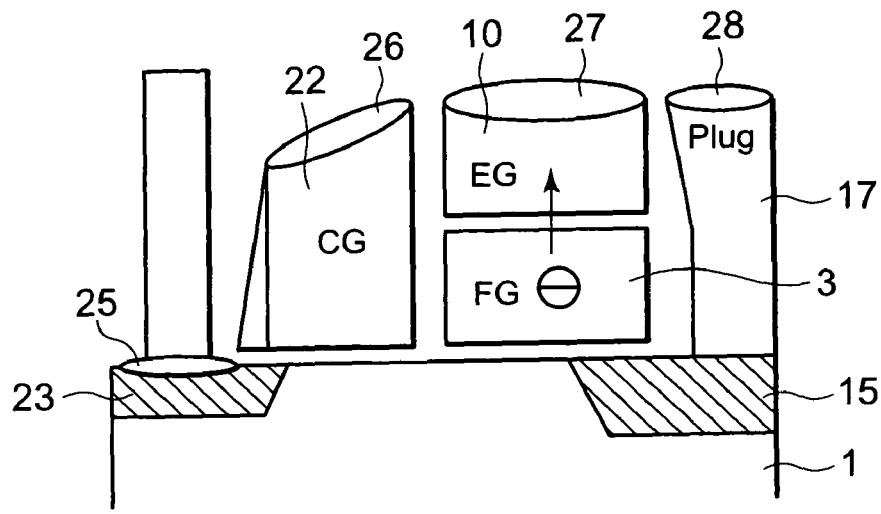
FIG. 6A and FIG. 6B are conceptual diagrams illustrating an erasing operation of the non-volatile semiconductor memory device according to the first embodiment of the present.
Figure 6B:
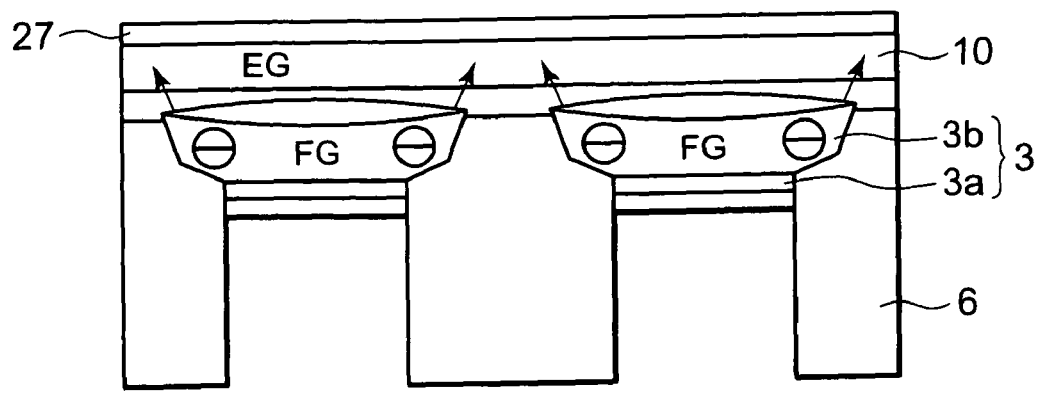

FIG. 6A is a conceptual diagram illustrating an erasing operation using a cross section taken along the A-A' of FIG. 1. FIG. 6B is a conceptual diagram illustrating an erasing operation using a cross section taken along the B-B' of FIG. 1. The erasing is performed by a FN tunnel method. For example, a voltage of 10 V is applied to the erasing gate 10, and the voltages of the control gate 22, the first source/drain diffusion layer 15, the second source/drain diffusion layer 23, and the silicon substrate 1 are set to a voltage of 0 V. As a result, a high electric field is applied to the tunnel insulating film 9 between the erasing gate 10 and the floating gate 3, to thereby cause FN tunnel current to flow. With this, the electric field (electron) in the floating gate 3 is drawn to the erasing gate 10 through the tunnel insulating film 9. Further, as described above, at the erasing operation, the voltages of the control gate 22, the first source/drain diffusion layer 15, the second source/drain diffusion layer 23, and the silicon substrate 1 are 0 V. Because no voltage is applied to the control gate 22, a potential difference between the control gate 22 and the silicon substrate 1 is 0 V, degradation of the second gate insulating film 20 (insulating film between control gate 22 and silicon substrate 1 (P-well 7)) owing to the erasing operation does not occur.

In particular, in the periphery of the acute angle portion 3c of the floating gate 3, the intense electric field is generated owing to the pointed shape, and the electric field (electron) in the floating gate 3 is mainly released from the acute angle portion 3c to the erasing gate 10. Thus, it may be said that the acute angle portion 3c, where the intense electric field generates, enhances the drawing efficiency of the electric field (electron). The electric field (electron) is drawn from the floating gate 3, and hence the threshold voltage of the memory cell is reduced.

Note that, in a case where the threshold voltage of the floating gate 3 becomes negative owing to the over erasing, the channel may always be caused in the silicon substrate 1 (P-well 7) below the floating gate 3. However, the control gate 22 is also formed in the channel region, thereby being capable of preventing the memory cell from being always in ON-state. As described above, the non-volatile semiconductor memory device according to the first embodiment of the present invention has a merit in that the over erasing error may be prevented from occurring.

3. Manufacturing Method

FIG. 7 to FIG. 45 are cross sectional views each illustrating a method of manufacturing a non-volatile semiconductor memory device according to the first embodiment of the present invention. It should be noted that, in FIG. 7 to FIG. 45, part A illustrates a cross sectional view taken along the line A-A' of FIG. 1, and part B illustrates a cross sectional view taken along the line B-B' of FIG. 1.

Figure 7A:
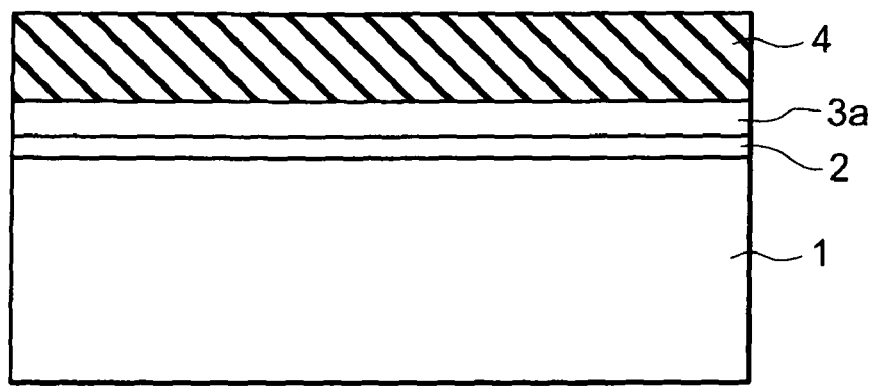
FIG. 7A is a sectional view taken along the line A-A of FIG. 1 illustrating a manufacturing step of the non-volatile semiconductor memory device according to the first embodiment of the present invention.
Figure 7B:
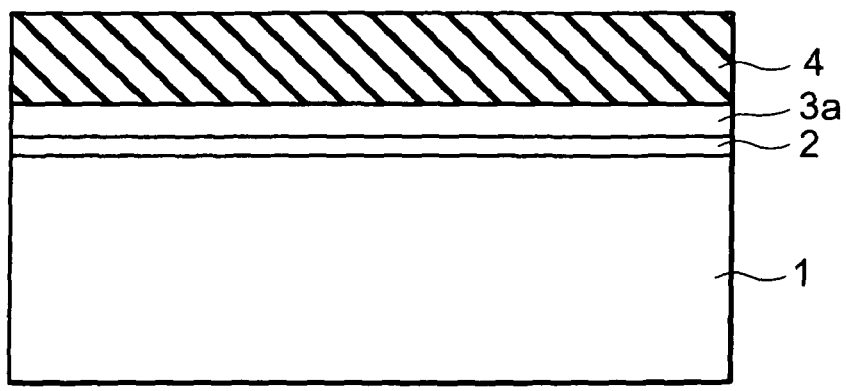
FIG. 7B is a sectional view taken along the line B-B of FIG. 1.

First, as illustrated in FIG. 7A and FIG. 7B, the first gate oxide film 2 having a film thickness of about 8 to 10 nm is formed on the silicon substrate 1 through thermal oxidation at 800° C. to 900° C. The first gate oxide film 2 finally functions as the gate insulating film for insulating the floating gate 3 from the silicon substrate 1 (P-well 7 in the non-volatile semiconductor memory device. After the formation of the first gate oxide film 2, the first polysilicon film 3a for the floating gate (conductive film) is formed on an upper layer thereof by CVD to have a film thickness of about 80 to 100 nm. The first polysilicon film 3a forms a part of the floating gate 3. Subsequently, the field nitride film 4 is formed on the first polysilicon film 3a by CVD to have a film thickness of about 100 nm to 150 nm.

Figure 8A:
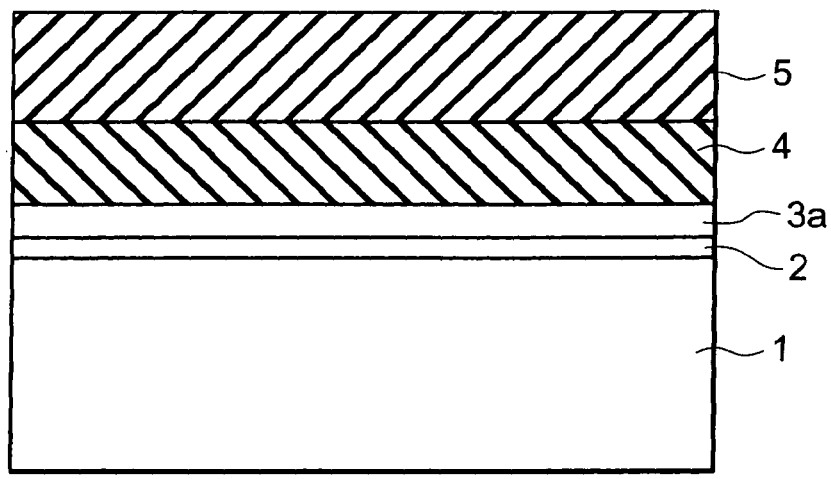
FIG. 8A is a sectional view taken along the line A-A of FIG. 1 illustrating a manufacturing step of the non-volatile semiconductor memory device according to the first embodiment of the present invention.
Figure 8B:
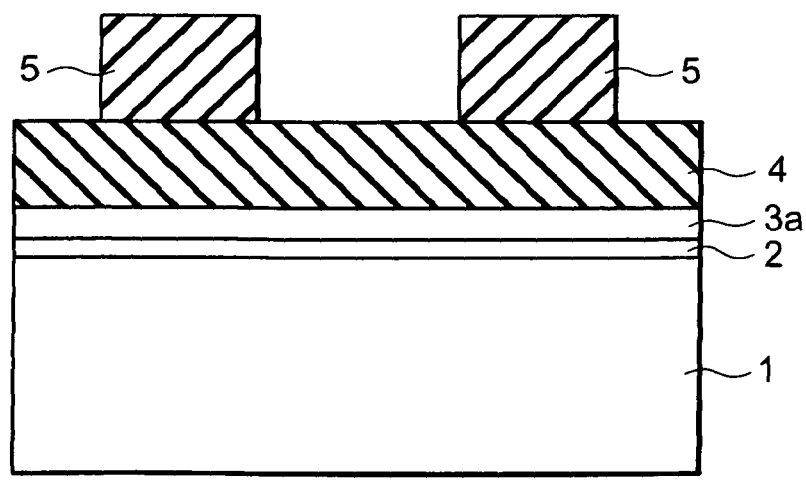
FIG. 8B is a sectional view taken along the line B-B of FIG. 1.

Next, as illustrated in FIG. 8A and FIG. 8B, the first resist mask 5 for the formation of the element isolation region is formed on the field nitride film 4. The first resist mask 5 is subjected to patterning so as to have an opening in a direction parallel to A-A'.

Figure 9A:
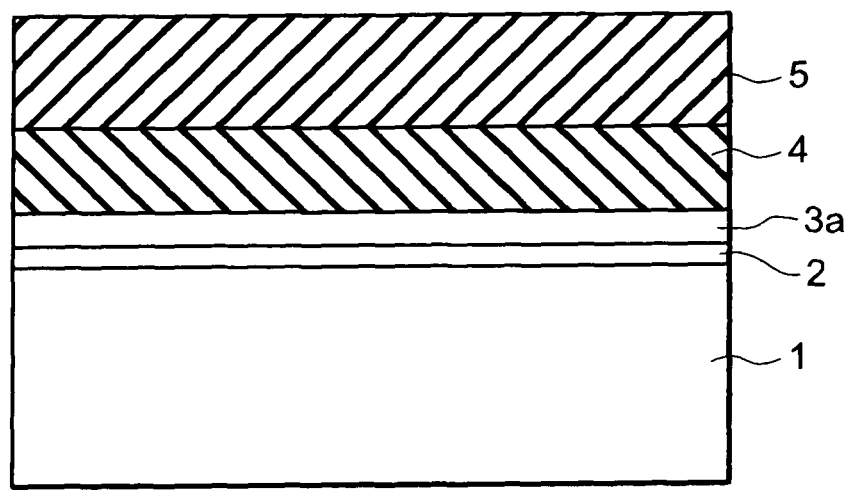
FIG. 9A is a sectional view taken along the line A-A of FIG. 1 illustrating a manufacturing step of the non-volatile semiconductor memory device according to the first embodiment of the present invention.
Figure 9B:
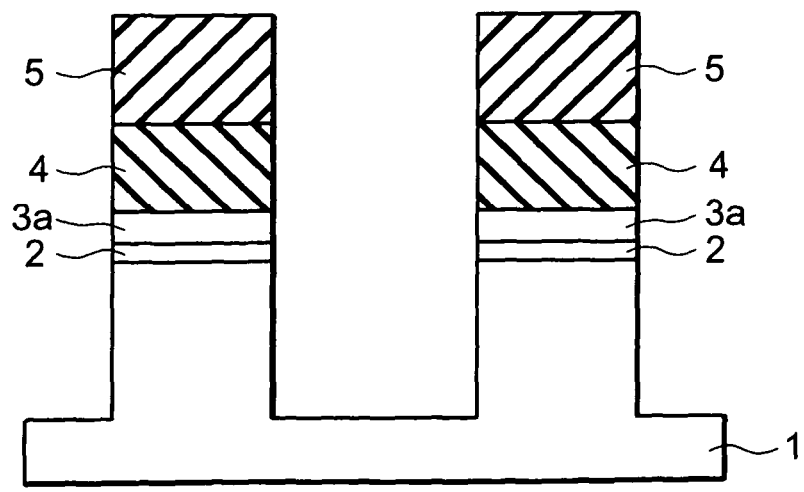
FIG. 9B is a sectional view taken along the line B-B of FIG. 1.

Next, as illustrated in FIG. 9B, the field nitride film 4, the first polysilicon film 3a, and the first gate oxide film 2 is sequentially selectively removed by the anisotropic etching using as the mask the first resist mask 5. Then, the silicon substrate 1 is further subjected to etching to the depth of about 300 nm to form a trench. After that, the first resist mask 5 is peeled off.

Figure 10A:
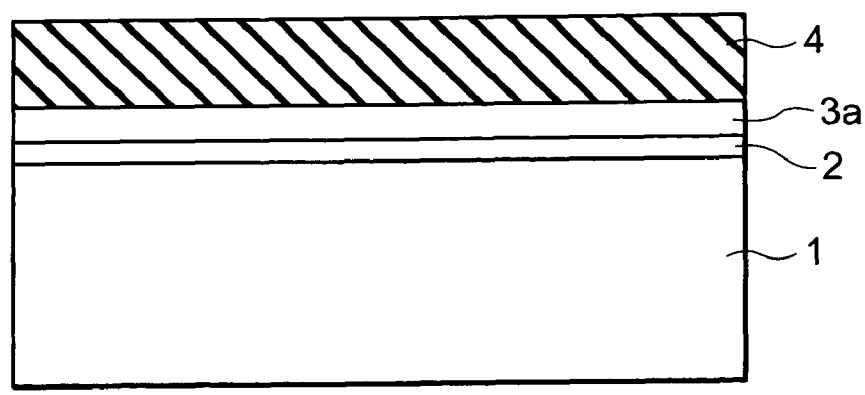
FIG. 10A is a sectional view taken along the line A-A of FIG. 1 illustrating a manufacturing step of the non-volatile semiconductor memory device according to the first embodiment of the present invention.
Figure 10B:
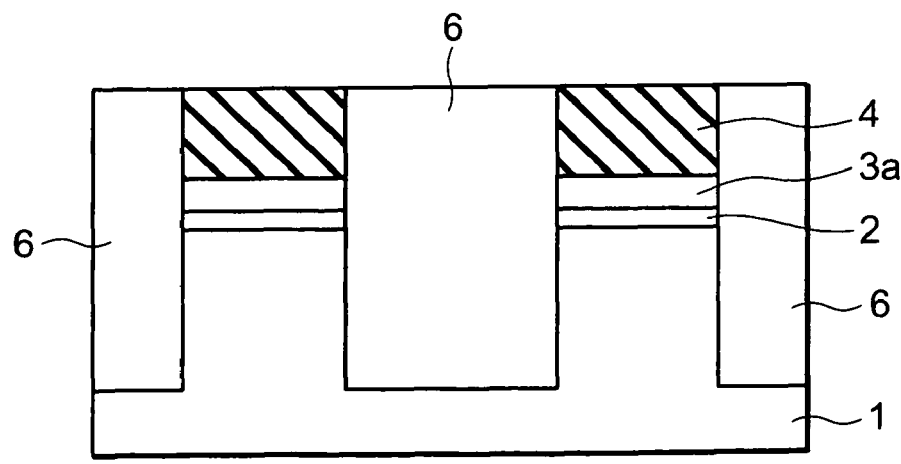
FIG. 10B is a sectional view taken along the line B-B of FIG. 1.

Next, the insulating film formed of the oxide film is formed by plasma CVD into a film thickness of about 600 nm to 700 nm, and the trench formed in a step illustrated in FIG. 9 is buried with the oxide film. As illustrated in FIG. 10B, then, the surface of the oxide film is planarized through chemical mechanical polishing (CMP) so that the surface of the oxide film becomes the same height with the upper surface of the field nitride film 4. With this, the element isolation oxide film (STI) 6 is formed.

Figure 11A:
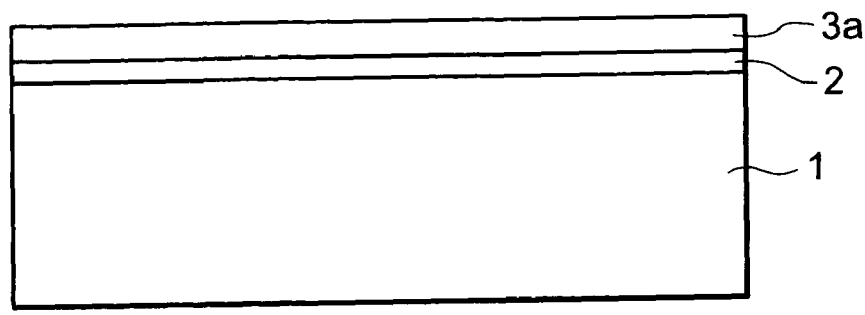
FIG. 11A is a sectional view taken along the line A-A of FIG. 1 illustrating a manufacturing step of the non-volatile semiconductor memory device according to the first embodiment of the present invention.
Figure 11B:
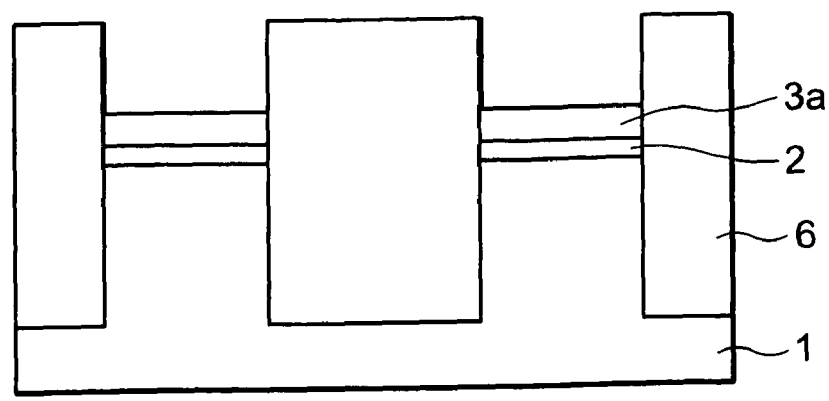
FIG. 11B is a sectional view taken along the line B-B of FIG. 1.

Next, as illustrated in FIG. 11A and FIG. 11B, the field nitride film 4 is removed by immersing into a phosphate solution of about 140° C. to 160° C. for about 30 minutes to 40 minutes.

Figure 12A:
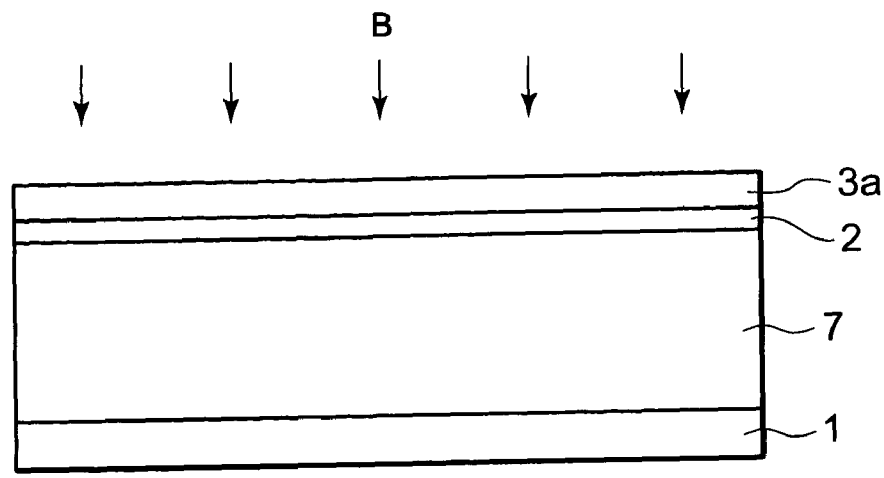
FIG. 12A is a sectional view taken along the line A-A of FIG. 1 illustrating a manufacturing step of the non-volatile semiconductor memory device according to the first embodiment of the present invention.
Figure 12B:
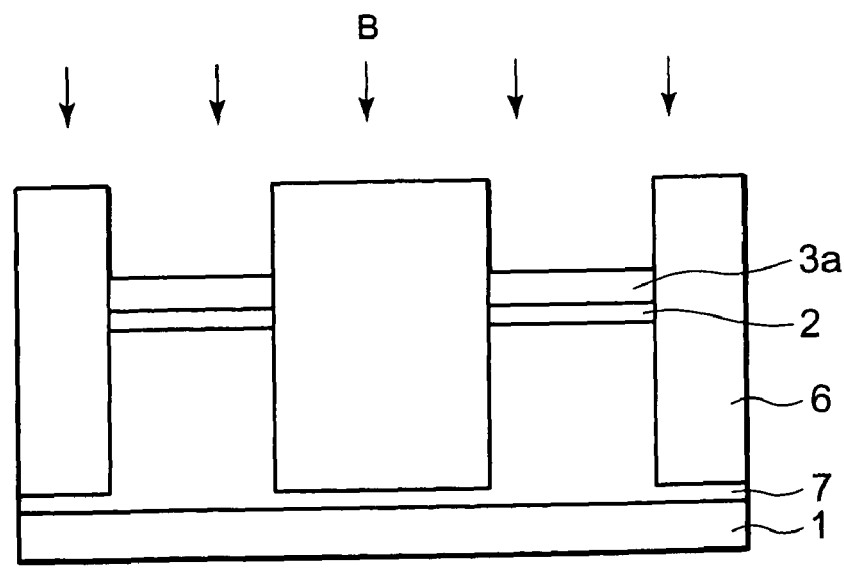
FIG. 12B is a sectional view taken along the line B-B of FIG. 1.

Next, as illustrated in FIG. 12A and FIG. 12B, boron B ion injection is carried out, for example, at an injection energy of 130 keV to 150 keV and a dose amount of $4.0 \times 10^{12}$ cm$^{-2}$ to $6.0 \times 10^{12}$ cm$^{-2}$. The boron is injected into the silicon substrate 1 by passing through the first polysilicon film 3a and the first gate oxide film 2. After that, activation is carried out by heat treatment about 900° C. to 1,000° C. under a nitrogen atmosphere to form the P-well 7 in the silicon substrate 1.

Figure 13A:
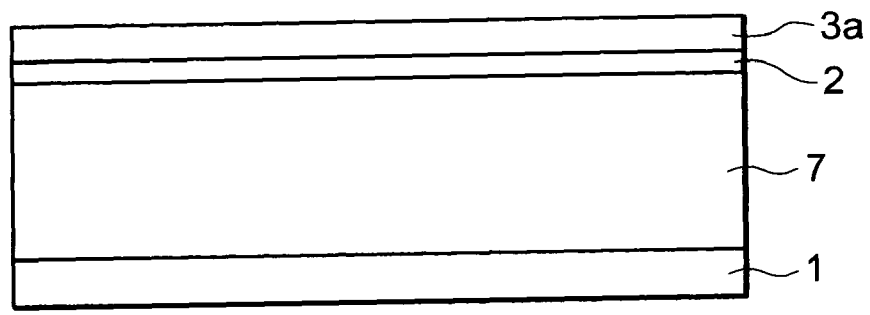
FIG. 13A is a sectional view taken along the line A-A of FIG. 1 illustrating a manufacturing step of the non-volatile semiconductor memory device according to the first embodiment of the present invention.
Figure 13B:
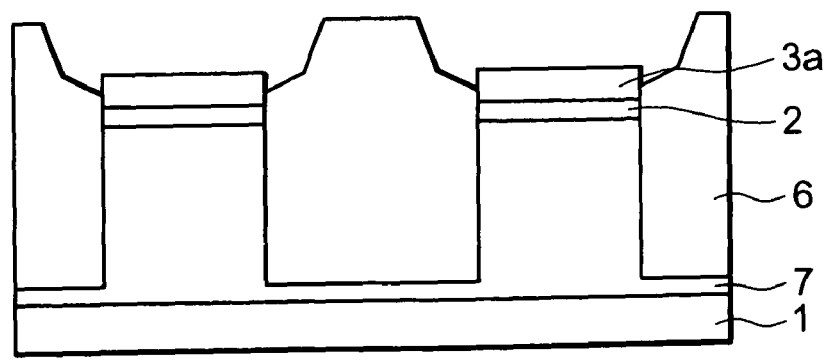
FIG. 13B is a sectional view taken along the line B-B of FIG. 1.

Next, as illustrated in FIG. 13B, the oxide film wet etching is performed for 3 minutes to 4 minutes with fluoric acid so that the upper surface corner portion of the element isolation oxide film 6 is subjected to rounding so as to have an inclined surface. Further, at this time, an attention is paid so that the inclined surface of the element isolation oxide film 6 is positioned above the lower surface of the first polysilicon film 3a (upper surface of first gate oxide film 2).

Figure 14A:
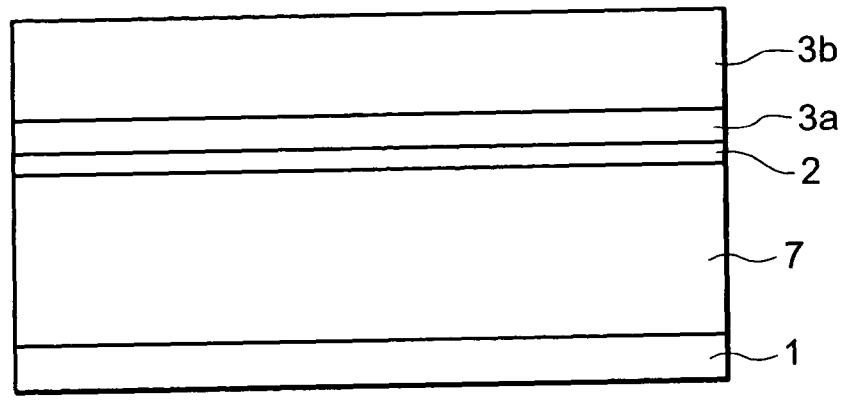
FIG. 14A is a sectional view taken along the line A-A of FIG. 1 illustrating a manufacturing step of the non-volatile semiconductor memory device according to the first embodiment of the present invention.
Figure 14B:
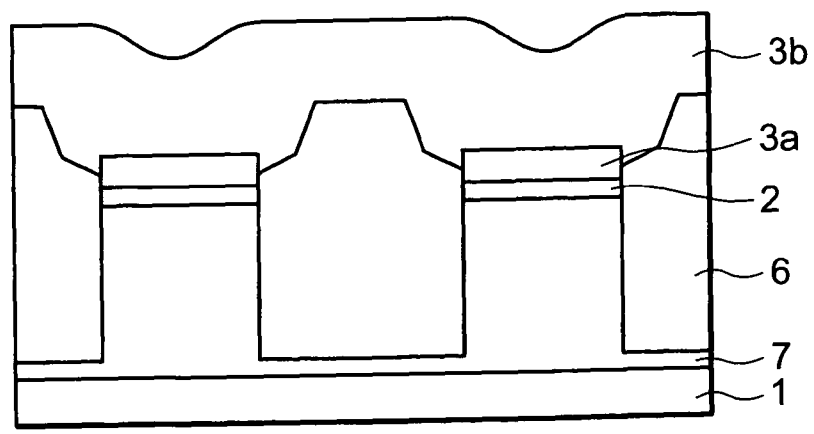
FIG. 14B is a sectional view taken along the line B-B of FIG. 1.

Next, as illustrated in FIG. 14A and FIG. 14B, the second polysilicon film 3b (conductive film) is formed over an entire surface to have a film thickness of about 300 nm to 400 nm. The second polysilicon film 3b forms a part of the floating gate 3. Specifically, the floating gate 3 is formed of the first polysilicon film 3a and the second polysilicon film 3b.

Figure 15A:
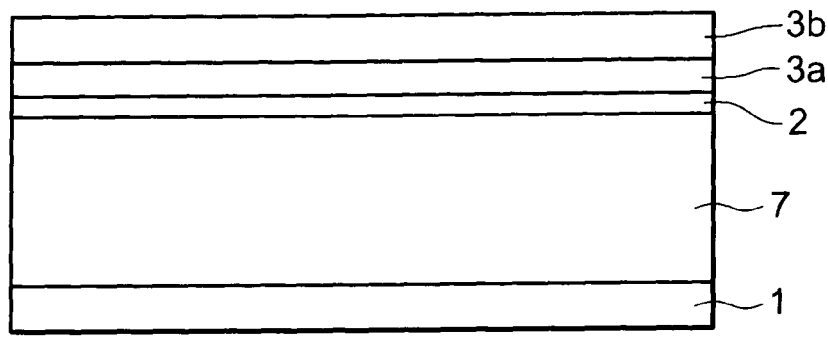
FIG. 15A is a sectional view taken along the line A-A of FIG. 1 illustrating a manufacturing step of the non-volatile semiconductor memory device according to the first embodiment of the present invention.
Figure 15B:
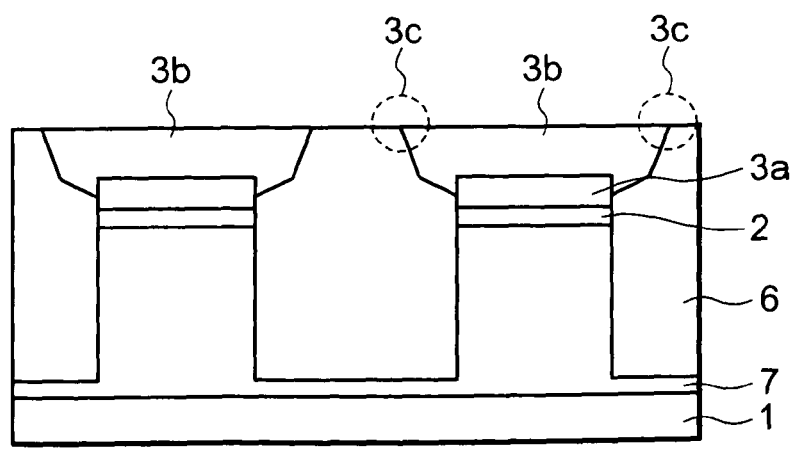
FIG. 15B is a sectional view taken along the line B-B of FIG. 1.

Next, as illustrated in FIG. 15A and FIG. 15B, the second polysilicon film 3b is polished using a CMP technique to planarize to have the same height with the upper surface of the element isolation oxide film 6. As a result, the first polysilicon film 3a and the second polysilicon film 3b are buried between the element isolation oxide films 6. Further, the second polysilicon film 3b has a shape projecting toward the above of the element isolation oxide film 6. With this, in the second polysilicon film 3b, two acute angle portions 3c having an angle about 50 degrees to 60 degrees are formed by the inclined surface formed on the upper surface of the element isolation oxide film 6 and the upper surface of the second polysilicon film planarized by a CMP technique.

Figure 16A:
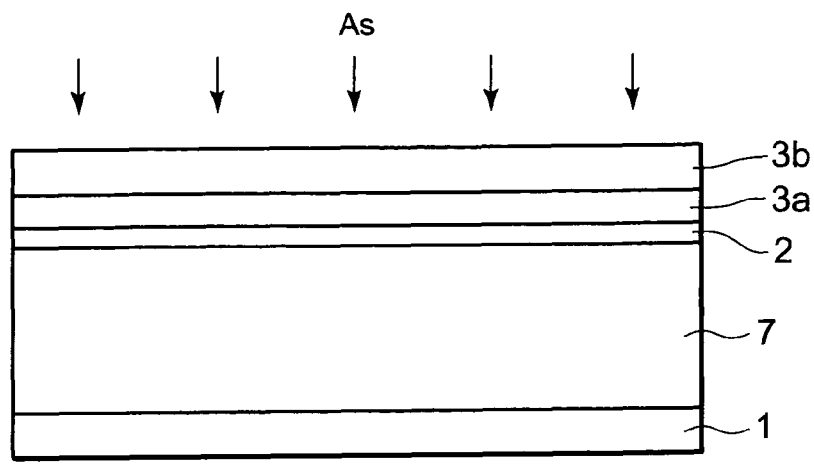
FIG. 16A is a sectional view taken along the line A-A of FIG. 1 illustrating a manufacturing step of the non-volatile semiconductor memory device according to the first embodiment of the present invention.
Figure 16B:
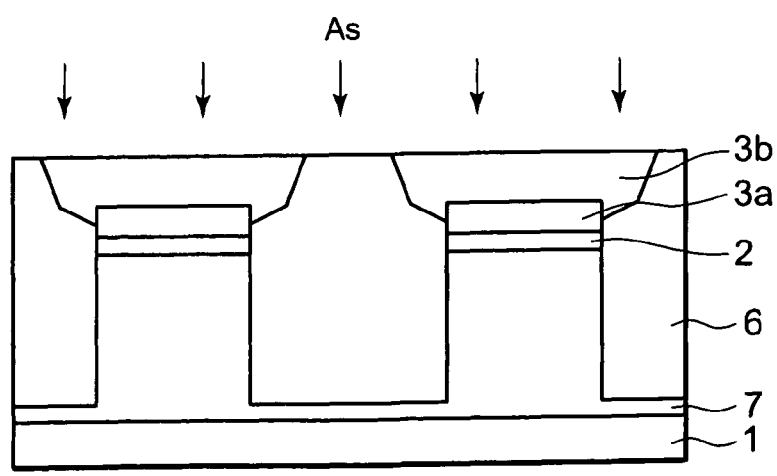
FIG. 16B is a sectional view taken along the line B-B of FIG. 1.

Next, as illustrated in FIG. 16A and FIG. 16B, n-type impurity is injected to the entire surface, for example, arsenic (As) at an injection energy of 5 keV and a dose amount of $1.0 \times 10^{15}$ cm$^{-2}$ is injected to the first polysilicon film 3a and the second polysilicon film 3b to establish conductivity. Note that, phosphorus (P) may be injected in place of arsenic. Besides, phosphorus dope may be carried out into the first polysilicon film 3a and the second polysilicon film 3b by using as a thermal diffusion source phosphorus trichloride (POCL3). After that, activation is performed by heat treatment about 800° C. under a nitrogen atmosphere.

Figure 17A:
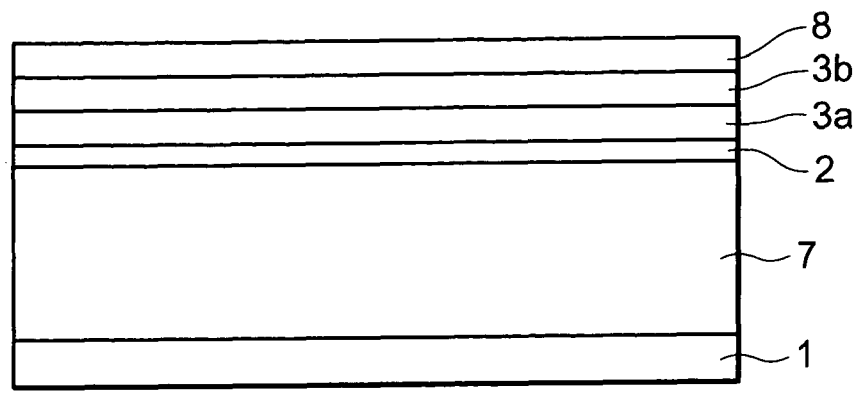
FIG. 17A is a sectional view taken along the line A-A of FIG. 1 illustrating a manufacturing step of the non-volatile semiconductor memory device according to the first embodiment of the present invention.
Figure 17B:
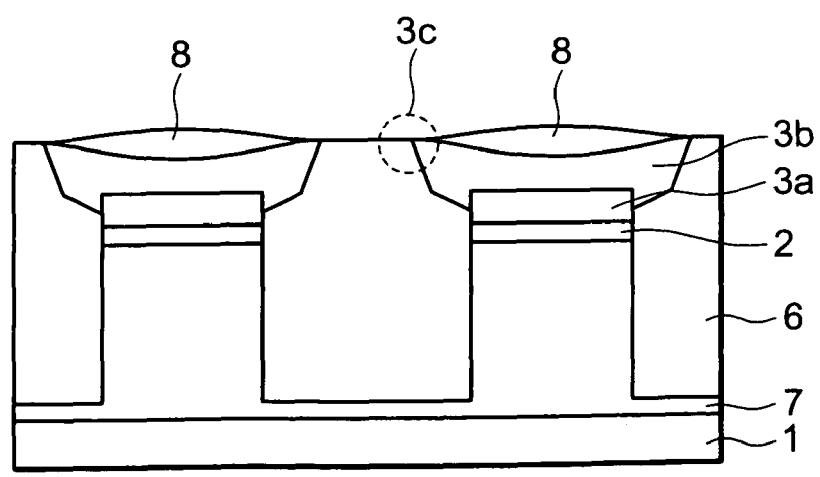
FIG. 17B is a sectional view taken along the line B-B of FIG. 1.

Next, as illustrated in FIG. 17A and FIG. 17B, the surface of the second polysilicon film 3b is oxidized using a thermal oxidation method. With this oxidation, the second polysilicon film 3b is covered with the oxide film 8. The oxide film 8 is formed on the second polysilicon film 3b so as to have such a film thickness that a center portion thereof is most thick and the film thickness becomes thinner as approaching to end portions, and hence the upper surface of the second polysilicon film 3b has a recess shape. With this, the acute angle portion 3c becomes more acute to have a pointed shape of about 30 degrees to 40 degrees.

Figure 18A:
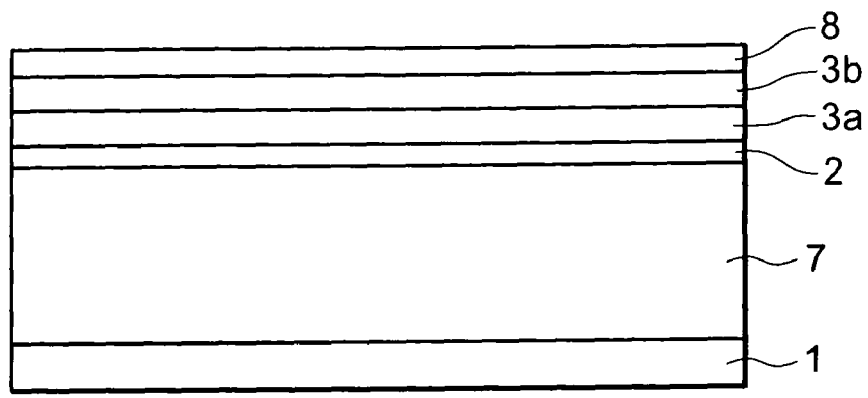
FIG. 18A is a sectional view taken along the line A-A of FIG. 1 illustrating a manufacturing step of the non-volatile semiconductor memory device according to the first embodiment of the present invention.
Figure 18B:
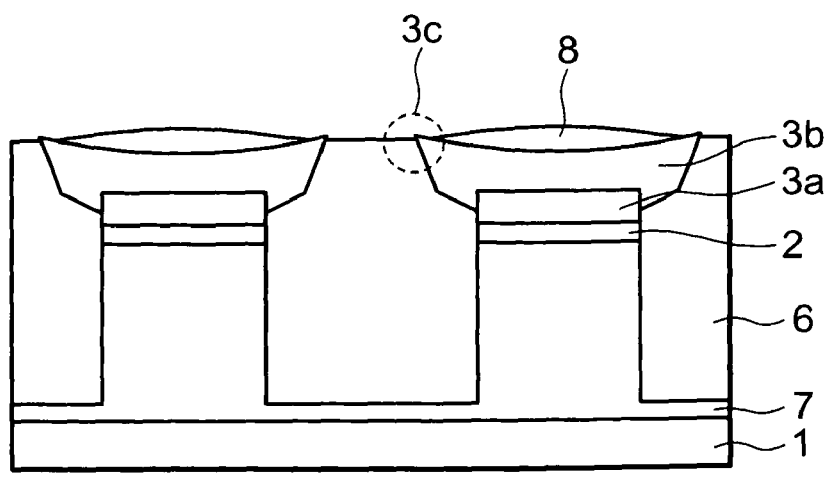
FIG. 18B is a sectional view taken along the line B-B of FIG. 1.

Next, as illustrated in FIG. 18A and FIG. 18B, the surfaces of the oxide film 8 and the element isolation oxide film 6 are removed about 10 nm by etching with fluoric acid to expose the acute angle portion 3c only.

Figure 19A:
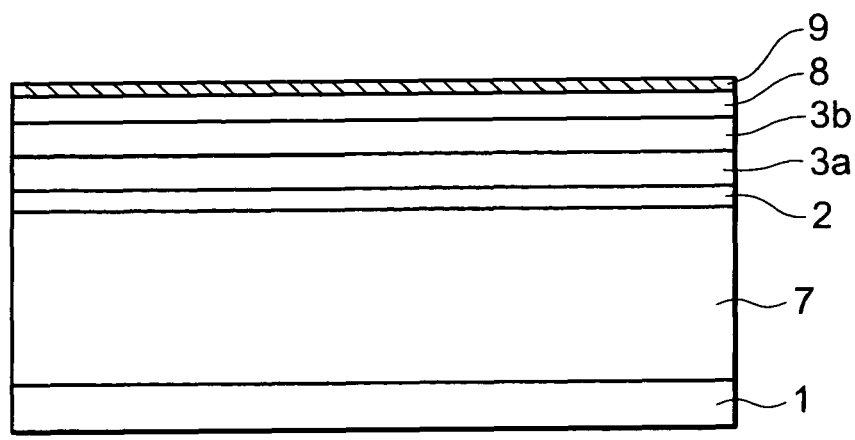
FIG. 19A is a sectional view taken along the line A-A of FIG. 1 illustrating a manufacturing step of the non-volatile semiconductor memory device according to the first embodiment of the present invention.
Figure 19B:
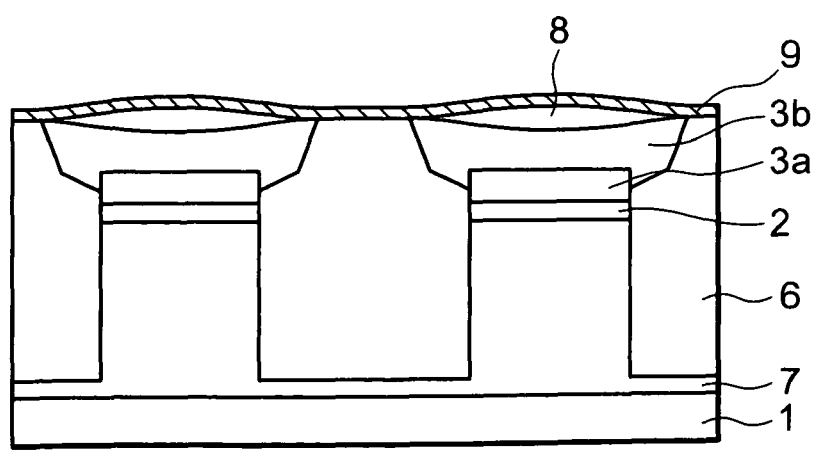
FIG. 19B is a sectional view taken along the line B-B of FIG. 1.

Next, as illustrated in FIG. 19A and FIG. 19B, the tunnel oxide film 9 is formed by CVD into a film thickness of about 14 nm to 16 nm. Note that, after the formation of the tunnel oxide film 9, thermal oxidation may be performed to obtain a structure including a CVD oxide film and the thermal oxide film. Further, anneal treatment containing nitrogen may be conducted to nitride the oxide film.

Figure 20A:
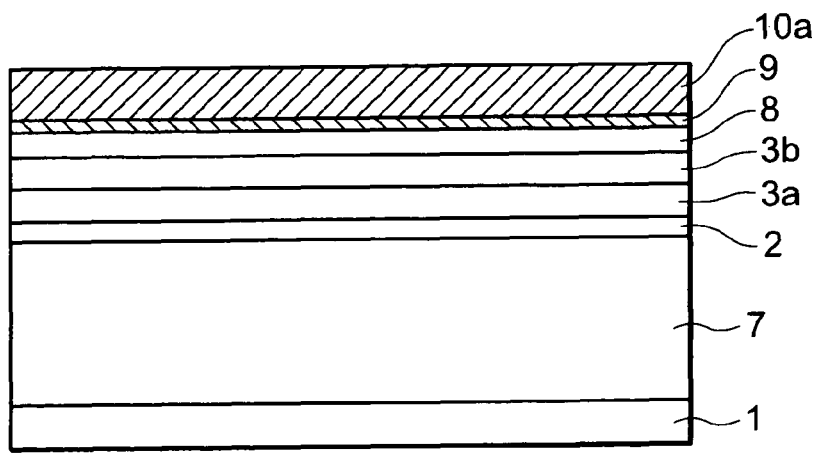
FIG. 20A is a sectional view taken along the line A-A of FIG. 1 illustrating a manufacturing step of the non-volatile semiconductor memory device according to the first embodiment of the present invention.
Figure 20B:
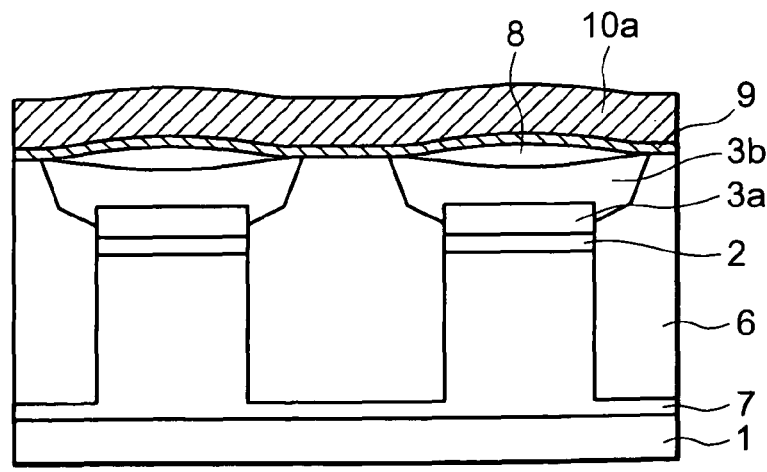
FIG. 20B is a sectional view taken along the line B-B of FIG. 1.

Next, as illustrated in FIG. 20A and FIG. 20B, a third polysilicon film 10a (conductive film) for an erasing gate is formed by CVD. The third polysilicon film 10a finally forms the erasing gate 10.

Figure 21A:
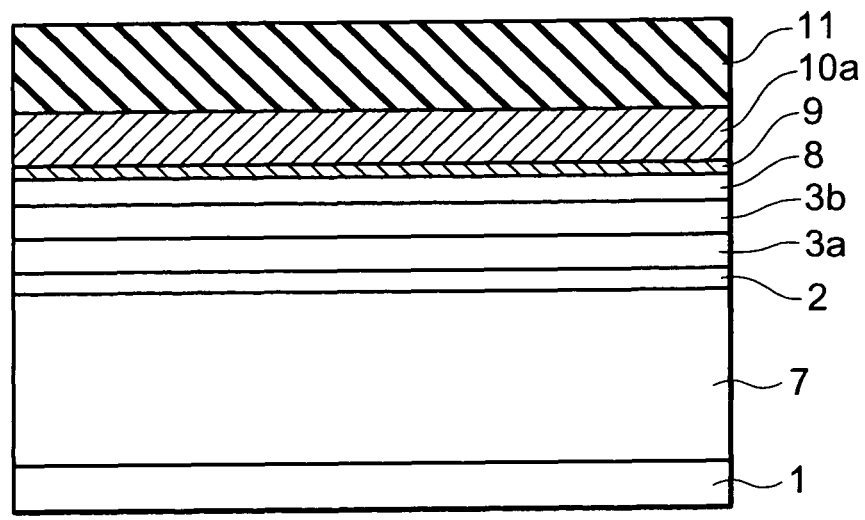
FIG. 21A is a sectional view taken along the line A-A of FIG. 1 illustrating a manufacturing step of the non-volatile semiconductor memory device according to the first embodiment of the present invention.
Figure 21B:
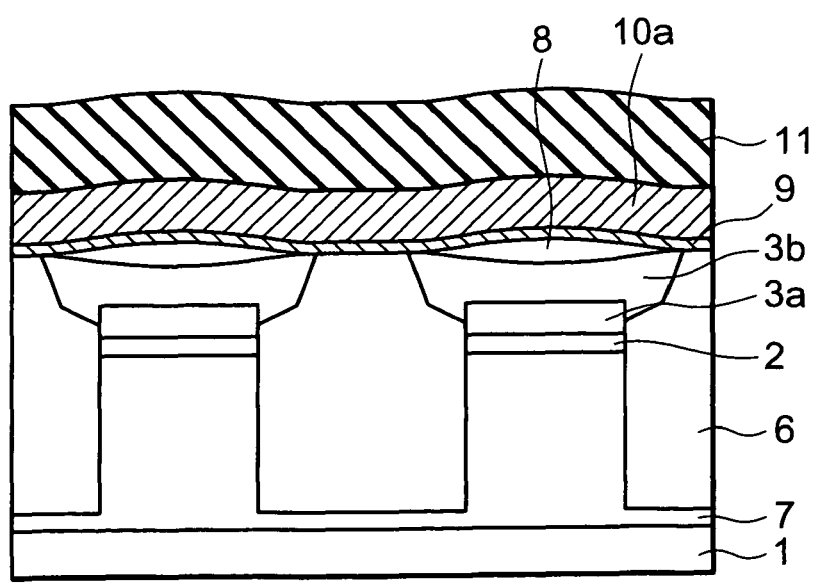
FIG. 21B is a sectional view taken along the line B-B of FIG. 1.

Next, as illustrated in FIG. 21A and FIG. 21B, the nitride film 11 is formed on the entire surface to have a film thickness of about 200 nm to 300 nm.

Figure 22A:
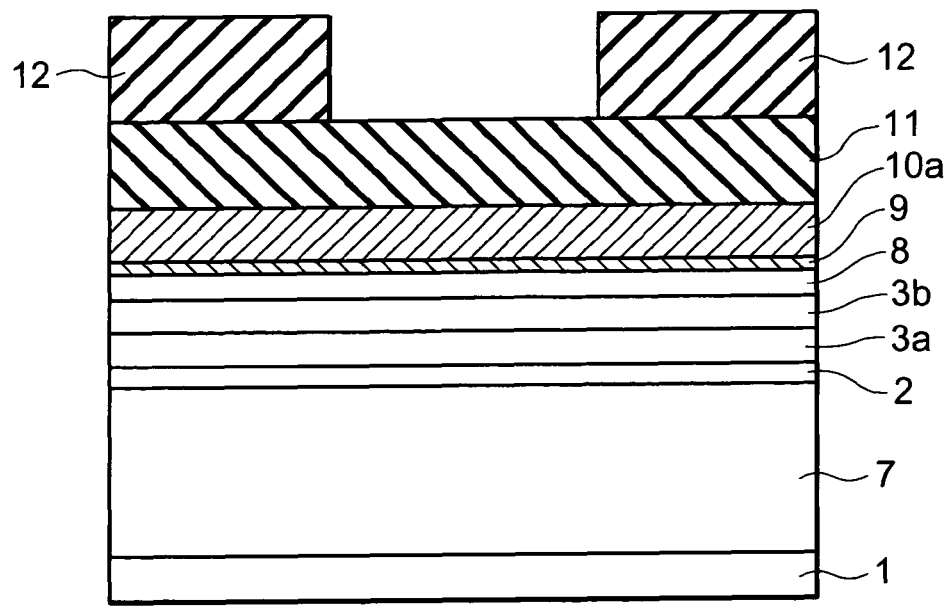
FIG. 22A is a sectional view taken along the line A-A of FIG. 1 illustrating a manufacturing step of the non-volatile semiconductor memory device according to the first embodiment of the present invention.
Figure 22B:
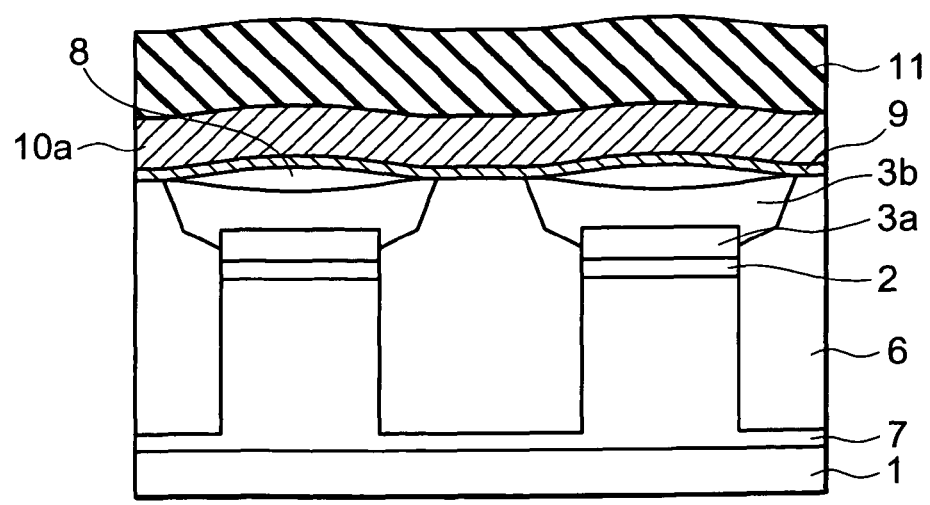
FIG. 22B is a sectional view taken along the line B-B of FIG. 1.

Next, as illustrated in FIG. 22A and FIG. 22B, a second resist mask 12 having an opening in a direction parallel to B-B' is formed.

Figure 23A:
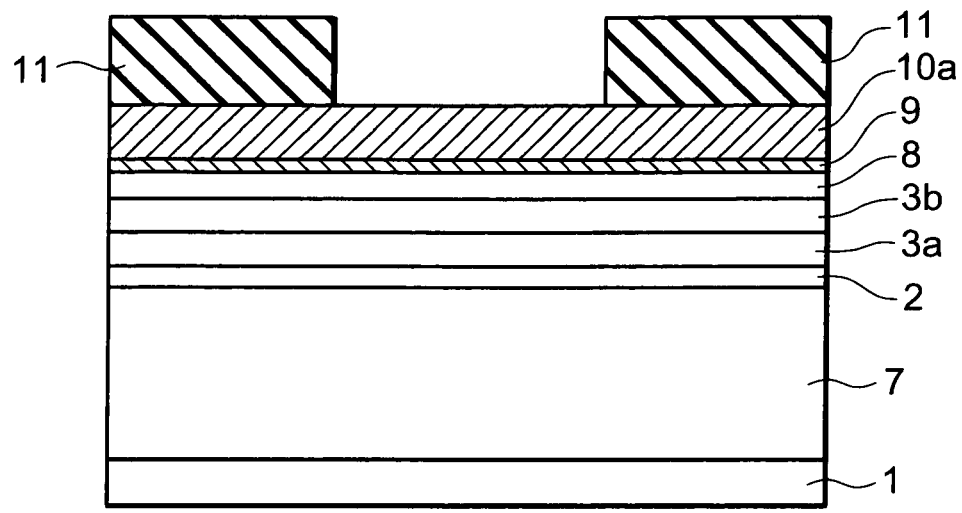
FIG. 23A is a sectional view taken along the line A-A of FIG. 1 illustrating a manufacturing step of the non-volatile semiconductor memory device according to the first embodiment of the present invention.
Figure 23B:
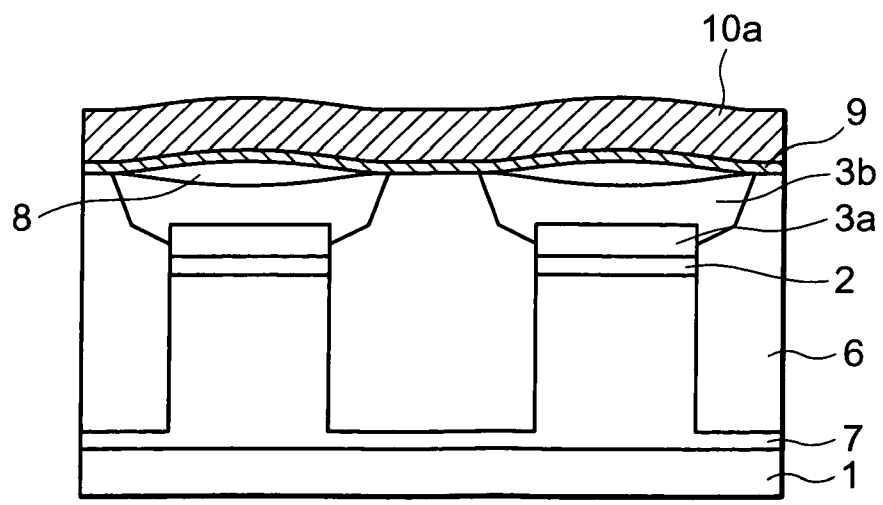
FIG. 23B is a sectional view taken along the line B-B of FIG. 1.

Next, as illustrated in FIG. 23A and FIG. 23B, the nitride film 11 is selectively removed by the anisotropic etching. With this, the nitride film 11 is subjected to patterning so as to have an opening in a direction parallel to B-B'. After that, the second resist mask 12 is peeled off.

Figure 24A:
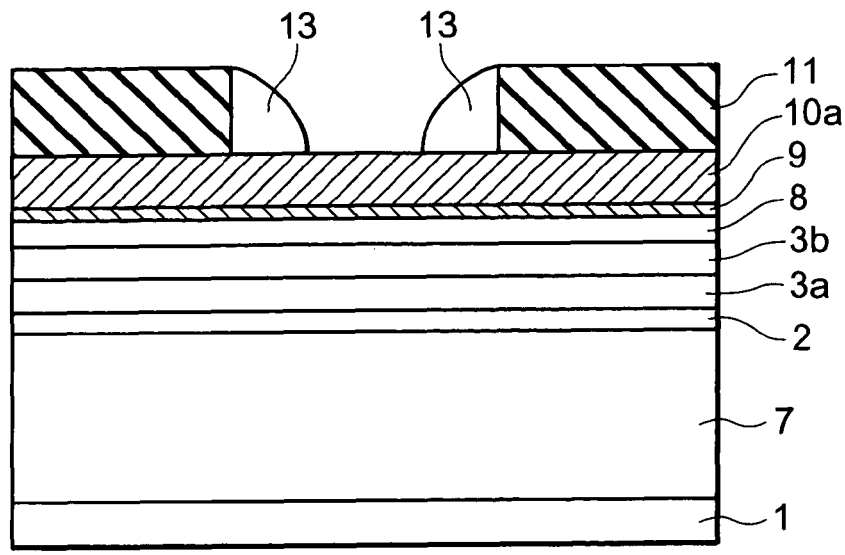
FIG. 24A is a sectional view taken along the line A-A of FIG. 1 illustrating a manufacturing step of the non-volatile semiconductor memory device according to the first embodiment of the present invention.
Figure 24B:
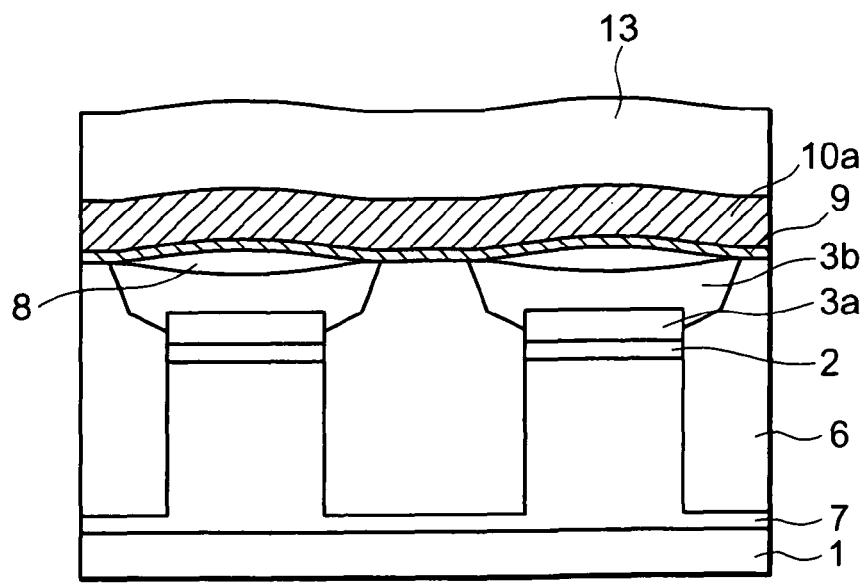
FIG. 24B is a sectional view taken along the line B-B of FIG. 1.

Next, as illustrated in FIG. 24A and FIG. 24B, the oxide film is formed on the entire surface by CVD to have a film thickness of about 150 nm to 200 nm, and the formed oxide film is subjected to etch back to form a first oxide film sidewall spacer 13 at a side surface of the opening of the nitride film 11. The film thickness of the first oxide film sidewall spacer film becomes a factor for deciding a gate length of the floating gate 3.

Figure 25A:
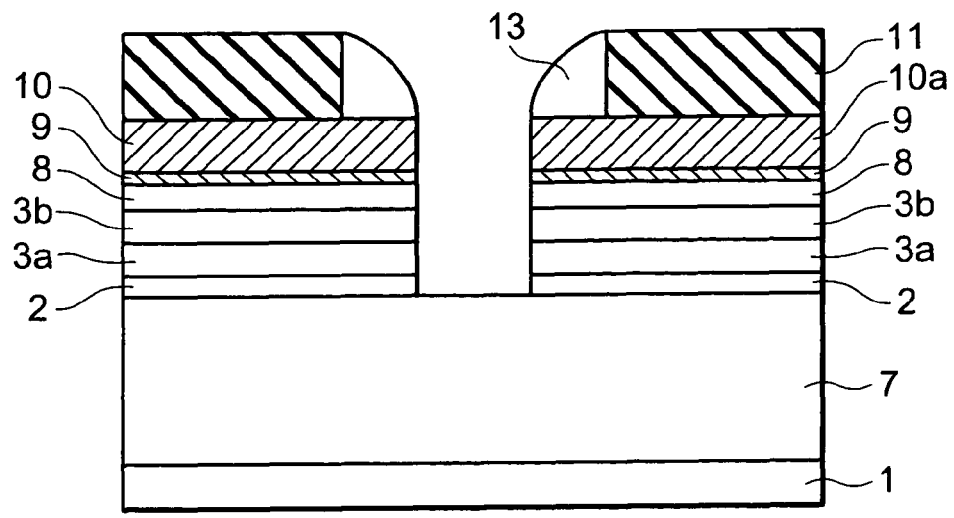
FIG. 25A is a sectional view taken along the line A-A of FIG. 1 illustrating a manufacturing step of the non-volatile semiconductor memory device according to the first embodiment of the present invention.
Figure 25B:
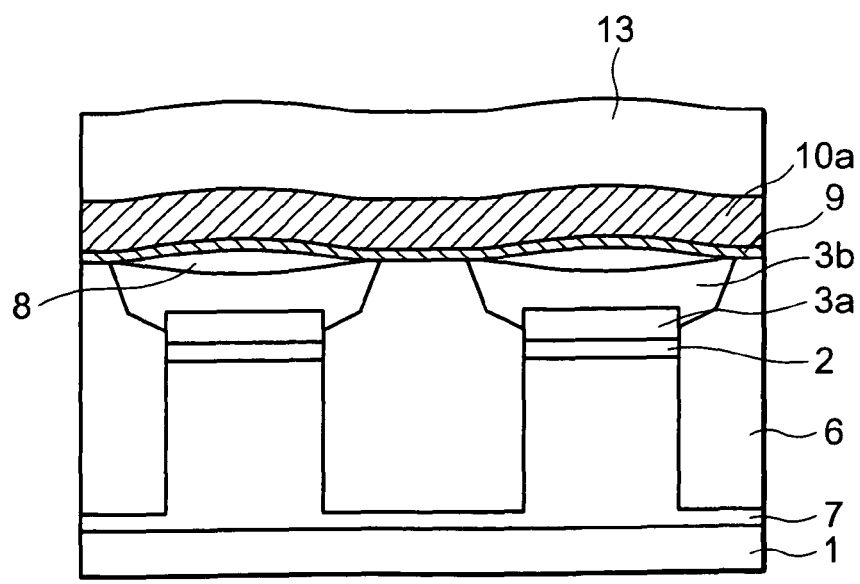
FIG. 25B is a sectional view taken along the line B-B of FIG. 1.

Next, as illustrated in FIG. 25A, the third polysilicon film 10a, the tunnel oxide film 9, the oxide film 8 on the second polysilicon film 3b, the second polysilicon film 3b, the first polysilicon film 3a, and the second gate insulating film 2 are sequentially selectively removed using as the mask the first oxide film sidewall spacer 13 by the anisotropic etching. With this, an opening is formed on the silicon substrate 1 (P-well 7).

Figure 26A:
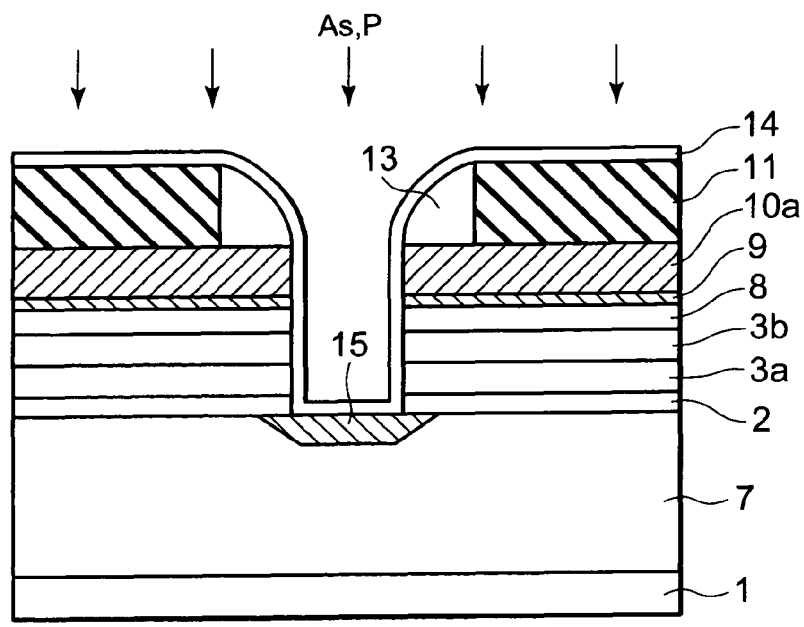
FIG. 26A is a sectional view taken along the line A-A of FIG. 1 illustrating a manufacturing step of the non-volatile semiconductor memory device according to the first embodiment of the present invention.
Figure 26B:
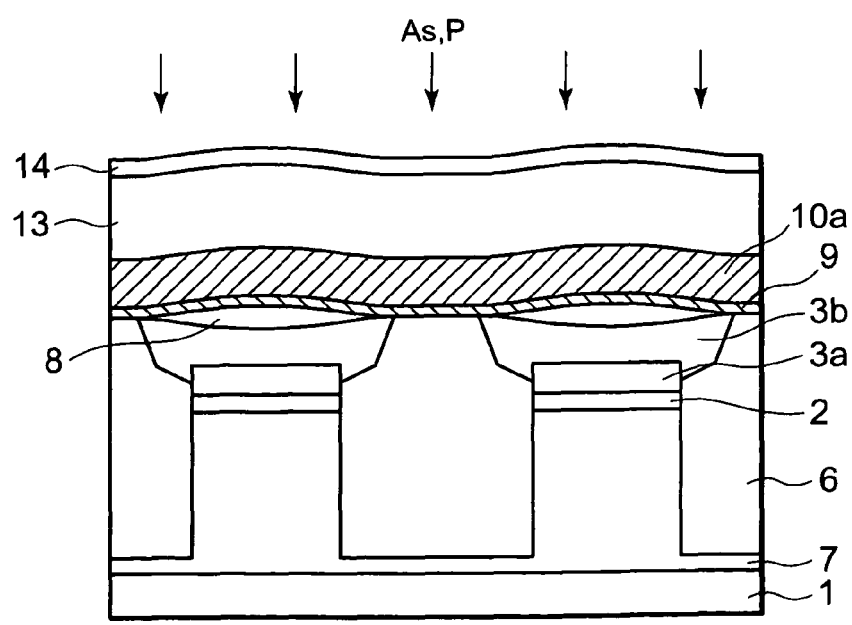
FIG. 26B is a sectional view taken along the line B-B of FIG. 1.

Next, as illustrated in FIG. 26A and FIG. 26B, an oxide film 14 is formed on the entire surface to have a film thickness of about 10 nm to 20 nm. Subsequently, after the ion injection of the n-type impurity, activation is performed by heat treatment at about 1,000° C. under a nitrogen atmosphere. With this, the first source/drain diffusion layer 15 is formed in the silicon substrate 1 (P-well 7) at a position corresponding to the opening. The ion injection is carried out by, for example, injecting arsenic (As) at an injection energy of 40 keV and a dose amount of $1.0 \times 10^{14}$ cm$^{-2}$, and further injecting phosphorus (P) at an injection energy of 30 keV and a dose amount of $1.0 \times 10^{14}$ cm$^{-2}$. Note that, a part of the first source/drain diffusion layer 15 digs under the first gate oxide film 2, namely, the first source/drain diffusion layer 15 is formed so as to overlap with the first polysilicon film 3a and the second polysilicon film 3b.

Figure 27A:
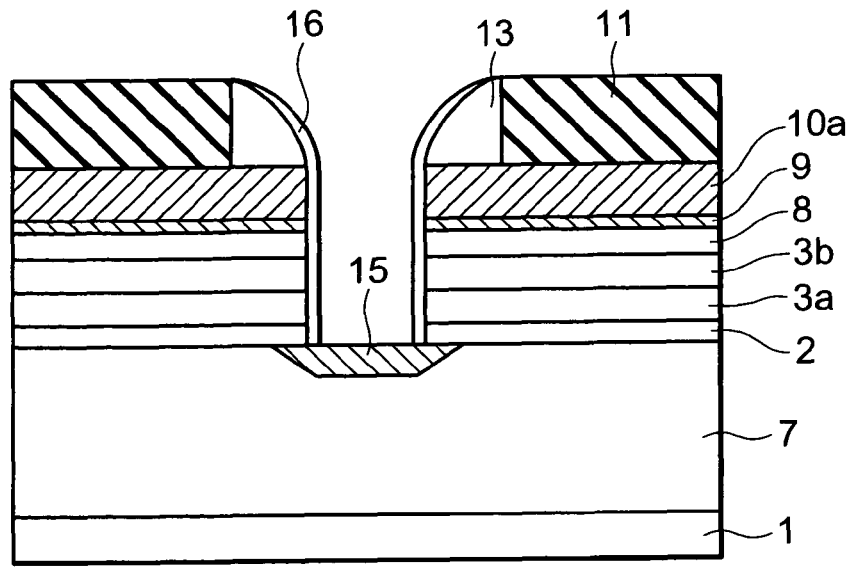
FIG. 27A is a sectional view taken along the line A-A of FIG. 1 illustrating a manufacturing step of the non-volatile semiconductor memory device according to the first embodiment of the present invention.
Figure 27B:
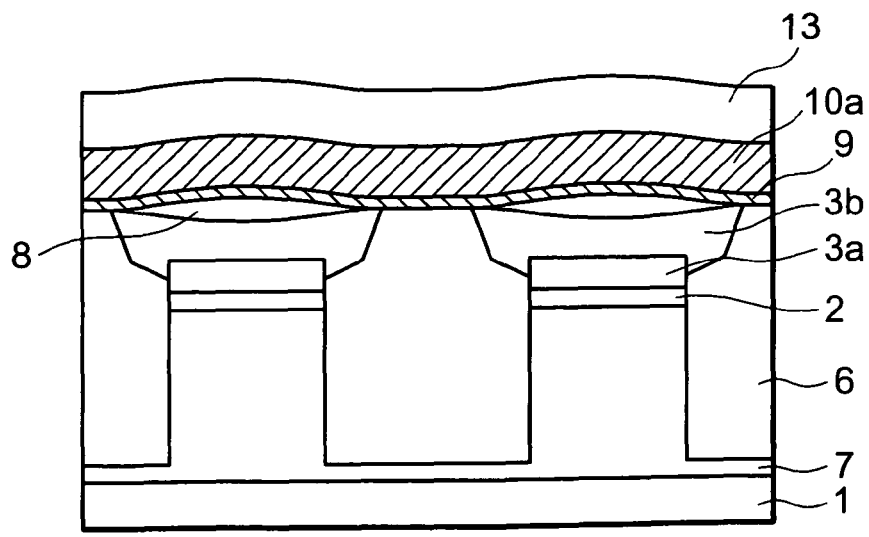
FIG. 27B is a sectional view taken along the line B-B of FIG. 1.

Next, as illustrated in FIG. 27A and FIG. 27B, the oxide film 14 is subjected to etch back through the anisotropic etching. With this, the sidewall of the opening above the first source/drain-diffusion layer 15, namely, the sidewalls of the first oxide film sidewall spacer 13, the third polysilicon film 10a, the tunnel oxide film 9, the oxide film 8 on the second polysilicon film 3b, the second polysilicon film 3b, the first polysilicon film 3a, and the second gate insulating film 2 are covered with the second oxide film sidewall spacer 16 to be formed.

Figure 28A:
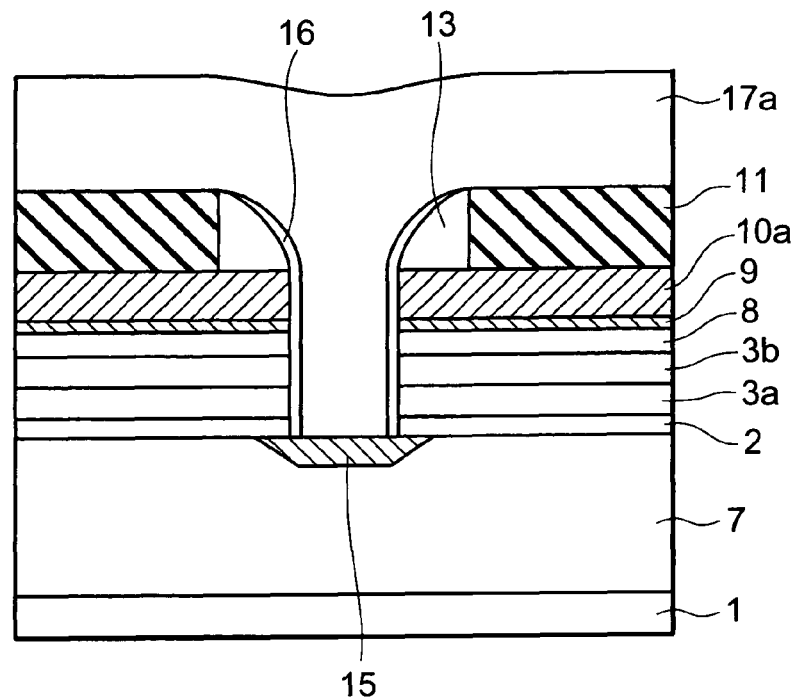
FIG. 28A is a sectional view taken along the line A-A of FIG. 1 illustrating a manufacturing step of the non-volatile semiconductor memory device according to the first embodiment of the present invention.
Figure 28B:
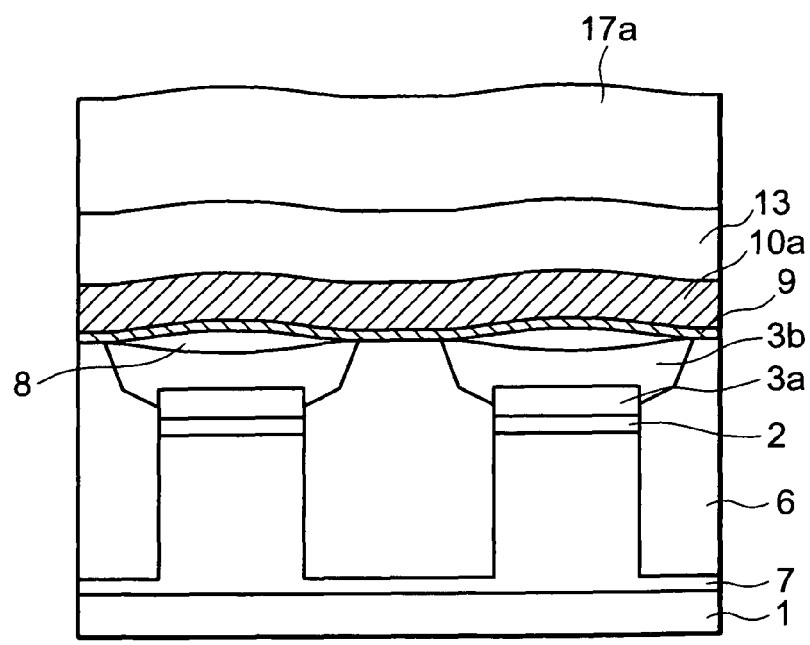
FIG. 28B is a sectional view taken along the line B-B of FIG. 1.

Next, as illustrated in FIG. 28A and FIG. 28B, the fourth polysilicon film (conductive film) 17a for a plug, to which phosphorus of about $1.0 \times 10^{19}$ cm$^{-2}$ to $5.0 \times 10^{20}$ cm$^{-2}$ is doped, is formed to have a film thickness of 500 nm to 600 nm to bury the opening above the first source/drain diffusion layer 15. Alternatively, after formation of a non-doped polysilicon film having a film thickness of about 500 nm to 600 nm, a fourth polysilicon film 17a may be formed by, for example, injecting phosphorus (P) at an injection energy of 50 keV and a dose amount of $3.0 \times 10^{15}$ cm$^{-2}$, and by activating through heat treatment at about 800° C. to 900° C. Note that, the fourth polysilicon film 17a finally forms the plug 17 connected to the first source/drain diffusion layer 15.

Figure 29A:
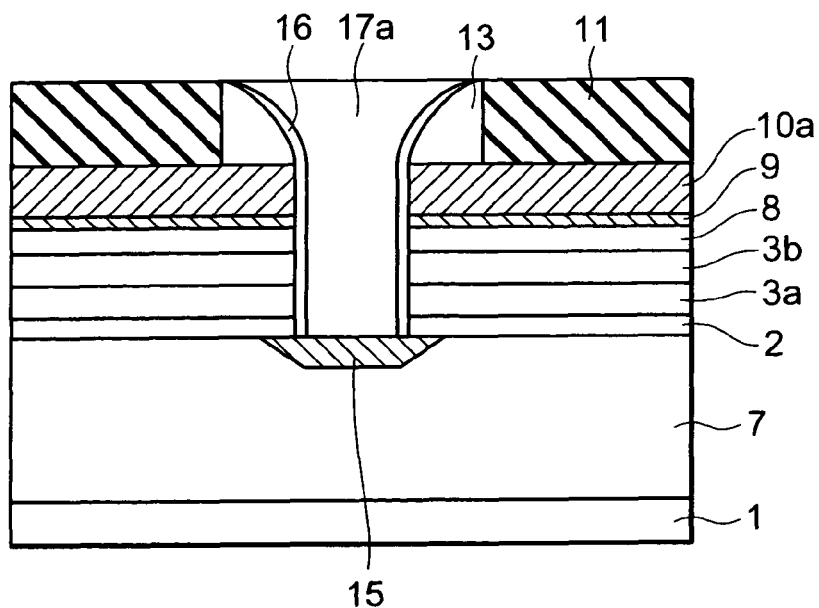
FIG. 29A is a sectional view taken along the line A-A of FIG. 1 illustrating a manufacturing step of the non-volatile semiconductor memory device according to the first embodiment of the present invention.
Figure 29B:
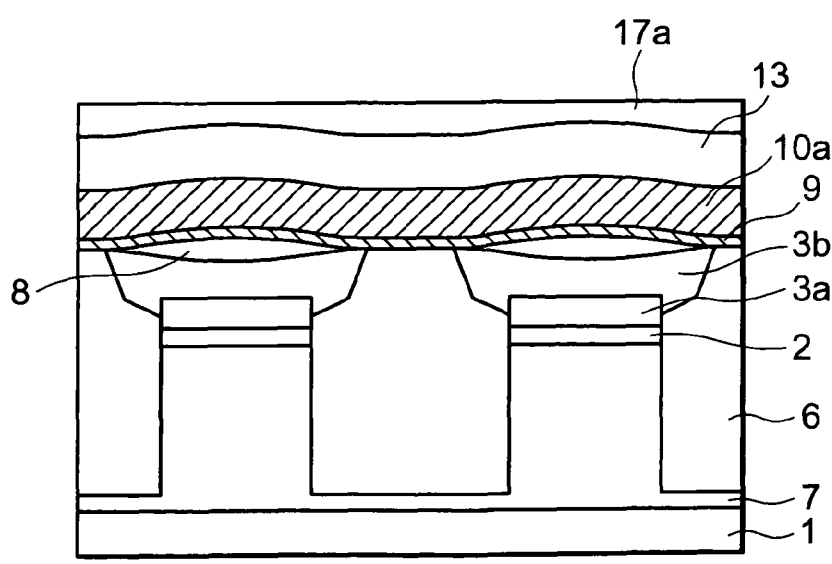
FIG. 29B is a sectional view taken along the line B-B of FIG. 1.

Next, as illustrated in FIGS. 29A and 29B, the fourth polysilicon film 17a is planarized using a CMP technique to have the same height (to expose surface of nitride film 11) with the upper surface of the nitride film 11.

Figure 30A:
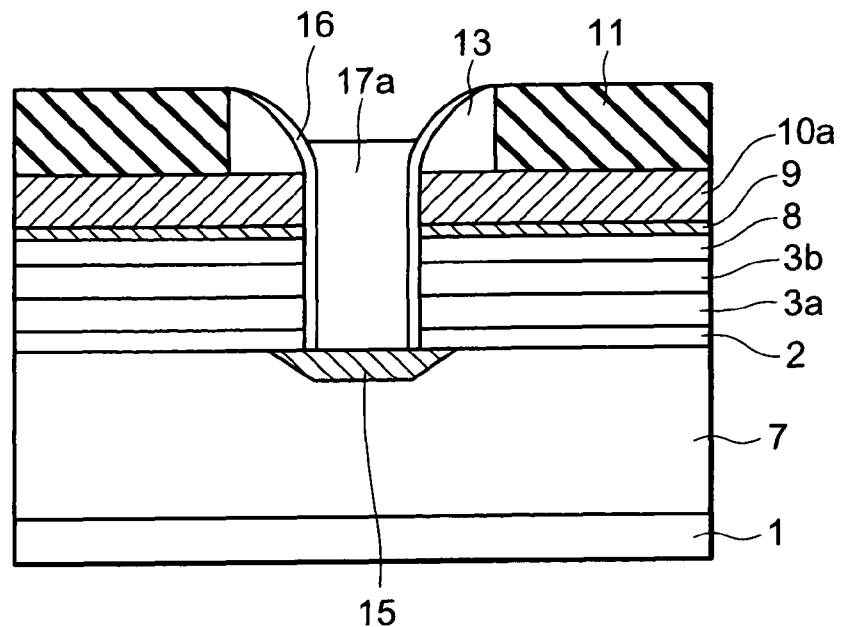
FIG. 30A is a sectional view taken along the line A-A of FIG. 1 illustrating a manufacturing step of the non-volatile semiconductor memory device according to the first embodiment of the present invention.
Figure 30B:
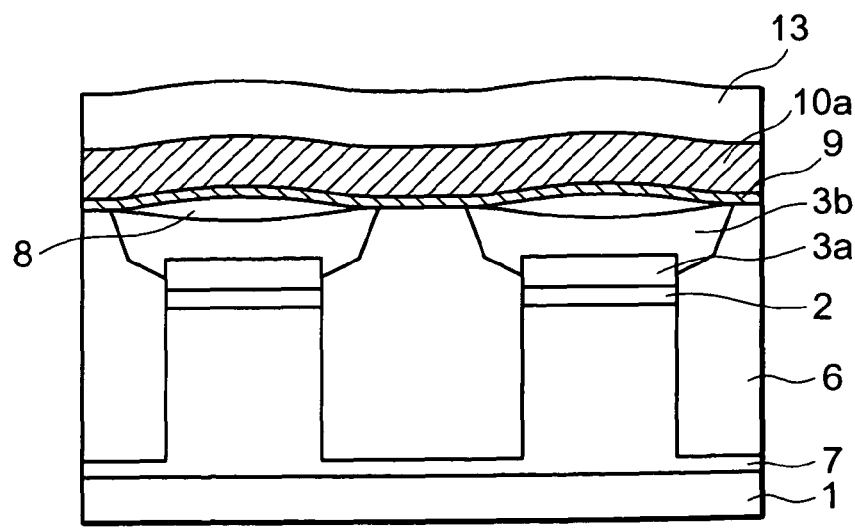
FIG. 30B is a sectional view taken along the line B-B of FIG. 1.

Next, as illustrated in FIG. 30A and FIG. 30B, the upper surface of the fourth polysilicon film 17a is subjected to etching so that the upper surface of the fourth polysilicon film 17a becomes above the upper surface of the third polysilicon film 10a at about 30 nm to 50 nm, to thereby lower the height of the fourth polysilicon film 17a.

Figure 31A:
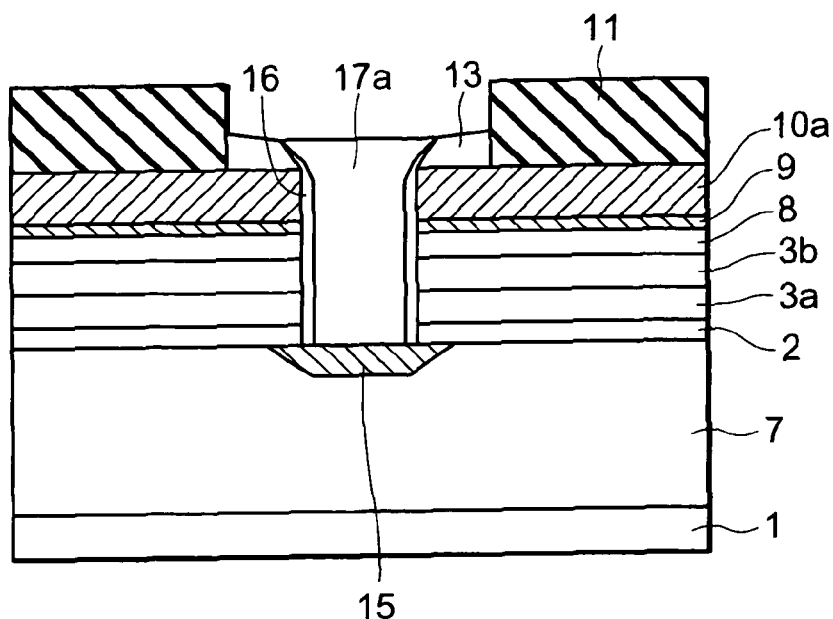
FIG. 31A is a sectional view taken along the line A-A of FIG. 1 illustrating a manufacturing step of the non-volatile semiconductor memory device according to the first embodiment of the present invention.
Figure 31B:
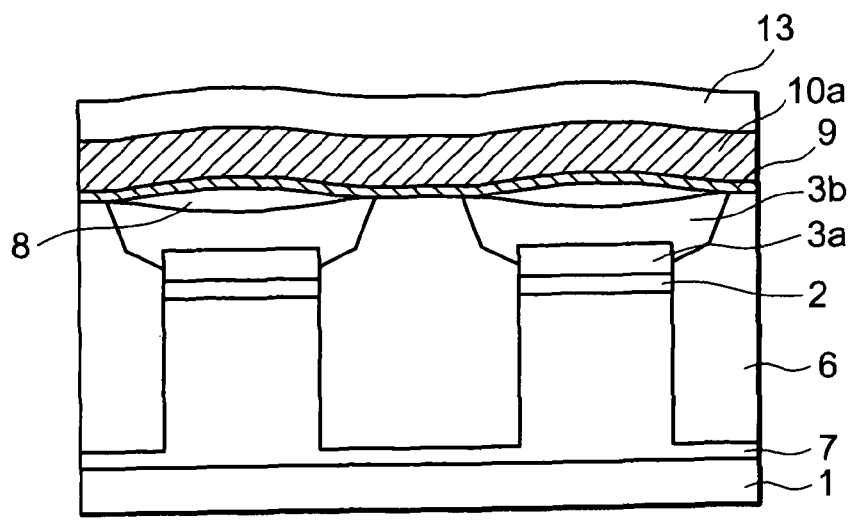
FIG. 31B is a sectional view taken along the line B-B of FIG. 1.

Next, as illustrated in FIGS. 31A and 31B, the upper surface of the first oxide film sidewall spacer 13 is subjected to etching so that the height of the first oxide film sidewall spacer 13 becomes the same height with the height of the upper surface of the fourth polysilicon film 17a.

In this case, reasons for adjusting the height of the first oxide film sidewall spacer 13 are as follows. To silicide the upper surface of the erasing gate 10 (third polysilicon film 10a), the first oxide film sidewall spacer 13 existing on the erasing gate 10 (third polysilicon film 10a) must be finally removed. This removing step corresponds to a step illustrated in FIG. 41 described later. However, in the step illustrated in FIG. 41, the other oxide film (second gate insulating film 20 on second source/drain diffusion layer 23 and plug oxide film 18 on plug 17) must be removed at the same time by etching for silicidation. In particular, the second gate insulating film 20 is extremely thin compared with the film thickness of the first oxide film sidewall spacer 13. When attempting removal by etching to a plurality of the oxide films having different film thicknesses at the same time, the oxide film having a thinner film thickness is first removed to expose an underlayer thereof. Specifically, the underlayer suffers much damage caused by over-etching as an etching period becomes longer. In the step illustrated in FIG. 41, the underlayer of the second gate insulating film 20 to be a subject of etching is the second source/drain diffusion layer 23, and the second source/drain diffusion layer 23 suffers the damage as the etching period becomes longer. Therefore, in the step illustrated in FIG. 41, to reduce the damage which the second source/drain diffusion layer 23 suffers as small as possible, in this etching step, the height of the first oxide film sidewall spacer 13 is made to be low (film thickness is made thin) in order to make the film thickness of the first oxide film sidewall spacer 13 closer as much as possible with the film thickness of the second gate insulating film 20.

Further, it may be considered to initially form the first oxide film sidewall spacer 13 to a desired height in the step illustrated in FIG. 24 in place of adjusting the height of the first oxide film sidewall spacer 13 to the desired height by the step illustrated in FIG. 31. However, as illustrated in the step of FIG. 35 described later, it is found that a gate length of the floating gate 3 is determined based on a width of the first oxide film sidewall spacer 13. The first oxide film sidewall spacer 13 is formed as the sidewall of the nitride film 11, and hence the first oxide film sidewall spacer 13 is influenced with the film thickness of the nitride film 11. Specifically, in order to obtain the desired gate length of the floating gate 3, the corresponding film thickness (height) becomes necessary, and hence it is impossible to make the film thickness of the first oxide film sidewall spacer 13 to be thin (low) from the beginning.

Figure 32A:
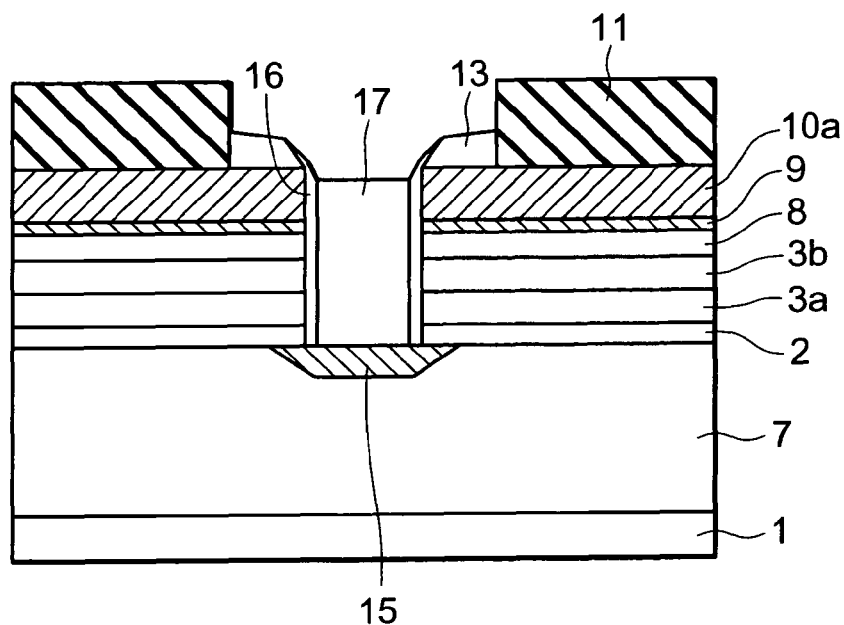
FIG. 32A is a sectional view taken along the line A-A of FIG. 1 illustrating a manufacturing step of the non-volatile semiconductor memory device according to the first embodiment of the present invention.

Next, as illustrated in FIG. 32A, the upper surface of the fourth polysilicon film 17a is subjected to etching so that the upper surface of the fourth-polysilicon film 17a becomes below the upper surface of the third polysilicon film 10a at about 30 nm to 50 nm, to thereby lower the height of the fourth polysilicon film 17a. With this, the plug 17 connected to the first source/drain diffusion layer 15 is completed. The upper surfaces of the erasing gate 10 and the plug 17 are subjected to the silicidation to lower the resistance thereof in a step described later. At the time of silicidation, if the upper surface of the erasing gate 10 and the upper surface of the plug 17 are too close with each other, the silicide films formed on the respective upper surfaces may unfavorably connect with each other during silicidation reaction process (cause silicide short). Therefore, in this step, there is provided an etching step for making the upper surface of the plug 17 below the upper surface of the third polysilicon film 10a (upper surface of plug 17 is the same or lower of third polysilicon film 10a).

Note that, in a sense of preventing the silicide short, it may be preferred that the upper surface of the plug 17 be positioned below the third polysilicon film 10a as low as possible. However, there is provided later a step of forming the fourth oxide film sidewall spacer 24 at the sidewall of the control gate 22 (step of FIG. 41). However, at this occasion, if the plug 17 is too low, the oxide film is unfavorably formed at the sidewall of the second oxide film sidewall spacer 16 on the upper surface of both ends of the plug 17, resulting in narrowing the upper surface of the plug 17 (in extreme case, upper surface of plug 17 is completely buried with oxide film). If the oxide film is formed on the upper surface of the plug 17, the area of the upper surface of the plug 17, where the silicidation may be carried out, is reduced. As a result, there is a fear of being not possible to lower the resistance sufficiently even if the silicidation is performed. For that reason, it is preferred that the upper surface of the plug 17 not be too low.

Figure 32B:
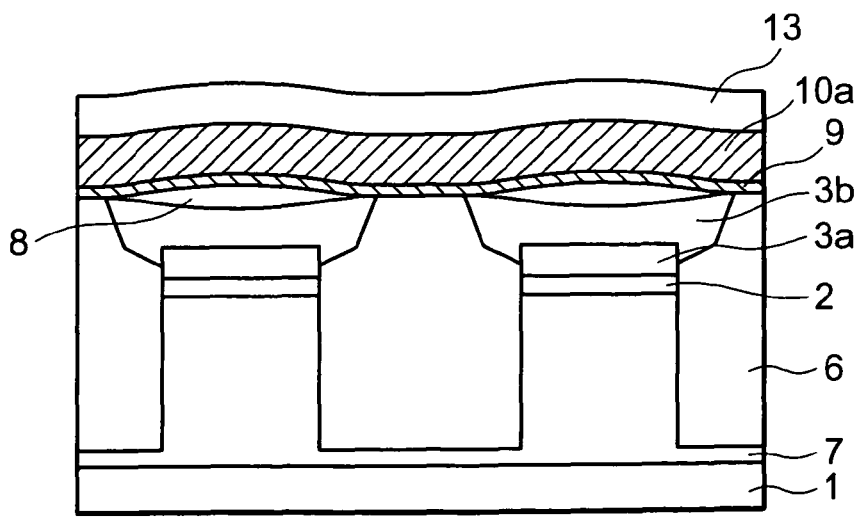
FIG. 32B is a sectional view taken along the line B-B of FIG. 1.

Further, before conducting, in a step illustrated in FIG. 32, the etching of the upper surface of the plug 17 so that the upper surface of the plug 17 becomes below the upper surface of the third polysilicon film 10a, in the step illustrated in FIG. 30, the upper surface of the plug 17 is subjected to etching to a position that is above the upper surface of the third polysilicon film 10a about 30 nm to 50 nm. Specifically, in the present invention, the etching is conducted at two-stage steps to the upper surface of the plug 17. The reason resides in that, in the step illustrated in FIG. 30, if the etching of the plug 17 is carried out in one step so that the height of the upper surface of the plug 17 becomes below the upper surface of the third polysilicon film 10a, the etching with respect to the upper portion of the second oxide film sidewall spacer 16 proceeds at the same time in the step (step of FIG. 31) of etching the upper surface of the first oxide film sidewall spacer 13 which is performed later. If the upper surface of the second oxide film sidewall spacer 16 is completely removed, a part of the third polysilicon film 10a is exposed. For that reason, it is preferred that the upper surface of the plug 17 be not lowered too much, namely, the etching with respect to the upper surface of the first oxide film sidewall spacer 13 be carried out, while keeping a state in which the upper portion of the second oxide film sidewall spacer 16 is covered with the upper portion of the plug 17 to some extent. In particular, the upper portion of the second oxide film sidewall spacer 16 has a taper shape, and hence an attention must be paid to this. Note that, how extent the film thickness of the first oxide film sidewall spacer 13 may be made thinner depends on the shape of a sidewall inclined surface of the first oxide film sidewall spacer 13 and the shape of the upper portion of the second oxide film sidewall spacer 16.

Figure 33A:
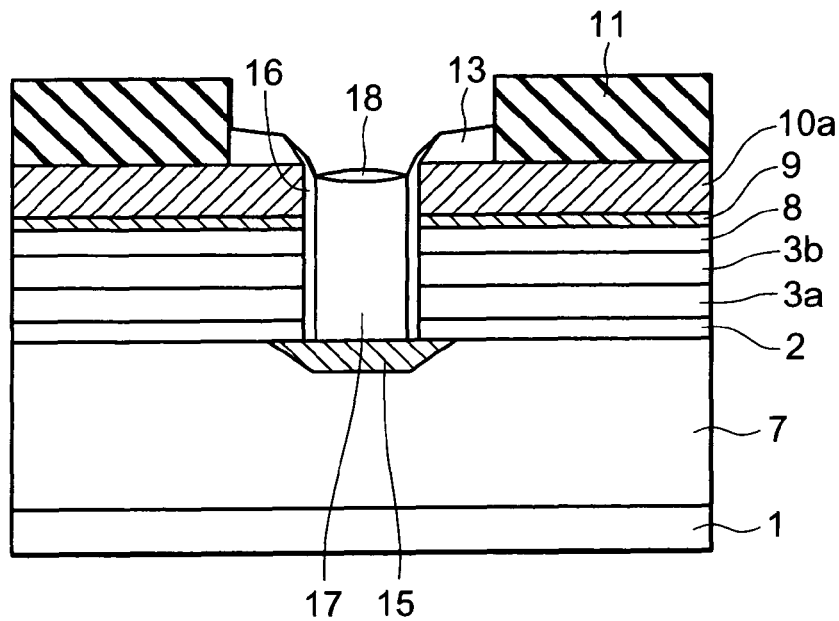
FIG. 33A is a sectional view taken along the line A-A of FIG. 1 illustrating a manufacturing step of the non-volatile semiconductor memory device according to the first embodiment of the present invention.
Figure 33B:
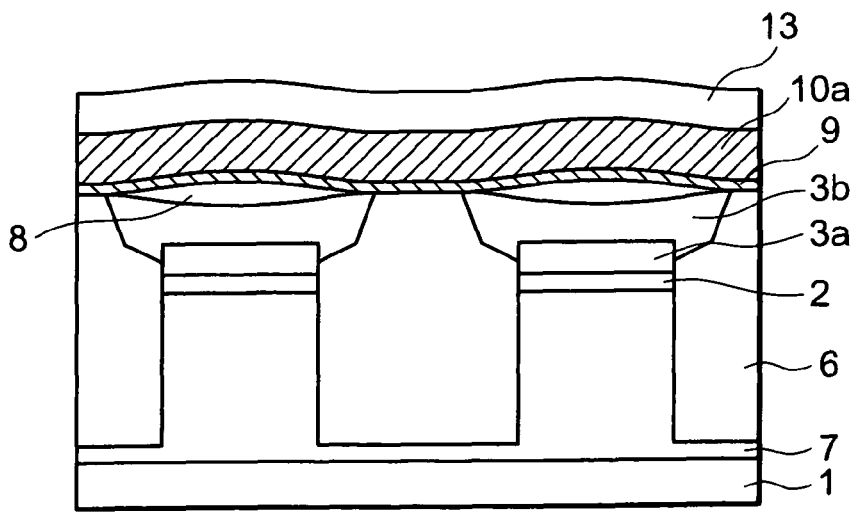
FIG. 33B is a sectional view taken along the line B-B of FIG. 1.

Next, as illustrated in FIG. 33A, by conducting thermal oxidation at 800° C. to 900° C., a plug oxide film 18 is formed on the upper surface of the plug 17 to have a film thickness of 20 nm to 50 nm. Note that, the plug oxide film 18 hinders the silicidation of the upper portion of the plug 17, and hence the plug oxide film 18 is finally removed by etching. In a step illustrated in FIG. 41 described later, the film thickness of the plug oxide film 18 is formed by adjusting so that the plug oxide film 18 may be removed by etching at the same time with the first oxide film sidewall spacer 13.

Figure 34A:
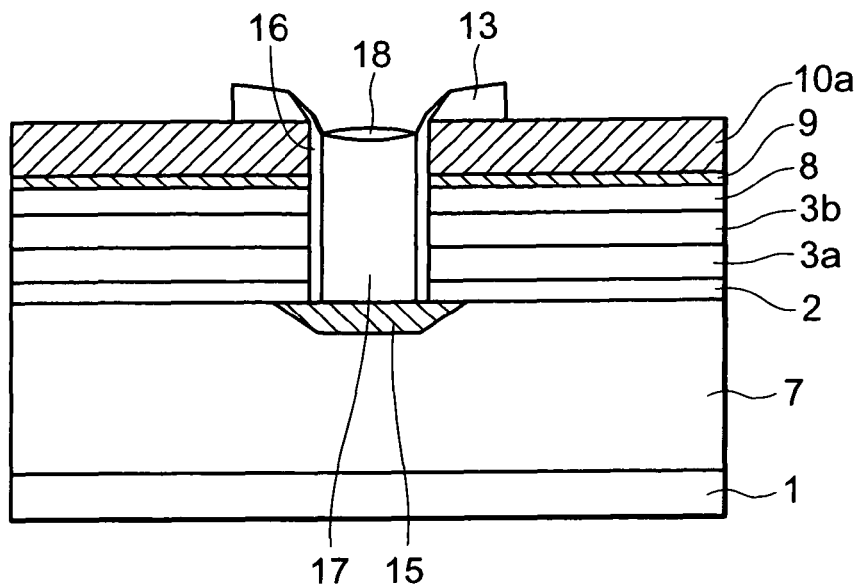
FIG. 34A is a sectional view taken along the line A-A of FIG. 1 illustrating a manufacturing step of the non-volatile semiconductor memory device according to the first embodiment of the present invention.
Figure 34B:
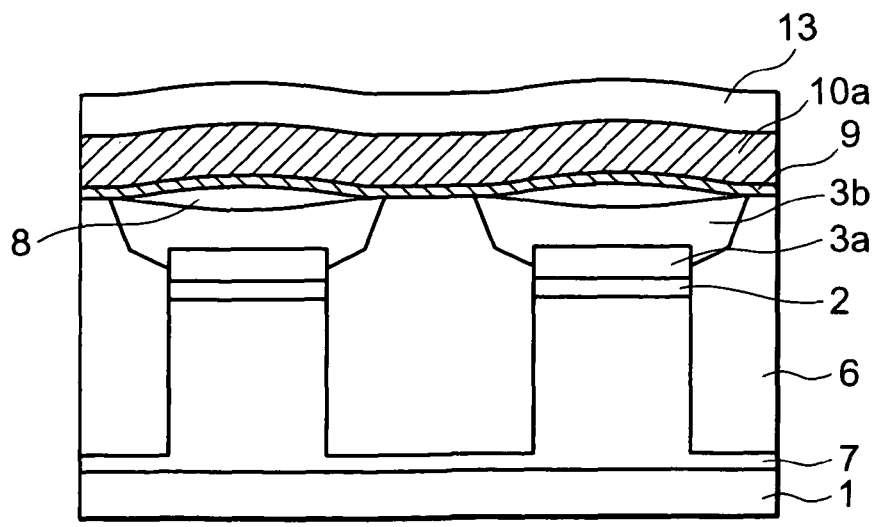
FIG. 34B is a sectional view taken along the line B-B of FIG. 1.

Next, as illustrated in FIG. 34A, the nitride film 11 is removed by immersing into a phosphate solution of about 140° C. to 160° C. for about 60 minutes to 100 minutes.

Figure 35A:
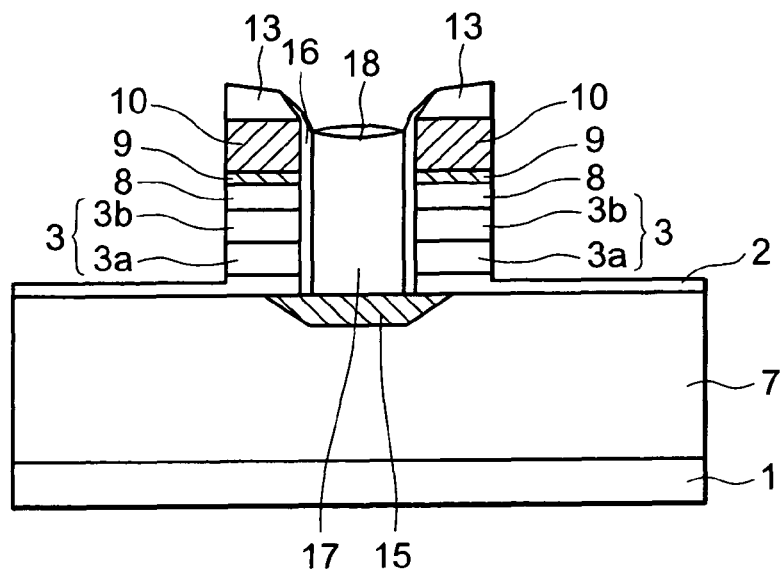
FIG. 35A is a sectional view taken along the line A-A of FIG. 1 illustrating a manufacturing step of the non-volatile semiconductor memory device according to the first embodiment of the present invention.
Figure 35B:
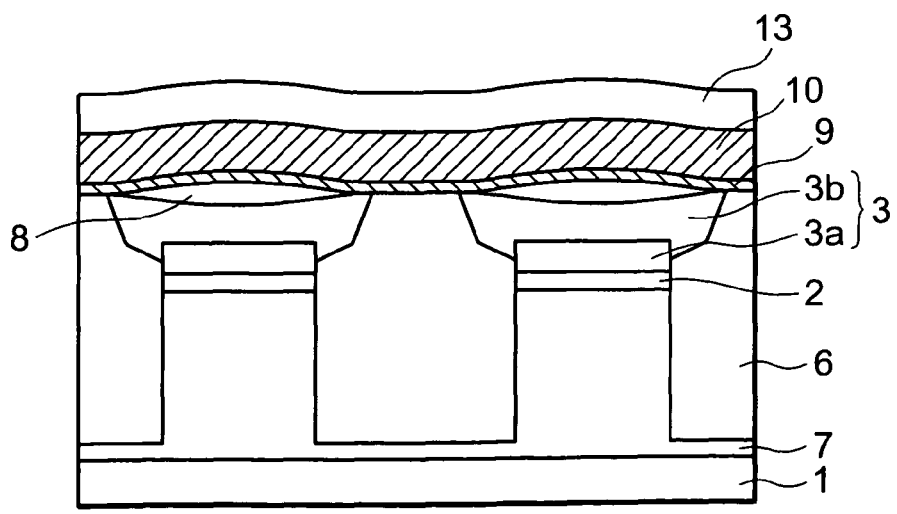
FIG. 35B is a sectional view taken along the line B-B of FIG. 1.

Next, as illustrated in FIG. 35A, the third polysilicon film 10a, the tunnel oxide film 9, the oxide film 8 on the second polysilicon film 3b, the second polysilicon film 3b, and the first polysilicon film 3a are sequentially selectively removed by using as the mask the first oxide film sidewall spacer 13, the second oxide film sidewall spacer 16, and the plug oxide film 18 by the anisotropic dry etching. At this time, the film thickness of the exposed area of the first gate oxide film 2 becomes thinner about 5 mm due to influence of the dry etching. With this, the floating gate 3 formed of the first polysilicon film 3a and the second polysilicon film 3b, and the erasing gate 10 formed of the third polysilicon film 10a are completed.

Figure 36A:
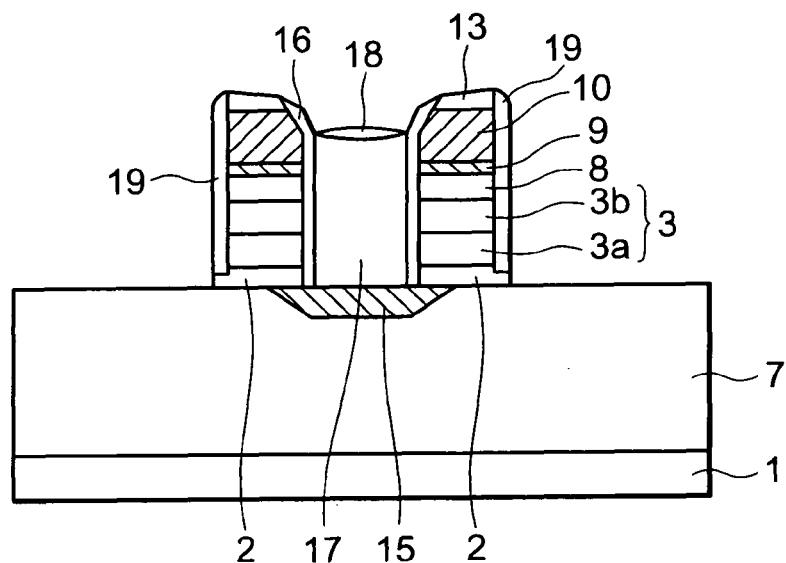
FIG. 36A is a sectional view taken along the line A-A of FIG. 1 illustrating a manufacturing step of the non-volatile semiconductor memory device according to the first embodiment of the present invention.
Figure 36B:
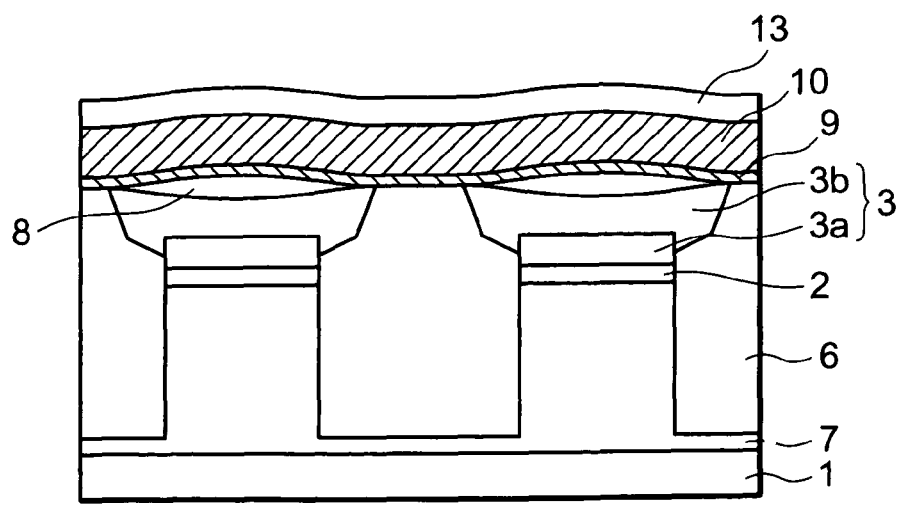
FIG. 36B is a sectional view taken along the line B-B of FIG. 1.

Next, as illustrated in FIG. 36A and FIG. 36B, the oxide film having a film thickness of 20 nm to 30 nm is allowed to grow, and thereafter, the anisotropic dry etching is carried out. With this, the third oxide film sidewall spacer 19 is formed on the sidewalls of the first oxide film sidewall spacer 13, the erasing gate 10, the tunnel oxide film 9, the oxide film 8 on the second polysilicon film 3b, the floating gate 3 (second polysilicon film 3b+first polysilicon film 3a), and the first gate oxide film 2. Note that, in this dry etching, the exposed first gate oxide film 2 having a film thickness of about 5 nm is removed by etching. Further, with this dry etching, the upper surface of the first oxide film sidewall spacer 13 is subjected to etching, and hence the film thickness of the first oxide film sidewall spacer 13 becomes thinner, correspondingly.

Figure 37A:
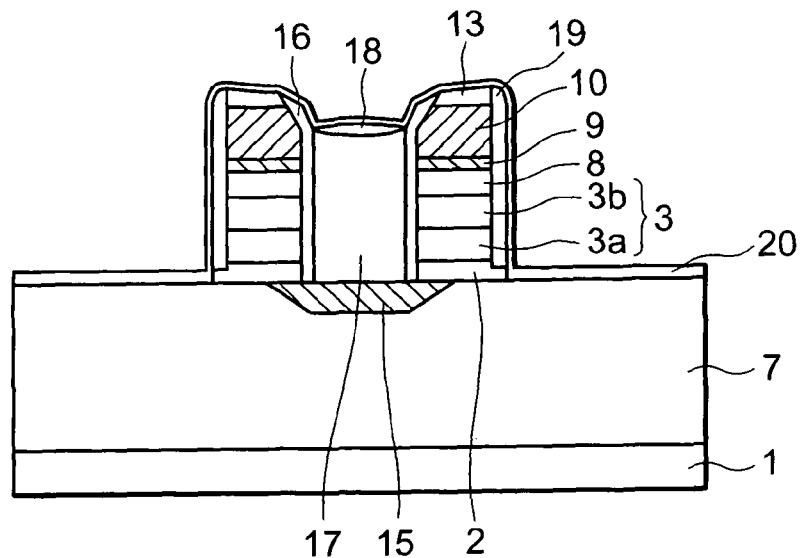
FIG. 37A is a sectional view taken along the line A-A of FIG. 1 illustrating a manufacturing step of the non-volatile semiconductor memory device according to the first embodiment of the present invention.
Figure 37B:
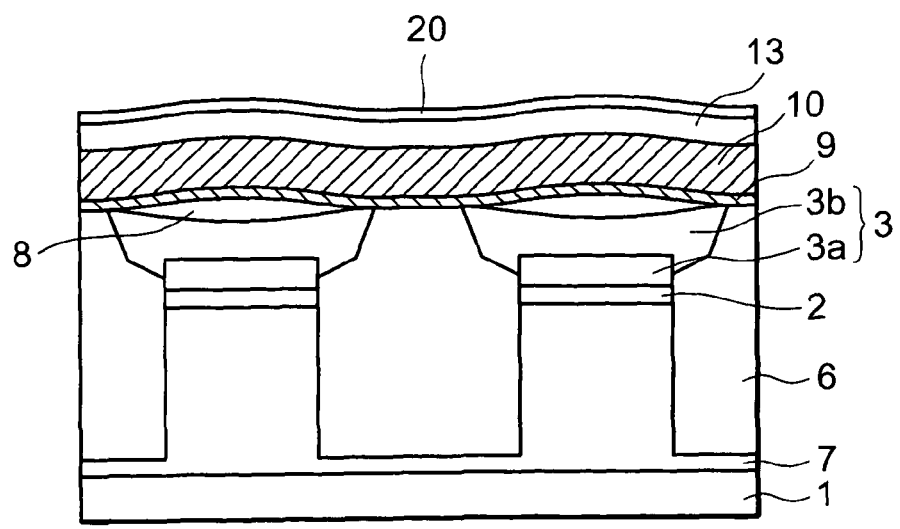
FIG. 37B is a sectional view taken along the line B-B of FIG. 1.

Next, as illustrated in FIG. 37A and FIG. 37B, the second gate insulating film having a film thickness of about 205 nm to 7 nm is formed by CVD. At this time, the second gate insulating film 20 is formed, in addition to an area where the silicon substrate 1 (P-well 7) is exposed, at a sidewall of the third oxide film sidewall spacer 19. As a result, two-layer oxide film (third oxide film sidewall spacer 19+second gate insulating film 20) is formed at the sidewalls of the first oxide film sidewall spacer 13, the erasing gate 10, the tunnel oxide film 9, the oxide film 8 on the third polysilicon film 3b, the floating gate 3 (second polysilicon film 3b+first polysilicon film 3a), and the first gate oxide film 2. Subsequently, anneal treatment may be performed at about 1,000° C. under an oxygen atmosphere or a nitrogen atmosphere, or an under oxygen and nitrogen mixed atmosphere. Further, by conducting thermal oxidation at 800° C. to 900° C., the thermal oxide film having a film thickness of about 5 nm to 7 nm may be formed on the silicon substrate 1 (P-well 7). In this case, too, the oxide film is formed at the sidewall of the third oxide film sidewall spacer 19.

Figure 38A:
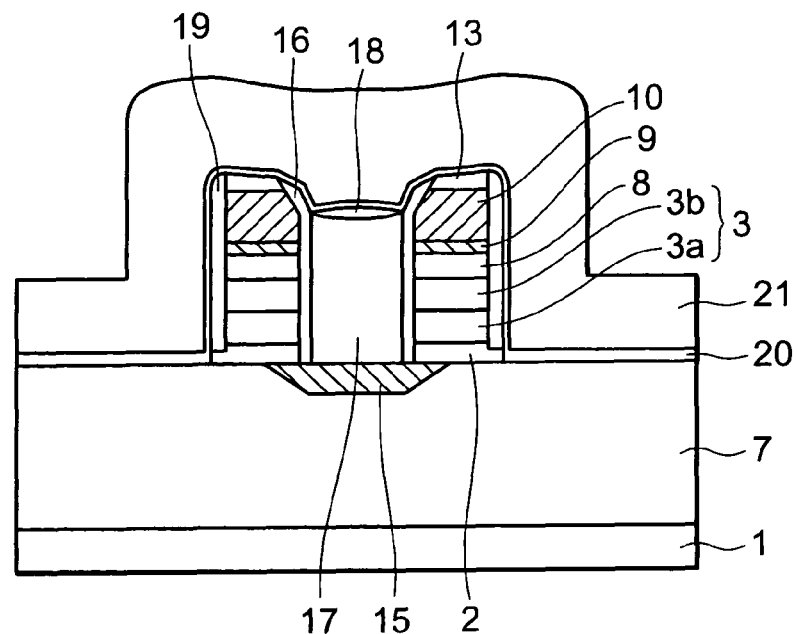
FIG. 38A is a sectional view taken along the line A-A of FIG. 1 illustrating a manufacturing step of the non-volatile semiconductor memory device according to the first embodiment of the present invention.
Figure 38B:
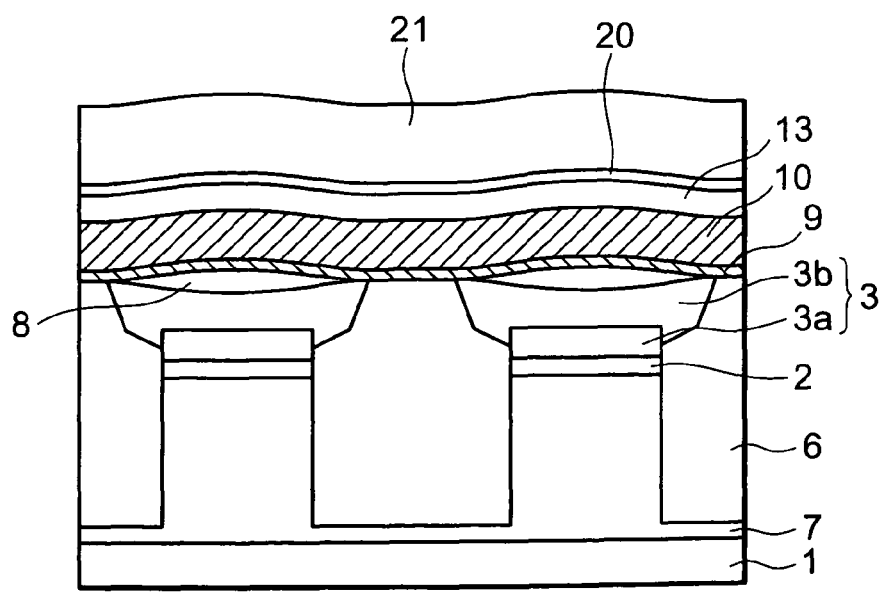
FIG. 38B is a sectional view taken along the line B-B of FIG. 1.

Next, as illustrated in FIG. 38A and FIG. 38B, the phosphorus doped fifth polysilicon film (conductive film) 21 is formed into about 200 nm to 300 nm.

Figure 39A:
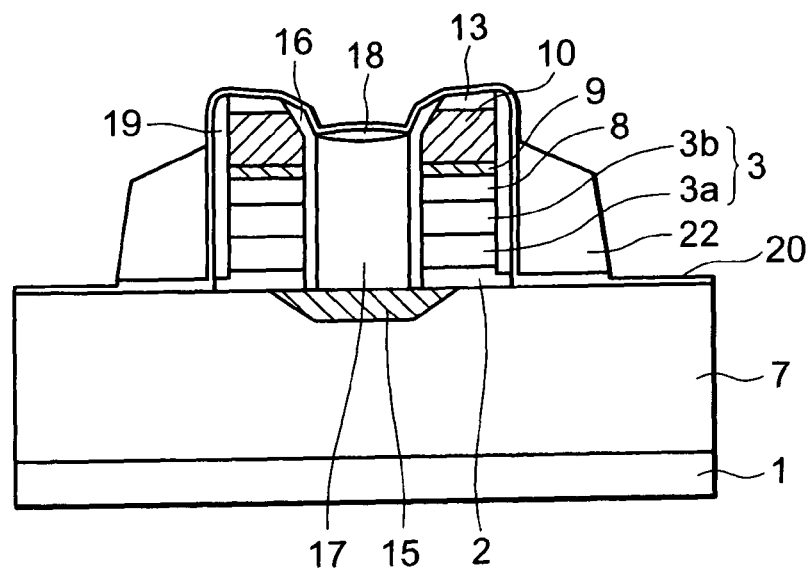
FIG. 39A is a sectional view taken along the line A-A of FIG. 1 illustrating a manufacturing step of the non-volatile semiconductor memory device according to the first embodiment of the present invention.
Figure 39B:
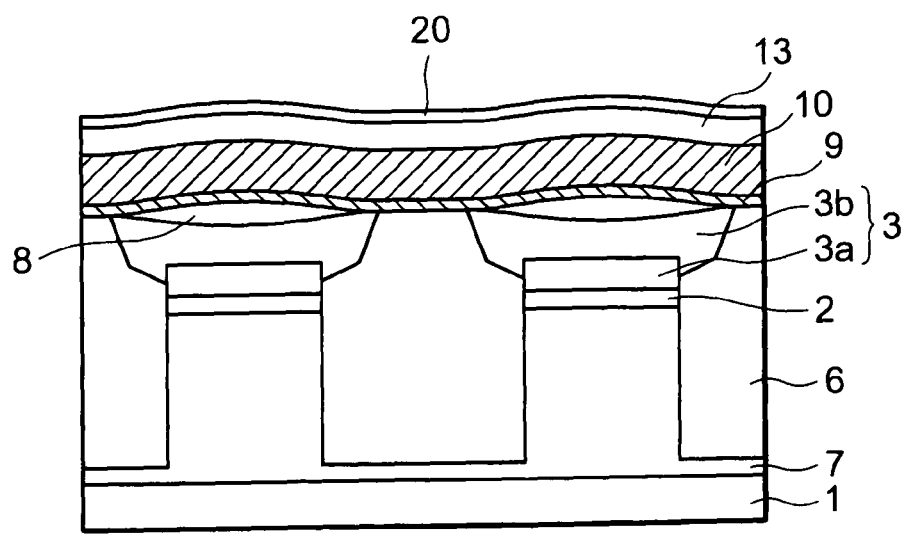
FIG. 39B is a sectional view taken along the line B-B of FIG. 1.

Next, as illustrated in FIG. 39A and FIG. 39B, a fifth polysilicon film 21 is subjected to etch back, and the control gate 22 is formed on the sidewalls of the erasing gate 10, the tunnel oxide film 9, the oxide film 8 on the third polysilicon film 3b, the floating gate 3 (second polysilicon film 3b+first polysilicon film 3a), and the first gate oxide film 2. Further, with this dry etching, the second gate insulating film 20 exposed to an area adjacent to the control gate 22 remains to have a film thickness of about 2 nm to 4 nm.

In the present invention, the upper surface of the control gate 22 is formed so as to be below the upper surface of the erasing gate 10. In a step illustrated in FIG. 44 described later, both upper surfaces of the control gate 22 and the erasing gate 10 are subjected to silicidation. However, at the silicidation, there is a fear of causing the coupling of the silicide films with each other (cause silicide short), if the control gate 22 and the erasing gate 10 are too close with each other. For that reason, the upper surface of the control gate 22 is adjusted to be positioned below the upper surface of the erasing gate 10 (upper surface of control gate 22 is made the same or lower of upper surface of the erasing gate 10) to form the control gate 22.

Note that, in a sense of preventing the silicide short, it may be preferred that the upper surface of control gate 22 be positioned apart from the upper surface of the erasing gate 10 as much as possible. However, if the control gate 22 is made too lower, the fourth oxide film sidewall spacer 24 (wall oxide film of control gate 22) to be formed at the later step (step of FIG. 41) may not be formed with an appropriate height. On that occasion, at this time, there is an increased fear of causing the silicide short between the silicide film on the upper surface of the control gate 22 and the silicide film of the surface layer (upper surface) of the second source/drain diffusion layer 23. For that reason, an attention is paid so as not to extremely lower the upper surface of the control gate 22.

Further, as a method of increasing the distance between the control gate 22 and the erasing gate 10, it is conceivable to increase the film thickness of the third oxide film sidewall spacer 19 which presents inbetween. However, if the film thickness of the third oxide film sidewall spacer 19 is made thicker, a gap therebetween is too much widened. Thus, there is such a fear that the channel to be formed in the surface layer of the silicon substrate 1 (P-well 7) is discontinued. For that reason, it is not preferred that the film thickness of the third oxide film sidewall spacer 19 be made thicker than a predetermined film thickness.

Figure 40A:
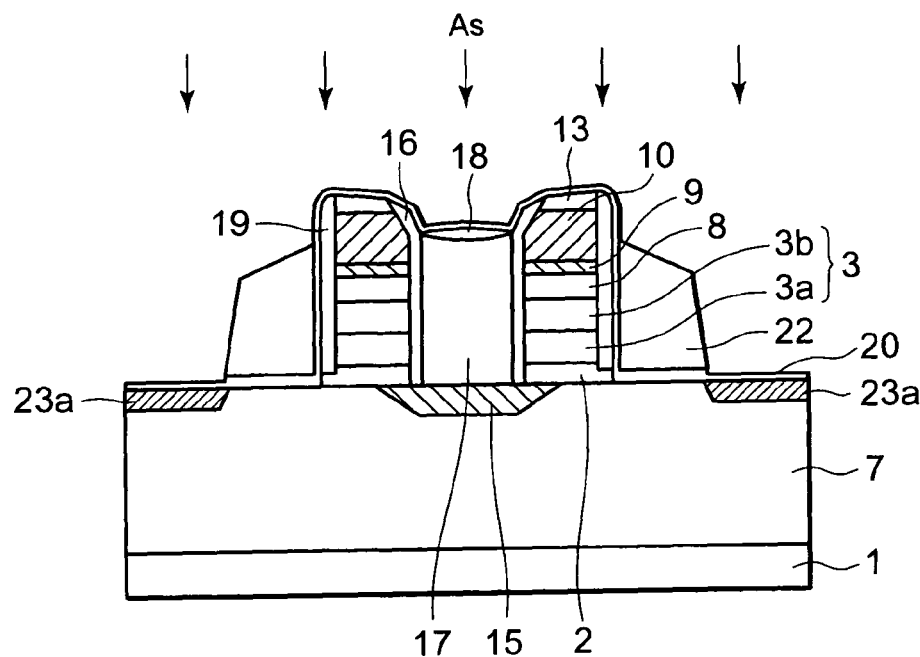
FIG. 40A is a sectional view taken along the line A-A of FIG. 1 illustrating a manufacturing step of the non-volatile semiconductor memory device according to the first embodiment of the present invention.
Figure 40B:
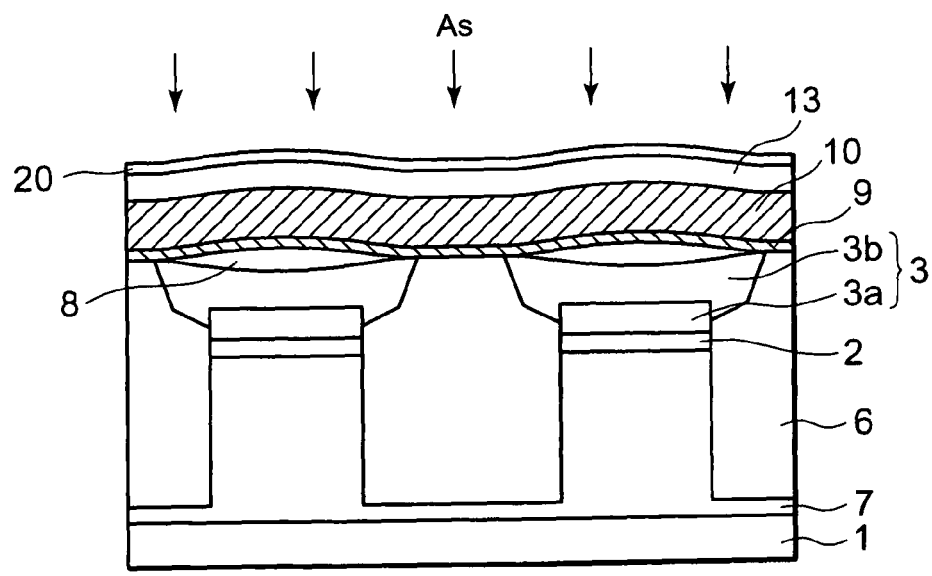
FIG. 40B is a sectional view taken along the line B-B of FIG. 1.

Next, as illustrated in FIG. 40A and FIG. 40B, the ion injection of the n-type impurity is performed to the entire surface. After that, activation is conducted by heat treatment at about 1,000° C. under nitrogen atmosphere, and a low concentration diffusion layer 23a is formed in the silicon substrate 1 (P-well 7) corresponding to a position where the second gate insulating film 20 having a film thickness of about 2 nm to 4 nm remains. Note that, the ion injection at this time is carried out by, for example, injecting arsenic (As) at an injection energy of 10 keV to 20 keV and a dose amount of $1.0 \times 10^{13}$ cm$^{-2}$.

Figure 41A:
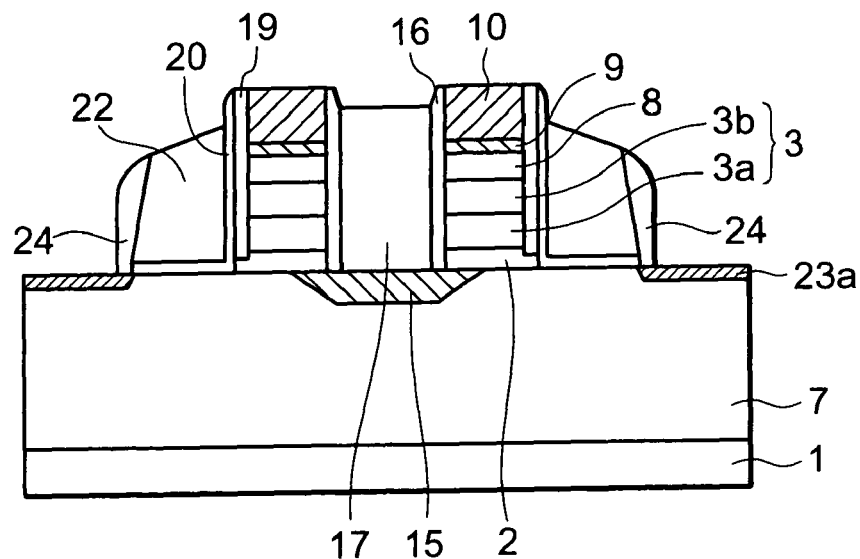
FIG. 41A is a sectional view taken along the line A-A of FIG. 1 illustrating a manufacturing step of the non-volatile semiconductor memory device according to the first embodiment of the present invention.
Figure 41B:
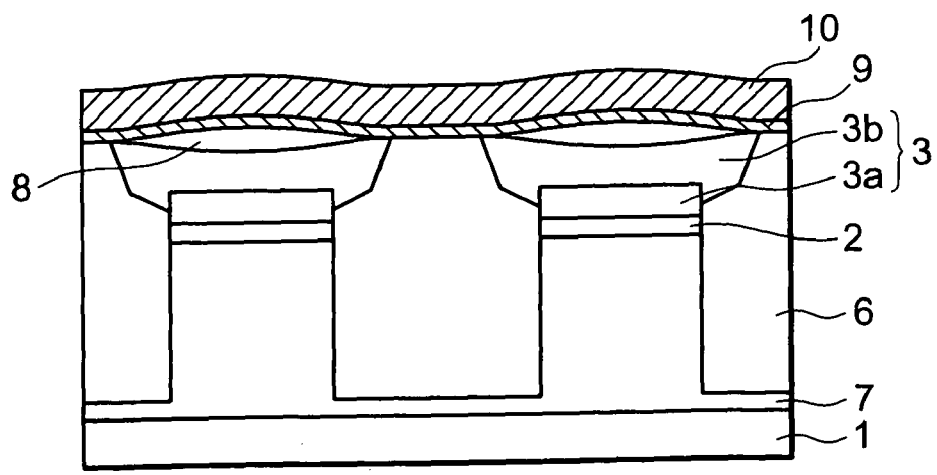
FIG. 41B is a sectional view taken along the line B-B of FIG. 1.

Next, as illustrated in FIG. 41A and FIG. 41B, the oxide film is formed to have a film thickness of about 80 nm to 100 nm, and the etch back is carried out, to thereby form the fourth oxide film sidewall spacer 24 at the sidewall of the control gate 22.

At this etch back, the second gate insulating film 20 on the second source/drain diffusion layer 23 and the oxide film (first oxide film sidewall spacer 13 and second gate insulating film 20) on the erasing gate 10, and the plug oxide film 18 on the plug 17 are removed by etching at the same time. The second gate insulating film 20 existing on the second source/drain diffusion layer 23 is extremely thin (about 2 nm to 4 nm), and hence the removal by etching is completed for a short period of time. As described above (description of step illustrated in FIG. 31), if the etching period becomes longer, the damage suffering to the second source/drain diffusion layer 23 becomes larger. If the second source/drain diffusion layer 23 receives a big damage through the etching, there is a fear of the diffusion layer leak current being increased. However, the film thickness of the first oxide film sidewall spacer 13 on the erasing gate 10 is made thinner by the etching conducted in the step illustrated in FIG. 31. Further, the film thickness of the plug insulating film 18 on the plug 17, which is removed by etching at the same time as well, is set with a sufficient attention as in the step illustrated in FIG. 33. For that reason, while reducing the over-etching period as much as possible for the second source/drain diffusion layer 23, the second gate insulating film 20 on the second source/drain diffusion layer 23, the oxide films (first oxide film sidewall spacer 13 and second gate insulating film 20) on the erasing gate 10, and the plug oxide film 18 on the plug 17 may be removed by etching at the same time.

Further, in this etch back, the oxide film, etc. on the erasing gate 10 must be removed by etching at the same time with the formation of the fourth oxide film sidewall spacer 24, and hence the etching period becomes longer, correspondingly. If the etching period becomes longer, there is a fear in that the fourth oxide film sidewall spacer 24 is cut more than necessary. The fourth oxide film sidewall spacer 24 is necessary for forming the second source/drain diffusion layer 23 with an LDD structure, and bears the role of isolating between the silicide film on the upper surface of the control gate 22 and the silicide film in the surface layer of the second source/drain diffusion layer 23 for not causing the silicide short. For that reason, the fourth oxide film sidewall spacer 24 needs a height and width so that the silicide short does not occur. Then, as illustrated in FIG. 39A, in a cross section including the floating gate 3 and the control gate 22, it is preferred that the control gate 22 be formed so as to have an angle portion at the side surface (remain shoulder).

If the control gate 22 has a shape having the angle portion (like shoulder) at the side surface of the control gate 22, a surface is formed in a perpendicular direction at the side surface of the control gate 22. In the vicinity of such surface described above, an oxide film having a sufficient height is formed. For that reason, after etching back of the oxide film, the fourth oxide film sidewall spacer 24 having a sufficient height and width is formed. Note that, as an example of forming the control gate 22 having such a shape, there is given a method involving using a resist mask. Specifically, the fifth polysilicon film 21 is subjected to etch back to form the control gate 22, and then the resist mask is formed so as to cover a part of the control gate 22. After that, by using this resist film as a mask, an exposed portion of the control gate 22 (end portion on reverse side of third oxide film sidewall spacer 19) is removed by etching. As a result, a corner portion and a flat side surface (shape like shoulder) are formed at the side surface of the control gate 22. Typically, if the conductive film is simply subjected to etch back to form the sidewall conductive film, the sidewall conductive film having a gentle inclined side surface is formed. Therefore, as described above, if the gentle inclined side surface is covered with a resist film, and the exposed portion is removed by etching, the corner portion and the flat side surface may be formed at the gentle incline side surface.

Figure 42A:
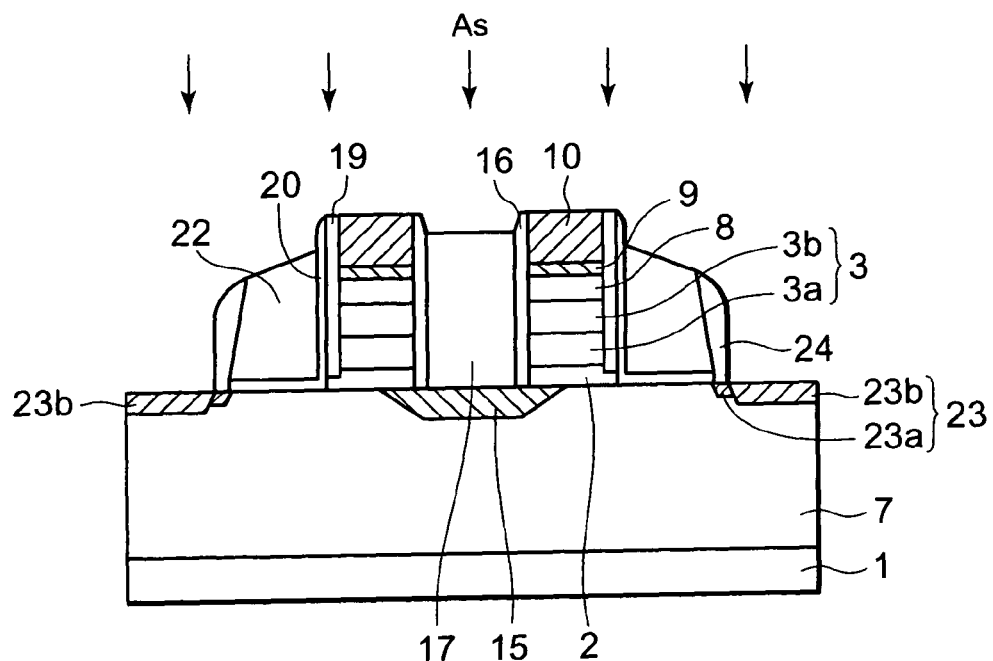
FIG. 42A is a sectional view taken along the line A-A of FIG. 1 illustrating a manufacturing step of the non-volatile semiconductor memory device according to the first embodiment of the present invention.
Figure 42B:
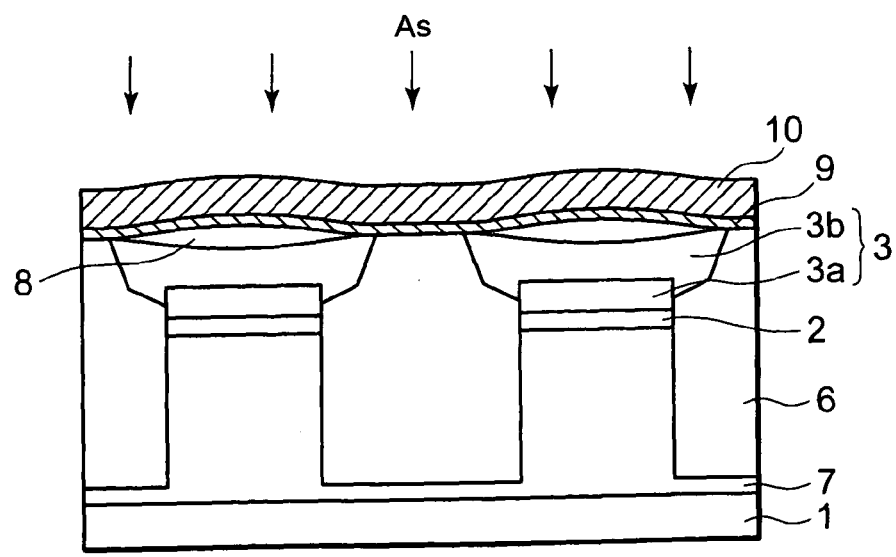
FIG. 42B is a sectional view taken along the line B-B of FIG. 1.

Next, as illustrated in FIG. 42A and FIG. 42B, the ion injection of the n-type impurity is performed to the entire surface. After that, activation is conducted by heat treatment at about 1,000° C. under nitrogen atmosphere, and a high concentration diffusion layer 23b is formed in the vicinity of an area where the low concentration diffusion layer 23a is formed. With this, the second source/drain diffusion layer 23 having an LDD structure is formed. Note that, the ion injection at this time is performed by, for example, injecting arsenic (As) at an injection energy of 30 keV to 60 keV and a dose amount of $3.0 \times 10^{15}$ cm$^{-2}$ to $5.0 \times 10^{15}$ cm$^{-2}$. Further, at the same time, phosphorus (P) may be injected, for example, at an injection energy of 20 keV to 40 keV and a dose amount of $1.0 \times 10^{14}$ cm$^{-2}$ to $3.0 \times 10^{14}$ cm$^{-2}$.

Figure 43A:
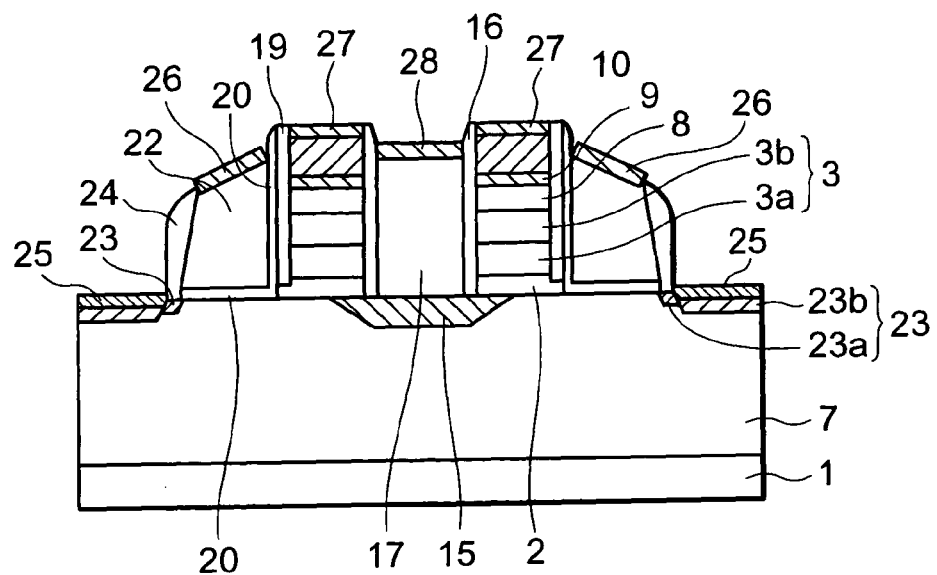
FIG. 43A is a sectional view taken along the line A-A of FIG. 1 illustrating a manufacturing step of the non-volatile semiconductor memory device according to the first embodiment of the present invention.
Figure 43B:
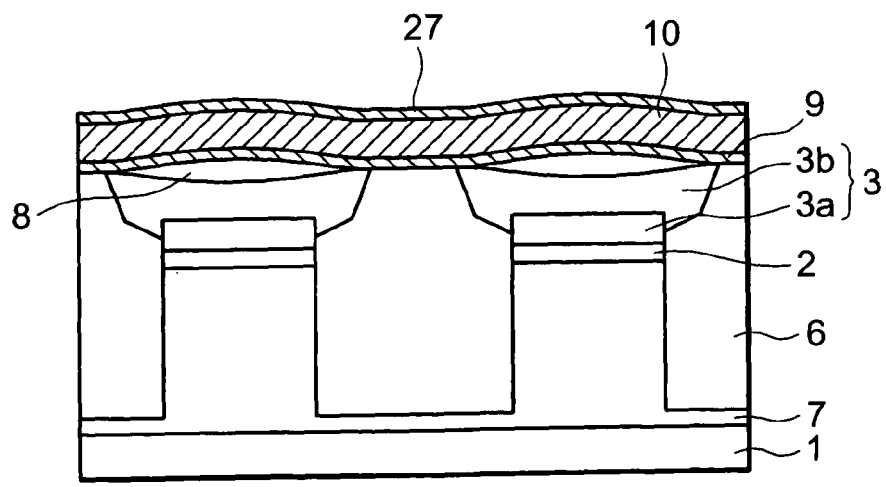
FIG. 43B is a sectional view taken along the line B-B of FIG. 1.

Next, after formation of a metal film as a silicidation film on an entire surface, for example, a cobalt film of about 30 nm to 40 nm by sputtering, heat treatment by rapid thermal annealing (RTA) is conducted to silicide. After that, an unreacted cobalt film on the oxide film (second oxide film sidewall spacer 16, third oxide film sidewall spacer 19, second gate insulating film 20, and fourth oxide film sidewall spacer 24) is removed. With this, as illustrated in FIGS. 43A and 43B, cobalt silicide (CoSi$^2$) films 25 to 28 are formed selectively in a self-alignment method on the second source/drain diffusion layer 23, the control gate 22, the erasing gate 10, and the plug 17. Note that, it is preferred that RTA treatment be performed separately at two steps so that an excessive silicide reaction does not proceed. For example, RTA treatment at the first time is performed at about 650° C. to 700° C. for 10 seconds to 45 seconds, and RTA treatment at the second time is performed at about 750° C. to 850° C. for 10 seconds to 45 seconds. Thus, it is possible to lower the resistance on the second source/drain diffusion layer 23, the control gate 22, the erasing gate 10, and the plug 17 through silicidation.

Figure 44A:
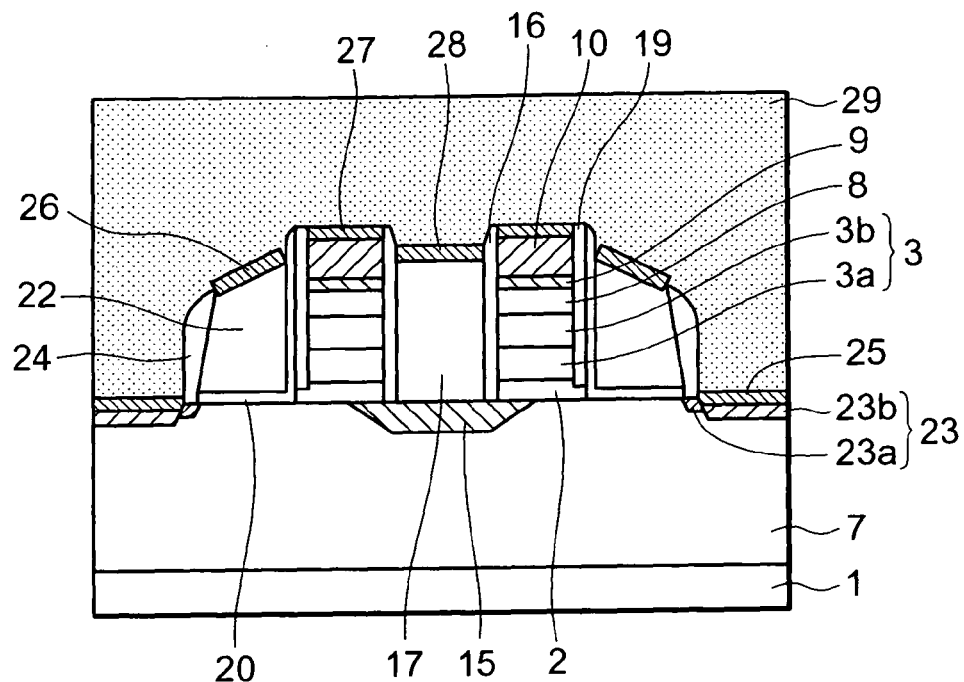
FIG. 44A is a sectional view taken along the line A-A of FIG. 1 illustrating a manufacturing step of the non-volatile semiconductor memory device according to the first embodiment of the present invention.
Figure 44B:
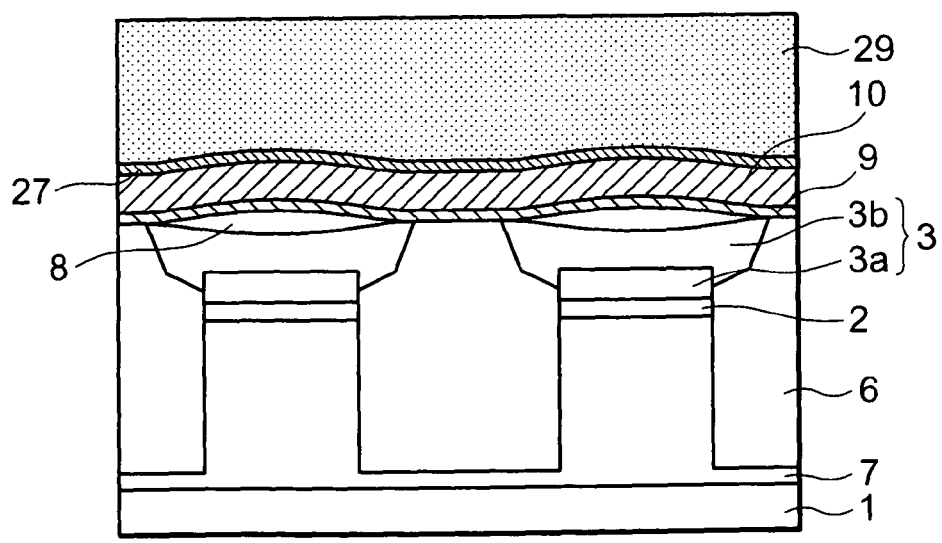
FIG. 44B is a sectional view taken along the line B-B of FIG. 1.

Next, as illustrated in FIGS. 44A and 44B, an interlayer insulating film (BPSG film and PSG film) 29 is formed on an entire surface. After that, planarization is conducted through the CMP technique.

Figure 45A:
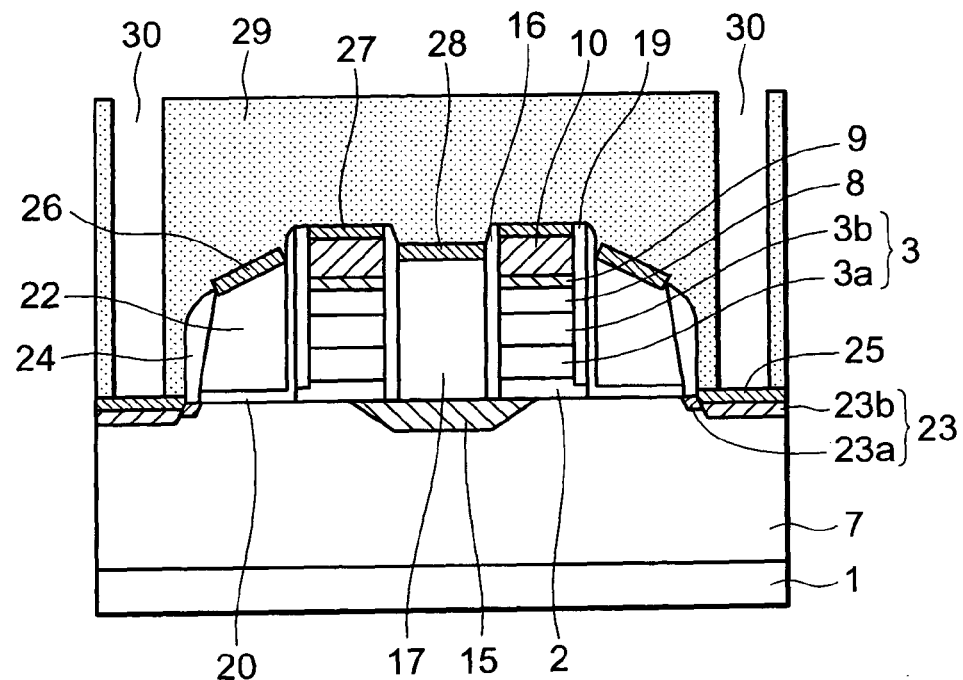
FIG. 45A is a sectional view taken along the line A-A of FIG. 1 illustrating a manufacturing step of the non-volatile semiconductor memory device according to the first embodiment of the present invention.
Figure 45B:
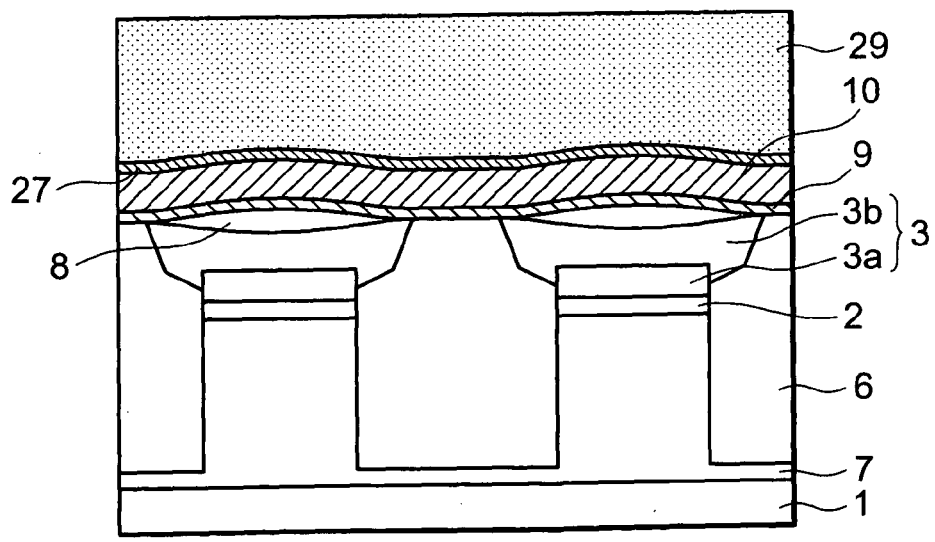
FIG. 45B is a sectional view taken along the line B-B of FIG. 1.
Figure 46:
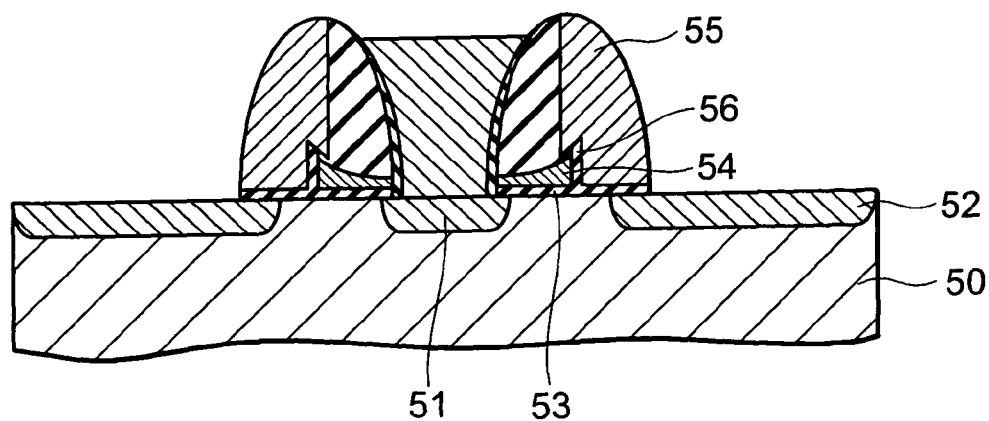
FIG. 46 is a sectional view illustrating a structure of a prior art split-gate type non-volatile semiconductor memory device.

Next, as illustrated in FIG. 45A, a contact hole 30 for contacting with the second source/drain diffusion layer 23 is opened using as a mask the patterned resist mask (not shown) through dry etching. At this time, the contact hole on the control gate 22, the contact hole on the erasing gate 10, and the contact hole on the plug 17 are also opened at the same time (not shown either).

Next, a contact plug (for example, tungsten film) 31 is formed on the second source/drain diffusion layer 23, (not shown) via a barrier metal film (for example, lamination film of titanium film and titanium nitride film) After that, a metal film (Al, Cu, Al—Si, Al—Cu, and Al—Si—Cu) is formed on the contact plug 31, and a desired patterning is conducted thereon to form a metal wiring layer (Bit-Line) 32. Thus, the non-volatile semiconductor memory device according to the first embodiment of the present invention as illustrated in FIG. 1 to FIG. 3 is completed.

According to a manufacturing process as described above, use of lithography technology is minimized, and almost of the members, for example, the floating gate 3, the control gate 22, the erasing gate 10, the first source/drain diffusion layer 15 (plug 17), and the second source/drain diffusion layer 23 are formed in a self-alignment method. Specifically, the number of the use of the photolithography technology is reduced, and hence the manufacture becomes easy, and the size reduction of the memory cell is achieved.

In the non-volatile semiconductor memory device according to the first embodiment of the present invention, the entire surfaces of the plug 17 connected to the first source/drain diffusion layer 15, the second source/drain diffusion layer 23, the control gate 22, and the erasing gate 10 are subjected to silicidation, and hence the lowering of a wiring resistance value is sufficiently realized. All of the plug 17, the second source/drain diffusion layer 23, the control gate 22, and the erasing gate 10 may be subjected to silicidation at the same time, because after the formation of the plug 17, the erasing gate 10, the control gate 22, and the second source/drain diffusion layer, in the manufacturing step of the fourth oxide film sidewall spacer 24 (step of FIG. 41), the oxide film formed on the respective upper surfaces (plug oxide film 18 on plug 17, first oxide film sidewall spacer 13 on erasing gate, and second gate insulating film 20, second gate insulating film 20 on second source/drain diffusion layer 23) may be removed at the same time, while preventing the damage caused by over-etching with respect to the second source/drain diffusion layer 23 and the exposed element isolation oxide film 6 from entering into the oxide films.

Provision of the erasing gate 10 enables to make the second gate insulating film 20 below the control gate 22 thinner as much as possible. As a result, even in low voltage operation, the current at the reading operation (memory cell current) may be made larger. However, the second gate insulating film 20 on the second source/drain diffusion layer 23 is extremely thin, and hence the second gate insulating film 20 may be completely removed by etching for a short period of time. Specifically, as the etching period becomes longer, etching damage, which the exposed second source/drain diffusion layer 23 suffers, becomes larger. In some occasion, there may cause a hole in the diffusion layer. In such a case, it results in increase of the diffusion layer leak current to degrade the programming operation and the erasing operation, being a serious problem. Therefore, if the second gate insulating film 20 on the second source/drain diffusion layer 23 is subjected to etching, it becomes important to reduce the over-etching amount as much as possible.

In the method of manufacturing a non-volatile semiconductor memory device according to a first embodiment of the present invention, before removing the oxide films formed on the plug 17, the second source/drain diffusion layer 23, the control gate 22, and the erasing gate 10, the film thicknesses are adjusted so that the film thicknesses of the oxide films becomes closer with each other. In particular, the first oxide film sidewall spacer 13 on the erasing gate 10 plays the role of deciding the gate length of the floating gate 3, and hence the film thickness (height) more than a given thickness becomes necessary. However, according to the method of the present invention, after deciding the gate length of the floating gate 3, there is added an etching step for thinning the film thickness of the first oxide film sidewall spacer 13 (step of FIG. 31). With this additional dry etching step, the first oxide film sidewall spacer 13 may be removed, without causing a serious damage to the second source/drain diffusion layer 23, at the same time with the second gate insulating film 20 on the second source/drain diffusion layer 23. Thus, in the non-volatile semiconductor memory device according to the first embodiment of the present invention, silicidation of all the upper portions of the plug 17, the second source/drain diffusion layer 23, the control gate 22, and the erasing gate 10 is realized.

Further, when conducting silicidation of a plurality of areas at the same time, the respective silicide films formed in the respective areas may couple with each other during the silicide reaction, and hence enough attention must be paid on the risk of causing the silicide short. In the non-volatile semiconductor memory device according to the first embodiment of the present invention, the risk of the silicide short must be concerned between the cobalt silicide film 27 of the upper surface of the erasing gate 10 and the cobalt silicide film 28 of the upper surface of the plug 17, between the cobalt silicide film 27 of the upper surface of the erasing gate 10 and the cobalt silicide film 26 of the upper surface of the control gate 22, and between the cobalt silicide film 26 of the upper surface of the control gate 22 and the cobalt silicide film 25 of the upper surface of the second source/drain diffusion layer 23.

However, for the silicide short between the cobalt silicide film 27 of the upper surface of the erasing gate 10 and the cobalt silicide film 28 of the upper surface of the plug 17, in the step illustrated in FIG. 32, the height of the upper surface of the plug 17 is adjusted so that the upper surface of the plug 17 is positioned below the upper surface of the erasing gate 10. For that reason, probability of occurrence of the silicide short between the cobalt silicide film 27 of the upper surface of the erasing gate 10 and the cobalt silicide film 28 of the upper surface of the plug 17 becomes extremely lower.

Further, for the silicide short between the cobalt silicide film 27 of the upper surface of the erasing gate 10 and the cobalt silicide film 26 of the upper surface of the control gate 22, in the step illustrated in FIG. 39, the height of the upper surface of the control gate 22 is adjusted so that the upper surface of the control gate 22 is positioned below the upper surface of the erasing gate 10. For that reason, the probability of occurrence of the silicide short between the cobalt silicide film 27 of the upper surface of the erasing gate 10 and the cobalt silicide film 26 of the upper surface of the control gate 22 becomes extremely lower.

Further, in the cobalt silicide film 26 of the upper surface of the control gate 22 and the cobalt silicide film 25 of the upper surface of the second source/drain diffusion layer 23, in the step illustrated in FIG. 41, the fourth oxide film sidewall spacer 24 having secured a sufficient height is formed. Further, in particular, the control gate 22 of a shape having a corner portion and a flat surface (control gate 22 having surface in perpendicular direction) is formed, and hence the fourth oxide film sidewall spacer 24 having a sufficient width may be formed at the sidewall of the control gate 22. For that reason, the probability of occurrence of the silicide short between the cobalt silicide film 26 of the upper surface of the control gate 22 and the cobalt silicide film 25 of the upper surface of the second source/drain diffusion layer 23 becomes extremely lower.

As described above, in the non-volatile semiconductor memory device according to the first embodiment of the present invention, adjustments of the height of the upper surface of the plug 17 and the upper surface of the control gate 22 and the silicidation of all the upper surfaces of the plug 17, the second source/drain diffusion layer 23, the erasing gate 10, and the control gate 22 are realized, while suppressing the probability of occurrence of the silicide short with the fourth oxide film sidewall spacer 24 formed at the sidewall of the control gate 22, and aiming at the reduction of the wiring resistance value.

Figure 47:
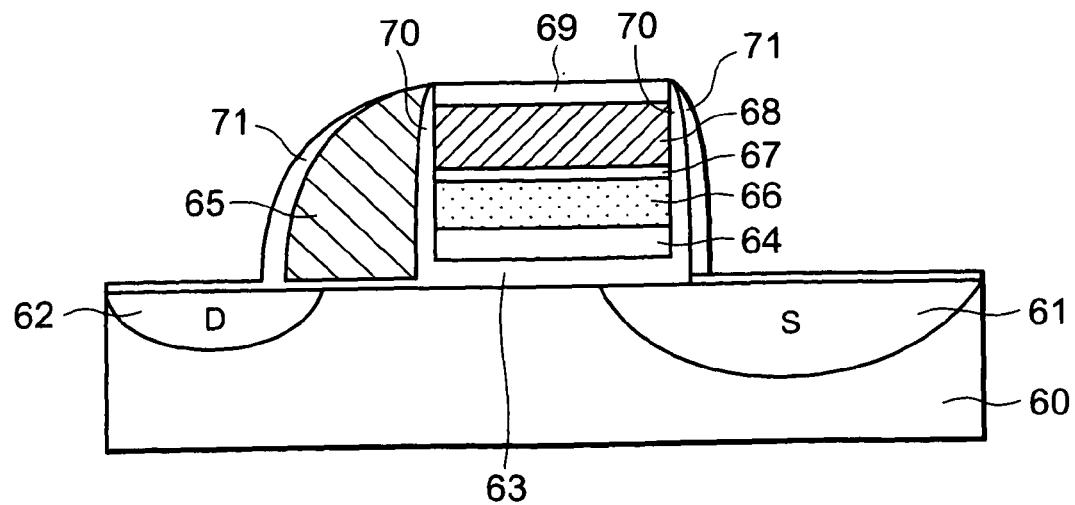
FIG. 47 is a sectional view illustrating a structure of a prior art split-gate type non-volatile semiconductor memory device.
Figure 48A:
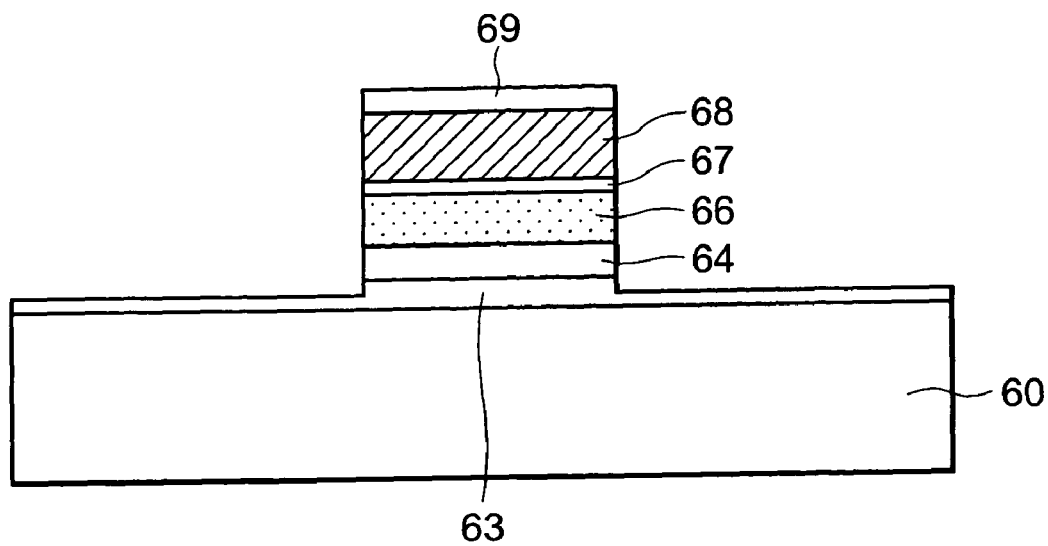
FIG. 48A and FIG. 48B are sectional views each illustrating a manufacturing step of the prior art split-gate type non-volatile semiconductor memory device.
Figure 48B:
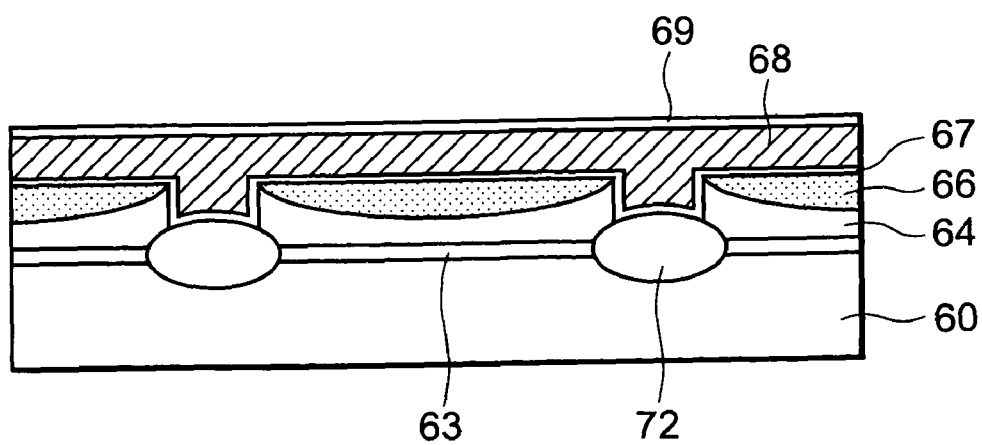
Figure 49:
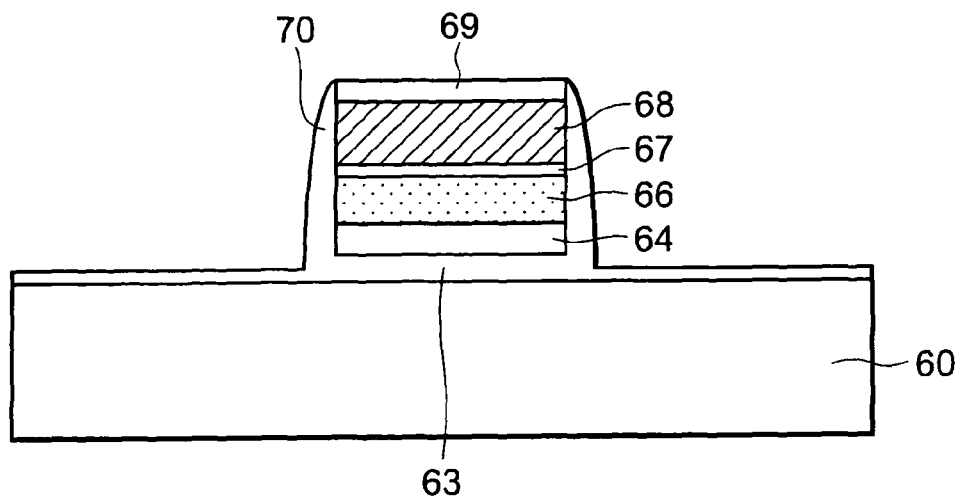
FIG. 49 is a sectional view illustrating a manufacturing step of the prior art split-gate type non-volatile semiconductor memory device.
Figure 50:
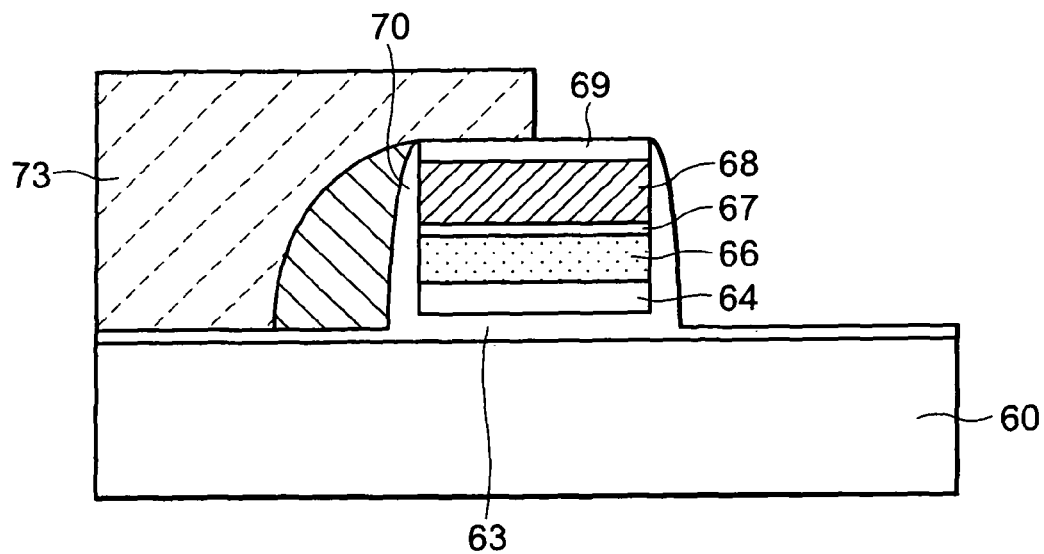
FIG. 50 is a sectional view illustrating a manufacturing step of the prior art split-gate type non-volatile semiconductor memory device.
Figure 51:
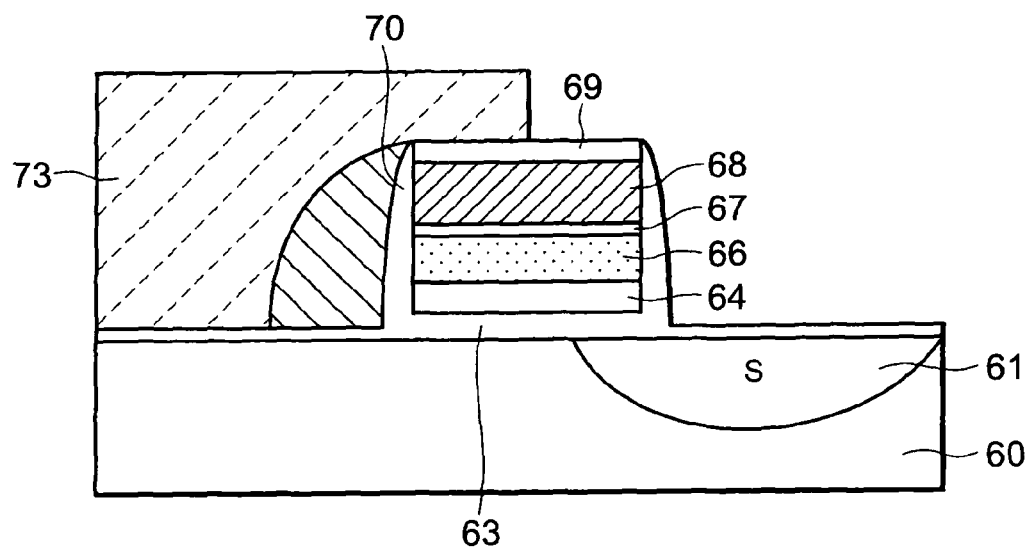
FIG. 51 is a sectional view illustrating a manufacturing step of the prior art split-gate type non-volatile semiconductor memory device.

On the other hand, in JP 2001-230330 A, as illustrated in FIG. 47, there is no wiring layer formed of the conductive film (polysilicon film) above the source region 61 and the drain region 62. Specifically, JP 2001-230330 A does not employ a structure in which such a plug of the present invention (source wiring) is not formed above the source region 61. In the case where there is no plug of the present invention, which is formed so as to be buried in the opening on the diffusion layer, the contact hole for establishing a contact with the source region 61 must be formed after formation of the interlayer insulating film. The mask is used for the formation of the contact hole. However, at this time, if mask alignment occurs, there is such a fear that the contact hole may communicate with the erasing gate 6. For that reason, sufficient margin for the mask alignment must be secured. Accordingly, in JP 2001-230330 A, as the margin is needed on the source region 61 side, it results in hindrance of the size reduction of the memory cell (hindrance of miniaturization). Further, in JP 2001-230330 A, for the formation of the source region 61 and the drain region 62, the mask is used. In addition, the mask is used for the formation of the contact hole at the source region 61. For that reason, it results in accelerating the complication and intrication of the manufacturing steps compared with the present invention.

Further, in JP 2001-230330 A, as illustrated in FIG. 47, the oxide films exist all the upper surfaces of the source region 61, the drain region 62, the control gate 65, and an erasing gate 68. Accordingly, in order to silicide the upper surfaces of the source region 61, the drain region 62, the control gate 65, and the erasing gate 68, as the premise, all the various oxide films existing on the upper surfaces thereof must be first removed. However, the oxide films to be removed have different film thicknesses, and in particular, the film thickness of the oxide film 29 on the erasing gate 68 is extremely thick compared with the other films. For that reason, if the oxide film 29 on the erasing gate 68 is to be removed, the diffusion layers of the source region 61 and the drain region 62 suffer the serious damage, resulting in higher risk of increasing the diffusion layer leak current. Further, an element isolation film 72 is also exposed, and hence the element isolation film 72 may also suffer the damage (leak occurs between adjacent elements).

In addition, in JP 2001-230330 A, the risk of the silicide short is high when subjecting to silicidation. Comparing the upper surface of the control gate 65 and the upper surface of the erasing gate 68, the upper surface of the control gate 65 has a higher height. Further, the sidewall oxide film 70 for electrically isolating the control gate 65 and the erasing gate 68 is tapered as approaching to the upper portion. In this state, if the silicidation is conducted after the sidewall oxide film 71 on the control gate 65 and the oxide film 29 on the erasing gate 68 are removed by etching, as the upper surface of the control gate 65 and the upper surface of the erasing gate 68 are too close with each other, and hence it is said that the probability of occurrence of the silicide short is extremely high. On the other hand, the control gate 62 has a gentle shape, and hence the width of the sidewall oxide film 71 is not expected to be wide, and at the time of etching, almost of the sidewall oxide film 71 on the control gate 65 may be removed at high probability. For that reason, it must be said that the risk of the silicide short between the drain region 62 and the control gate 65 is high.

Figure 52:
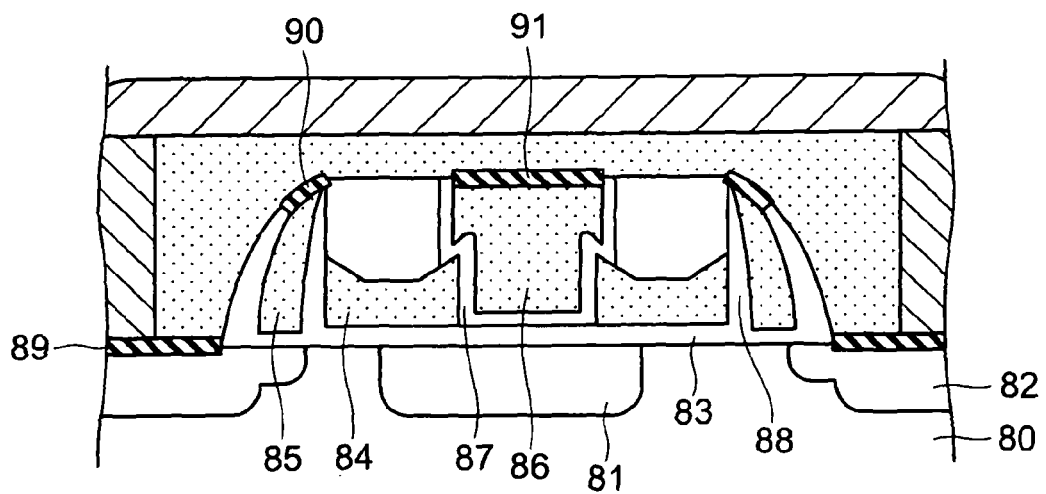
FIG. 52 is a sectional view illustrating a manufacturing step of the prior art split-gate type non-volatile semiconductor memory device.

As for JP 2000-286348 A, as illustrated in FIG. 52, the silicidation of the upper surfaces of the drain region 82, the control gate 85, and the erasing gate 86 is realized. However, the silicidation of the source region 81 is not referred therein. Further, the erasing gate 86 on the upper layer becomes a cause of hindrance, and hence the silicidation of all the source region is impossible, even if it is requested.

Figure 53:
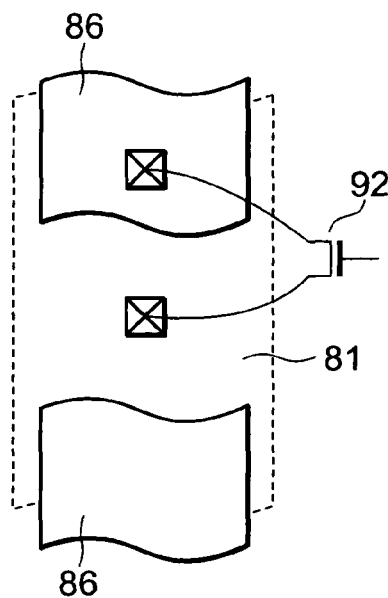
FIG. 53 is a sectional view illustrating a manufacturing step of the prior art split-gate type non-volatile semiconductor memory device.

In addition, the non-volatile semiconductor memory device described in JP 2000-286348 A does not have a structure in which the erasing gate 86 is positioned directly above the floating gate 84, and has a structure in which the erasing gate 86 is positioned on an upper layer of the source region 81. For that reason, as illustrated in FIG. 53, the erasing gate 86 must be separated in order to establish the contacts with the source region 81 at given intervals. This separation uses a mask, resulting in complication and intrication of the manufacturing steps. Further, because the source region 81 may not be subjected to silicidation (or, unavailable to silicide sufficiently), the distance between the positions at which the contact are established must be made narrower. As a matter of course, the memory cells may not be arranged in the contact area. Specifically, it can be said that the structure is hard to sufficiently fill the need of miniaturization.

Figure 54:
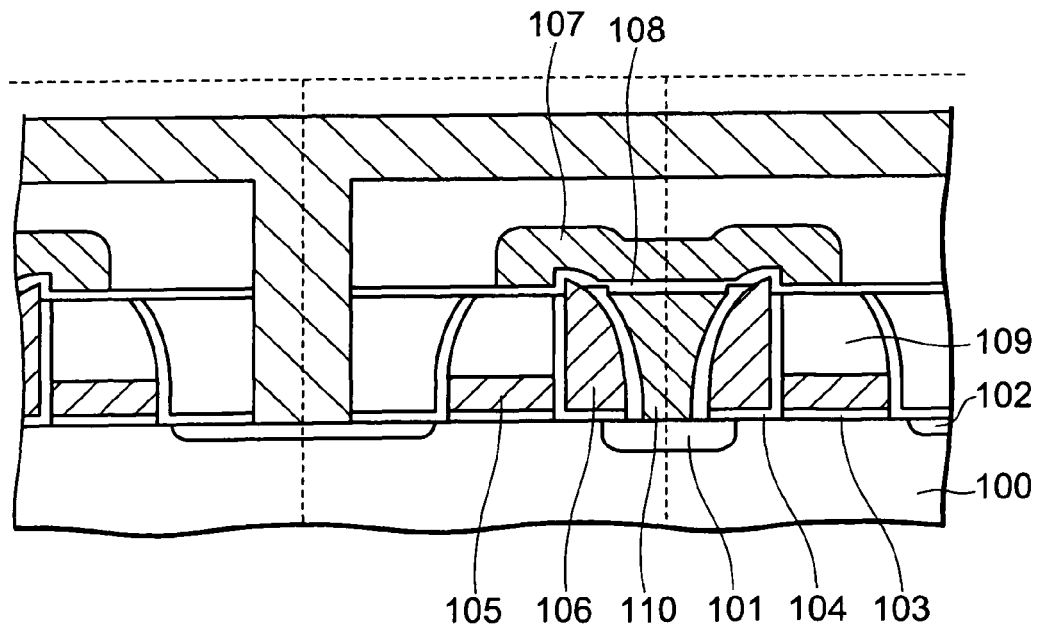
FIG. 54 is a sectional view illustrating a manufacturing step of the prior art split-gate type non-volatile semiconductor memory device.

As for JP 2001-085543 A, as illustrated in FIG. 54, an erasing gate 107 is not formed in a self-alignment method, designing thereof must be made taking margins for the mask alignment into consideration. Accordingly, the technology described in JP 2001-085543 A may hinder the size reduction of the memory cell (hinder miniaturization), and results in complication and intrication of the manufacturing steps.

Further, in JP 2001-085543 A, as illustrated in FIG. 54, the erasing gate 107 is positioned on the upper layer of the source wiring 110, and a silicon oxide film 109 and the erasing gate 107 are positioned on the upper layer of the control gate 105.

For that reason, the silicidation of the control gate 105 and the source wiring 110 is impossible to carry out.

As described above, in the non-volatile semiconductor memory device according to the first embodiment of the present invention, through the silicidation of the plug 17 connected to the first source/drain diffusion layer 15, the second source/drain diffusion layer 23, the control gate 22, and the erasing gate 10, the lowering of a wiring resistance value is achieved. For that reason, high speed operation under low voltage is enabled, and the miniaturization of the semiconductor device along with an attainment of the lower voltage is also achieved. Further, owing to the lowering of the wiring resistance, the area, where the contacts for applying voltage to the control gate 22, the erasing gate 10, and the plug 17 are formed, may be reduced compared with the conventional ones, thereby contributing to miniaturization of the semiconductor device.

Further, the non-volatile semiconductor memory device according to the first embodiment of the present invention has a structure in which the erasing gate 10 is positioned on the upper layer of the floating gate 3, and hence one erasing gate 10 corresponds to one floating gate 3. Therefore, the unit of erasing may be reduced. Further, the floating gate 3, the control gate 22, the erasing gate 10, the first source/drain diffusion layer 15 (plug 17), the second source/drain diffusion layer 23, etc. may be formed in a self-alignment method. As a result, there is no need to concern the margins for mask alignment, and hence the size reduction of the memory cells is enabled, and simplification of the manufacturing steps may be achieved, because the mask is not used.

Note that in the method disclosed in the first embodiment of the present invention, for example, film formation conditions, a used gas, materials, etc., may not be limited. In particular, about the oxide film, any electrically insulatable film (insulating film) may be used.

It is apparent that the present invention is not limited to the above embodiments and description, but may be changed or modified without departing from the scopes and spirits of apparatus claims that are indicated in the subsequent pages as well as methods that are indicated below:

etching the upper surface of the third conductive film until the upper surface of the third conductive film is flush with/or lower than the upper surface of the second conductive film after the step of etching the upper surface of the first sidewall insulating film.

What is claimed is:

1. A non-volatile semiconductor memory device, comprising:

a semiconductor substrate;

a floating gate formed above a gate insulating film covering the semiconductor substrate;

an erasing gate formed above the floating gate with a insulating film being formed therebetween; and a control gate formed above a channel region of a surface layer of the semiconductor substrate at a position adjacent to the floating gate and the erasing gate along a first lateral direction parallel to the surface of the substrate, the floating gate and the erasing gate insulated from the control gate by a first sidewall insulating film, wherein, with respect to an upper surface of the semiconductor substrate, both ends of the floating gate have a same height, and wherein along a second lateral direction, perpendicular to the first lateral direction and parallel to the surface of the substrate, a distance between the floating gate and the erasing gate at an edge of the floating gate is less than a distance between the floating gate and the erasing gate at a center of the upper surface of the floating gate.

2. The non-volatile semiconductor memory device according to claim 1, wherein a central part of an upper portion of the floating gate comprises a recess.

3. The non-volatile semiconductor memory device according to claim 1, wherein a corner of an upper surface of the floating gate has an acute angle.

4. The non-volatile semiconductor memory device according to claim 1, wherein a thickness of the insulating film is equal to a variable distance between the floating gate and the erasing gate.

5. The non-volatile semiconductor memory device according to claim 1, wherein a thickness of the insulating film decreases from a central portion of the insulating film to a side of the insulating film.

6. The non-volatile semiconductor memory device according to claim 1, further comprising:
    another floating gate formed above the gate insulating film;
    another erasing gate formed above said another floating gate; and
    another control gate formed above the semiconductor substrate,
    wherein with respect to a plug formed adjacent to the floating gate, said another floating gate, said another erasing gate, and said another control gate are disposed symmetrically with said floating gate, said erasing gate, and said control gate, respectively.

7. The non-volatile semiconductor memory device according to claim 1, wherein, with respect to the upper surface of the semiconductor substrate, a height of the center of the upper surface of the floating gate is less than said height of said ends of the floating gate.

8. The non-volatile semiconductor memory device according to claim 1, wherein a distance between the floating gate and the erasing gate increases from each of said ends of the floating gate toward the center of the upper surface of the floating gate.

9. The non-volatile semiconductor memory device according to claim 1, wherein a width of the erasing gate is aligned with a width of the floating gate.

10. The non-volatile semiconductor memory device according to claim 9, wherein the width of the erasing gate is equal to the width of the floating gate.

11. The non-volatile semiconductor memory device according to claim 1, further comprising:
    a first diffusion layer formed on the semiconductor substrate at a position corresponding to another lateral side of the floating gate and the erasing gate;
    a plug formed above the first diffusion layer, the plug being coupled to the first diffusion layer, the floating gate and the erasing gate being insulated from the plug by a second sidewall insulating film; and
    a second diffusion layer formed on the semiconductor substrate at a position adjacent to the control gate.

12. The non-volatile semiconductor memory device according to claim 1, further comprising:
    a first silicide film formed on an upper surface of the erasing gate;
    a second silicide film formed on an upper surface of the control gate;
    a third silicide film formed on an upper surface of the plug; and
    a fourth silicide film formed on an upper, surface of the second diffusion layer.

13. The non-volatile semiconductor memory device according to claim 11, wherein the insulating film comprises a tunnel insulating film.

14. The non-volatile semiconductor memory device according to claim 11, wherein
    a memory cell in said memory device comprises the floating gate, the erasing gate, the control gate, the first sidewall insulating film, the second sidewall insulating film, the first diffusion layer and the plug.

15. The non-volatile semiconductor memory device according to claim 11, wherein
    the gate insulating film comprises a first gate insulating film, and the non-volatile semiconductor memory device further comprises:
        a second gate insulating film formed between the semiconductor substrate and the control gate, the second gate insulating film being different from the first gate insulating film.

16. The non-volatile semiconductor memory device according to claim 15, wherein the second gate insulating film is extended between the control gate and the first sidewall insulating film.

17. The non-volatile semiconductor memory device according to claim 11, wherein
    a memory cell in said memory device consists of the floating gate, the erasing gate, the control gate, the first sidewall insulating film, the second sidewall insulating film, the first diffusion layer and the plug.

18. The non-volatile semiconductor memory device according to claim 17, further comprising:
    a twin memory cell consisting of adjacent memory cells,
    wherein the twin memory cell shares the first diffusion layer and the plug, and
    wherein the floating gates, the erasing gates, and the control gates of the respective adjacent memory cells are formed symmetrically with respect to the first diffusion layer, and the plug.

19. The non-volatile semiconductor memory device according to claim 17, further comprising:
    a twin memory cell, comprising adjacent memory cells,
    wherein the twin memory cell shares the first diffusion layer and the plug, and
    wherein the floating gates, the erasing gates, and the control gates of the respective adjacent memory cells are formed symmetrically with respect to the first diffusion layer, and the plug.

* * * * *